United States Patent
Yoon et al.

(10) Patent No.: US 11,436,975 B2
(45) Date of Patent: Sep. 6, 2022

(54) DISPLAY PANEL HAVING TRANSISTORS OF DIFFERENT SIZE AROUND AT LEAST ONE OPENING

(71) Applicant: SAMSUNG DISPLAY CO., LTD., Yongin-si (KR)

(72) Inventors: Youngsoo Yoon, Yongin-si (KR); Kyunghoon Kim, Yongin-si (KR); Yunkyeong In, Yongin-si (KR); Hyunji Cha, Yongin-si (KR); Minhee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/841,229

(22) Filed: Apr. 6, 2020

(65) Prior Publication Data

US 2020/0380915 A1    Dec. 3, 2020

(30) Foreign Application Priority Data

May 31, 2019    (KR) .................. 10-2019-0064732

(51) Int. Cl.
   *G09G 3/3225*    (2016.01)
   *H01L 27/32*    (2006.01)

(52) U.S. Cl.
   CPC .................. *G09G 3/3225* (2013.01)

(58) Field of Classification Search
   CPC ............... G09G 3/3225; G09G 3/3233; G09G 2300/0842; G09G 2300/0233
   See application file for complete search history.

(56) References Cited

U.S. PATENT DOCUMENTS

| | | | |
|---|---|---|---|
| 7,709,850 B2 | 5/2010 | Wang | |
| 9,030,618 B2 | 5/2015 | Jeon | |
| 9,698,167 B2 | 7/2017 | Lee et al. | |
| 10,483,341 B2* | 11/2019 | Jung | G09G 3/20 |
| 10,797,085 B2* | 10/2020 | Qin | H01L 27/124 |
| 2017/0249896 A1* | 8/2017 | Kim | H01L 27/124 |
| 2017/0287992 A1* | 10/2017 | Kwak | G06F 1/1626 |
| 2017/0301280 A1* | 10/2017 | Ka | G09G 3/3406 |
| 2017/0345367 A1* | 11/2017 | Ka | H01L 27/326 |
| 2018/0158417 A1* | 6/2018 | Xiang | G09G 3/3233 |
| 2018/0190190 A1* | 7/2018 | Xi | G09G 3/3225 |
| 2018/0196475 A1* | 7/2018 | Bao | G06F 1/1637 |
| 2019/0019789 A1* | 1/2019 | Kim | H01L 27/3276 |

(Continued)

FOREIGN PATENT DOCUMENTS

| | | |
|---|---|---|
| CN | 107749287 | 3/2018 |
| EP | 3252821 | 12/2017 |
| EP | 3300067 | 3/2018 |

(Continued)

OTHER PUBLICATIONS

European Search Report dated Oct. 28, 2020 in corresponding European Patent Application No. 20177325.6 (10 pages).

*Primary Examiner* — Sepehr Azari
(74) *Attorney, Agent, or Firm* — F. Chau & Associates, LLC

(57) ABSTRACT

Provided is a display panel in which a size of a driving transistor of display areas arranged apart from each other in a direction, with an opening area, in which a component is located, therebetween, is different from a size of a driving transistor of display areas other than the above display areas.

12 Claims, 46 Drawing Sheets

(56) References Cited

U.S. PATENT DOCUMENTS

2019/0073976 A1\* 3/2019 Yeh .................. G02F 1/136286
2020/0235193 A1   7/2020 Tokuda

FOREIGN PATENT DOCUMENTS

| KR | 10-2003-0014778 | 2/2003 |
| KR | 10-0837986 | 6/2008 |
| KR | 10-2014-0044567 | 4/2014 |
| KR | 10-2016-0099193 | 1/2016 |
| KR | 10-1671512 | 10/2016 |
| KR | 10-2018-0049296 | 5/2018 |
| KR | 10-2018-0115387 | 10/2018 |
| WO | 2019077841 | 4/2019 |

\* cited by examiner

DISPLAY PANEL HAVING TRANSISTORS OF DIFFERENT SIZE AROUND AT LEAST ONE OPENING

CROSS-REFERENCE TO RELATED APPLICATION

This application claims priority under 35 U.S.C. § 119 to Korean Patent Application No. 10-2019-0064732, filed on May 31, 2019, in the Korean Intellectual Property Office, the disclosure of which is incorporated by reference herein in its entirety.

BACKGROUND

1. Field

The present invention relate to a display device, and more particularly, to a display device capable of realizing high-quality images despite deformation of a display area.

2. Description of the Related Art

The usage of display devices has recently been diversified. Also, display devices have become thin and lightweight, and thus, the usage range thereof is widening.

While the size of a display area in a display device is increasing, various functions connected or linked to the display device have been added to the display device and thus area for the functions are reducing. As a method of adding various functions while increasing the size of a display area, a display device in which various components may be arranged in the display area has been studied.

SUMMARY

One or more embodiments include a display panel having an opening area in which various types of components may be arranged, and a display device including the display panel. However, the above objective is exemplary, and the scope of the present disclosure is not limited thereto.

Additional aspects will be set forth in part in the description which follows and, in part, will be apparent from the description, or may be learned by practice of the presented embodiments of the disclosure.

According to one or more embodiments, a display panel includes: a substrate including a first area and a display area at least partially surrounding the first area; and a plurality of pixels arranged in the display area, wherein the display area includes a first display area around the first area and a second display area other than the first display area, and a size of a first driving transistor of a first pixel arranged in the first display area is different from a size of a second driving transistor of a second pixel arranged in the second display area.

A first channel ratio of a channel width of the first driving transistor to a channel length of the first driving transistor may be greater or less than a second channel ratio of a channel width of the second driving transistor to a channel length of the second driving transistor.

The first channel ratio may gradually increase or decrease away from the opening area.

The first area may be a hole that passes through the substrate.

The first area may be a transmission area through which light or sound travels.

The first area may be a trench that is inwardly recessed from a side of the substrate.

The substrate may include a first non-display area between the first area and the display area and a second non-display area surrounding the display area.

The first display area may include a first sub-display area and a second sub-display area arranged apart from each other in one direction, with the first area therebetween.

The first pixel may be one of pixels adjacent to a boundary between the first sub-display area and the second display area, and the second pixel may be one of pixels adjacent to a boundary between the second sub-display area and the second display area.

A signal line connecting the first pixel of the first sub-display area and the first pixel of the second sub-display area may extend in the one direction and pass by the first sub-display area and detour around the first area.

A plurality of first areas are included, and the first non-display area may surround the plurality of first areas, and at least one dummy pixel may be arranged in the first non-display area.

The first display area may include a first sub-display area and a second sub-display area arranged apart from each other in a direction, with each of the plurality of first areas therebetween.

A signal line connecting the first pixel of the first sub-display area and the first pixel of the second sub-display area may be connected to the at least one dummy pixel.

At least one of a size and a shape of the plurality of first areas may be different from the other.

A first row in which semiconductor layers of the first pixels of the first sub-display area are connected in the one direction and a second row in which semiconductor layers of the first pixels of the second sub-display area are connected may be apart from each other with the first area therebetween, and a length of a third row in which semiconductor layers of the second pixels of the second display area are connected in the one direction may be longer than a length of the first row or a length of the second row.

According to one or more embodiments, a display panel includes: a substrate including a display area and a first area in the display area; and a plurality of pixels arranged in the display area, wherein the display area includes a first display area around the first area and a second display area other than the first display area, and a first channel ratio of a channel width of a first driving transistor of a first pixel arranged in the first display area to a channel length of the first driving transistor is different from a second channel ratio of a channel width of a second driving transistor of a second pixel arranged in the second display area to a channel length of the second driving transistor.

The first channel ratio may be greater or less than the second channel ratio.

The first channel ratio may gradually increase or decrease away from the opening area.

The first display area may include a first sub-display area and a second sub-display area arranged apart from each other in a direction, with the first area therebetween.

The first pixel may be one of pixels adjacent to a boundary between the first sub-display area and the second display area, and the second pixel may be one of pixels adjacent to a boundary between the second sub-display area and the second display area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EXEMPLARY EMBODIMENTS

Figure 1:
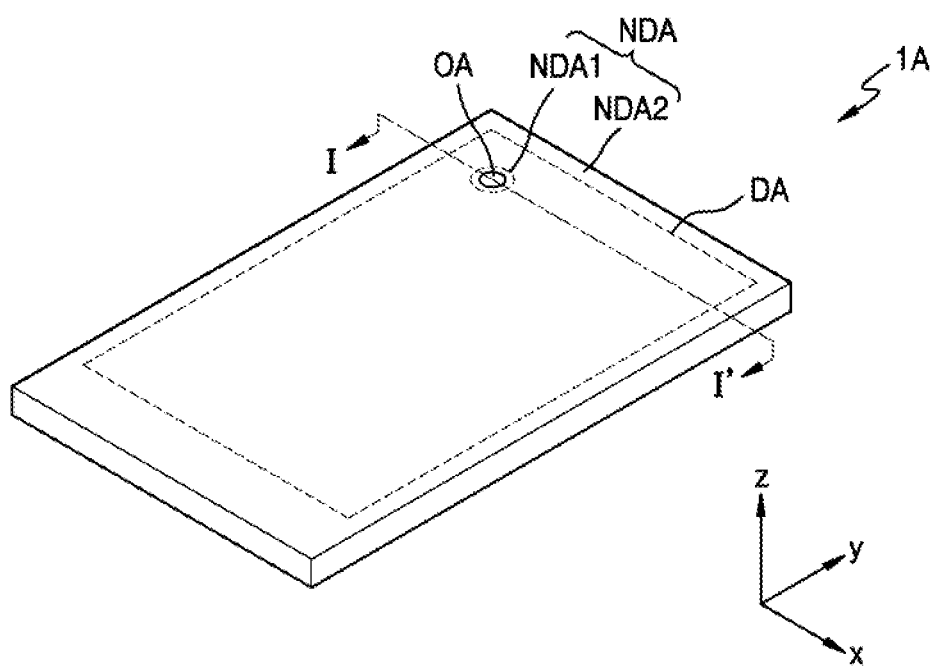
FIG. 1 is a perspective view schematically illustrating a display device according to an exemplary embodiment of the present invention.

Since the present disclosure may have various modifications and several embodiments, embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These terms are only used to distinguish one component from another.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

In the embodiments below, it will be understood when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order.

Throughout the disclosure, the expression "A and/or B" indicates only A, only B, or both A and B. Also, the expression "at least one of A and B" indicates only A, only B, or both A and B.

In the embodiments below, when a layer, an area, or an element is "connected", it may be construed that the layer, area, or element is connected not only directly but also indirectly through other constituent elements therebetween. For example, when a layer, an area, an element, or the like is described as being electrically connected, the layer, the area, the element, or the like may be not only directly electrically connected but also indirectly through another layer, area, element, or the like therebetween.

In the present specification, when a wire 'extends in a first direction or a second direction', it means that the wire is not only extended along a straight line but also in a zigzag or curved shape in the first direction or the second direction.

FIG. 1 is a perspective view schematically illustrating a display device 1A according to an embodiment.

Referring to FIG. 1, the display device 1A includes a first area OA and a second area outside the first area OA. The second area includes a display area DA surrounding the first area OA, and a non-display area NDA. The display device 1A may provide an image by using light emitted from a plurality of pixels arranged in the display area DA. In FIG. 1, the first area OA is arranged within the display area DA, and the first area OA may be completely surrounded by the display area DA. The first area OA may be an area where a component to be described with reference to FIGS. 2A and 2B is arranged.

The non-display area NDA includes a first non-display area NDA1 between the first area OA and the display area DA and a second non-display area NDA2 surrounding the display area DA. The first non-display area NDA1 and the second non-display area NDA2 do not provide an image and may be an area where no pixels are arranged. The first non-display area NDA1 is completely surrounded by the display area DA, and the display area DA is completely surrounded by the second non-display area NDA2. A scan driver providing a scan signal to the pixels, a data driver providing a data signal to the pixels, or the like may be included in the second non-display area NDA2.

Figure 2A:
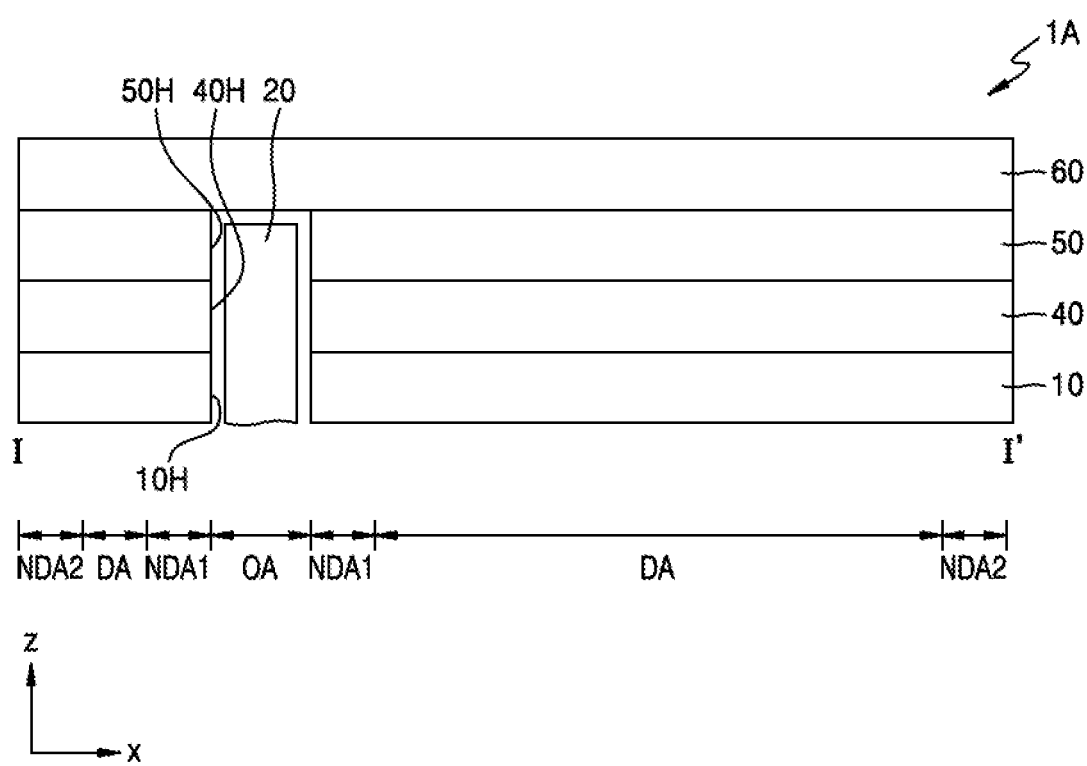
FIGS. 2A and 2B are cross-sectional views, taken along line I-I' of FIG. 1, of a display device according to an exemplary embodiment of the present invention.
Figure 2B:
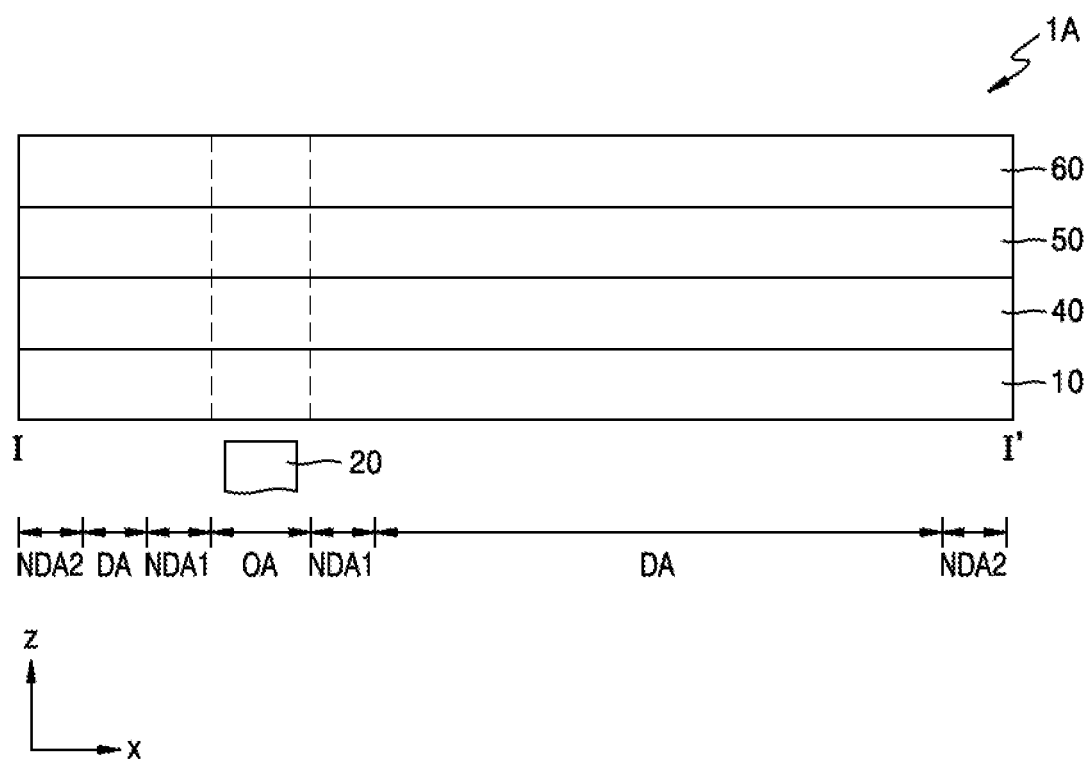

FIGS. 2A and 2B are cross-sectional views, taken along line I-I' of FIG. 1, of the display device 1A according to an exemplary embodiment.

Referring to FIG. 2A, the display device 1A includes a display panel 10, an input sensing layer 40 and an optical functional layer 50 arranged on the display panel 10, and these elements may be covered by a window 60. The display device 1A may be various types of electronic devices such as a mobile phone, a laptop computer, or a smart watch.

The display panel 10 may display an image. The display panel 10 may include pixels arranged in the display area DA. The pixels may include a display element and a pixel circuit connected to the display element. The display element may include an organic light-emitting diode, a quantum dot organic light-emitting diode or the like.

The input sensing layer 40 may acquire coordinate information according to an external input such as a touch event. The input sensing layer 40 may include a sensing electrode (or touch electrode) and a trace line connected to the sensing electrode. The input sensing layer 40 may be arranged on the display panel 10. The input sensing layer 40 may sense an external input by using a mutual cap method or/and a self-cap method.

The input sensing layer 40 may be formed directly on the display panel 10 or may be separately formed and then combined to the display panel 10 by using an adhesive layer such as an adhesive that is optically transparent. For example, the input sensing layer 40 may be formed continuously after a process of forming the display panel 10, and in this case, the input sensing layer 40 may be a portion of the display panel 10, and no adhesive layer may be between the input sensing layer 40 and the display panel 10. In FIG. 2A, the input sensing layer 40 between the display panel 10 and the optical functional layer 50 is illustrated. However, the present invention is not limited thereto. In an exemplary embodiment, the input sensing layer 40 may also be arranged over the optical functional layer 50.

The optical functional layer 50 may include an anti-reflection layer. The anti-reflection layer may reduce the amount of reflectivity of light incident from the outside (external light) onto the display panel 10 through the window 60. The anti-reflection layer may include a retarder and a polarizer. The retarder may be a film type or a liquid crystal coating type and may include a $\lambda/2$ retarder or a $\lambda/4$ retarder. The polarizer may also be a film-type or a liquid crystal coating type. A film-type polarizer may include a stretch-type synthetic resin film, and a liquid crystal coating-type polarizer may include liquid crystals arranged in a certain arrangement. The retarder and the polarizer may further include a protective film. The protective film of the retarder and the polarizer may be defined as a base layer of an anti-reflection layer.

According to another embodiment, the anti-reflection layer may include a black matrix and color filters. The color filters may be arranged considering colors of light respectively emitted from the pixels of the display panel 10. The color filters may include pigments or dyes of red, green or blue colors. Alternatively, the color filters may further include quantum dots in addition to the above-described pigments or dyes. Alternatively, some of the color filters may not include the above-described pigments or dyes, but may include scattered particles such as titanium oxide.

According to another embodiment, the anti-reflection layer may include a destructive interference structure. The destructive interference structure may include a first reflective layer and a second reflective layer arranged on different layers. First reflected light and second reflected light respectively reflected by the first reflective layer and the second reflective layer may undergo destructive interference, thus reducing the amount of reflectivity of external light.

The optical functional layer 50 may include a lens layer. The lens layer may increase an output efficiency of light emitted from the display panel 10 or may reduce color deviation. The lens layer may include a layer having a concave or convex lens shape or/and a plurality of layers having different refractive indices. The optical functional layer 50 may include both the anti-reflection layer and the lens layer described above or one of them.

According to an embodiment, the optical functional layer 50 may be continuously formed after a process of forming the display panel 10 and/or the input sensing layer 40. In this case, no adhesive layer may be arranged between the optical functional layer 50 and the display panel 10 and/or between the optical functional layer 50 and the input sensing layer 40.

The display panel 10, the input sensing layer 40, and/or the optical functional layer 50 may include an opening. In this regard, referring to FIG. 2A, the display panel 10, the input sensing layer 40, and the optical functional layer 50 respectively include first through third openings 10H, 40H, and 50H, and the first through third openings 10H, 40H, and 50H overlap each other. The first through third openings 10H, 40H, and 50H are located in the first area OA. The present invention is not limited thereto. In an exemplary embodiment, one or more of the display panel 10, the input sensing layer 40, and the optical functional layer 50 may not include an opening. For example, any one or two of the display panel 10, the input sensing layer 40, and the optical functional layer 50 may not include an opening. Alternatively, each of the display panel 10, the input sensing layer 40, and the optical functional layer 50 may not include an opening as illustrated in FIG. 2B.

The first area OA may be a type of component area in which a component 20 included to add various functions to the display device 1A as described above is located (for example, a sensor area, a camera area, a speaker area, etc.). The component 20 may be located in the first through third openings 10H, 40H, and 50H, as illustrated in FIG. 2A. Alternatively, the component 20 may be arranged below the display panel 10 as illustrated in FIG. 2B.

The component 20 may include an electronic element. For example, the component 20 may be an electronic element that uses light or sound. For example, the electronic element may include a sensor that outputs or/and receives light, such as an infrared sensor, a camera receiving light to capture an image, a sensor measuring a distance or sensing a fingerprint by outputting and sensing light or sound, a compact lamp outputting light, a speaker outputting sound, and the like. An electronic element using light may use light of various wavelength bands such as visible light, infrared light, ultraviolet light, or the like. In some embodiments, the first area OA may be a transmission area through which light or/and sound that are output from the component 20 is allowed to travel from the component 20 underneath the first area OA to the outside or to travel from the outside into an electronic element underneath the first area OA.

According to another embodiment, when the display device 1A is used as a smart watch or a dashboard for vehicles, the component 20 may be a hand of a watch or a member such as a needle indicating certain information (for example, vehicle velocity). When the display device 1A includes a hand of a watch or a dashboard for vehicles, the component 20 may be visible through the window 60 and be exposed to the outside, and the window 60 may have an opening corresponding to the first area OA.

The component 20 may include component(s) related to the function of the display panel 10 as described above or a component such as accessories that increase the aesthetic sense of the display panel 10. Although not illustrated in FIGS. 2A and 2B, an optical transparent adhesive or the like may be between the window 60 and the optical functional layer 50.

FIGS. 3A through 3D are cross-sectional views of a display panel 10 according to an embodiment.

Figure 3A:
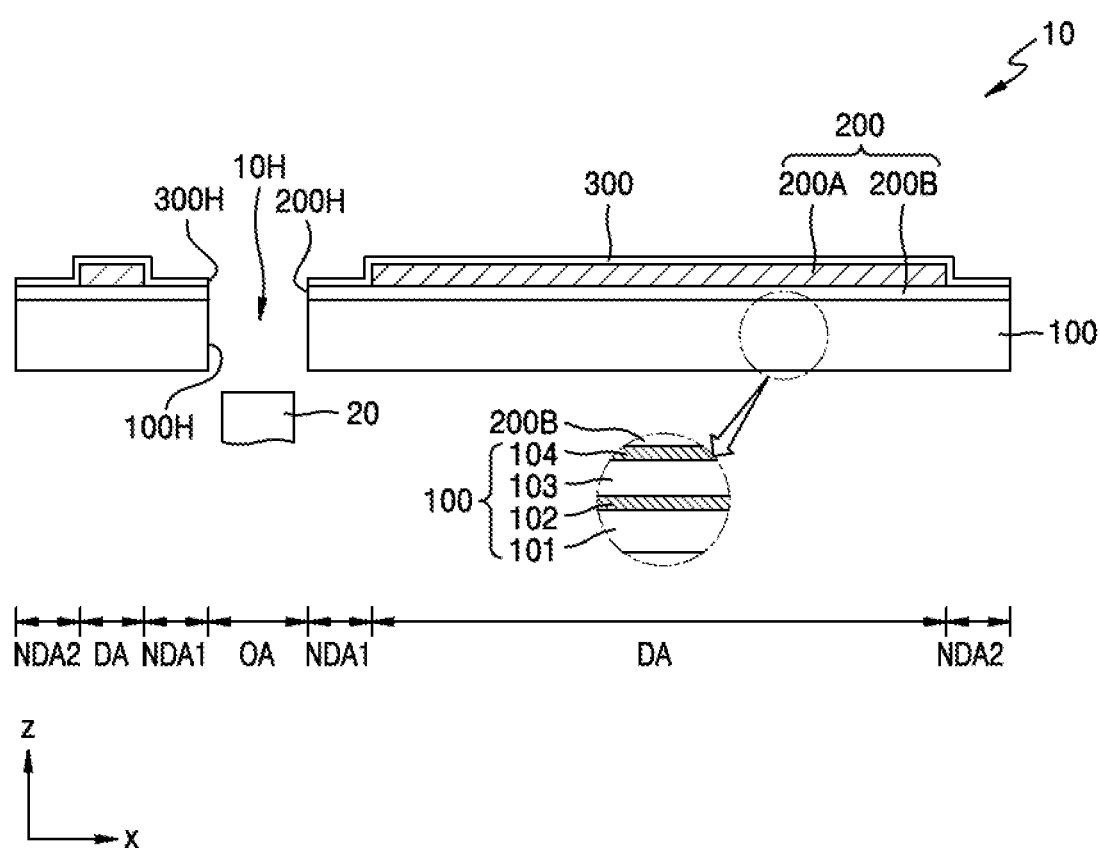
FIGS. 3A through 3D are cross-sectional views of a display panel according to an exemplary embodiment of the present invention.

Referring to FIG. 3A, the display panel 10 includes a display layer 200 arranged on a substrate 100. The substrate 100 may include a glass material or a polymer resin. The substrate 100 may include a multi-layer. For example, the substrate 100 includes, as shown in the enlarged view of FIG. 3A, a first base layer 101, a first barrier layer 102, a second base layer 103, and a second barrier layer 104.

The first and second base layers 101 and 103 may each include a polymer resin. For example, the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The first and second base layers 101 and 103 may each include a transparent polymer resin.

The first barrier layer 102 and the second barrier layer 104 may include barrier layers preventing penetration of external foreign substances and may include a single layer or a multi-layer including an inorganic material such as silicon nitride or silicon oxide.

The display layer 200 may include a plurality of pixels. The display layer 200 includes a display element layer 200A including display elements arranged in each pixel and a pixel circuit layer 200B including a pixel circuit and insulating layers each arranged in each pixel. Each pixel circuit may include a transistor and a capacitor, and each display element may include an organic light-emitting diode (OLED).

Display elements of the display layer 200 may be covered by an encapsulation member such as a thin film encapsulation layer 300, and the thin film encapsulation layer 300 may include at least one inorganic encapsulation layer and at least one organic encapsulation layer. As the display panel 10 includes the substrate 100 including a polymer resin and the thin film encapsulation layer 300 including an inorganic encapsulation layer and an organic encapsulation layer, the flexibility of the display panel 10 may be increased.

The display panel 10 may include a first opening 10H passing through the display panel 10. The first opening 10H may be located in the first area OA, and the first area OA in this case may be a type of an opening area. In FIG. 3A, the substrate 100 and the thin film encapsulation layer 300 respectively include through holes 100H and 300H corresponding to the first opening 10H of the display panel 10. The display layer 200 also includes a through hole 200H corresponding to the first area OA.

Figure 3B:
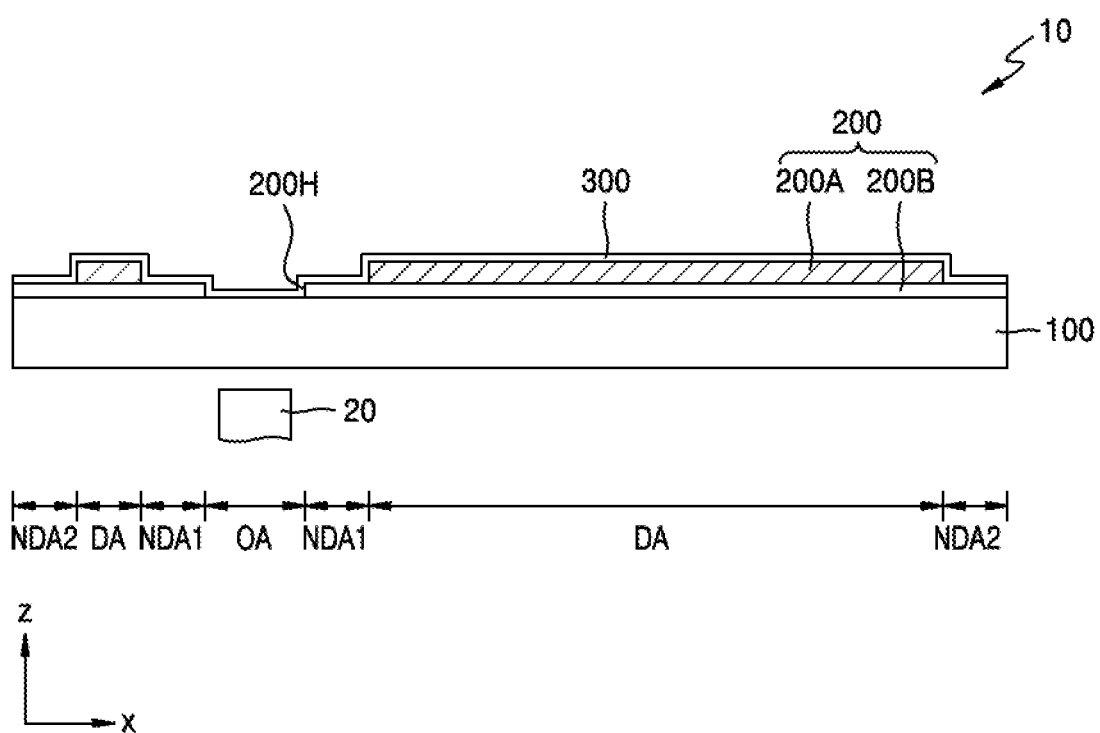

According to another embodiment, as illustrated in FIG. 3B, the substrate 100 may not include a through hole corresponding to the first area OA. The display layer 200 may include a through hole 200H corresponding to the first area OA. The thin film encapsulation layer 300 may not include a through hole corresponding to the first area OA. According to another embodiment, as illustrated in FIG. 3C, the display layer 200 may not include a through hole 200H corresponding to the first area OA, and the display element layer 200A is not located in the first area OA.

Figure 3C:
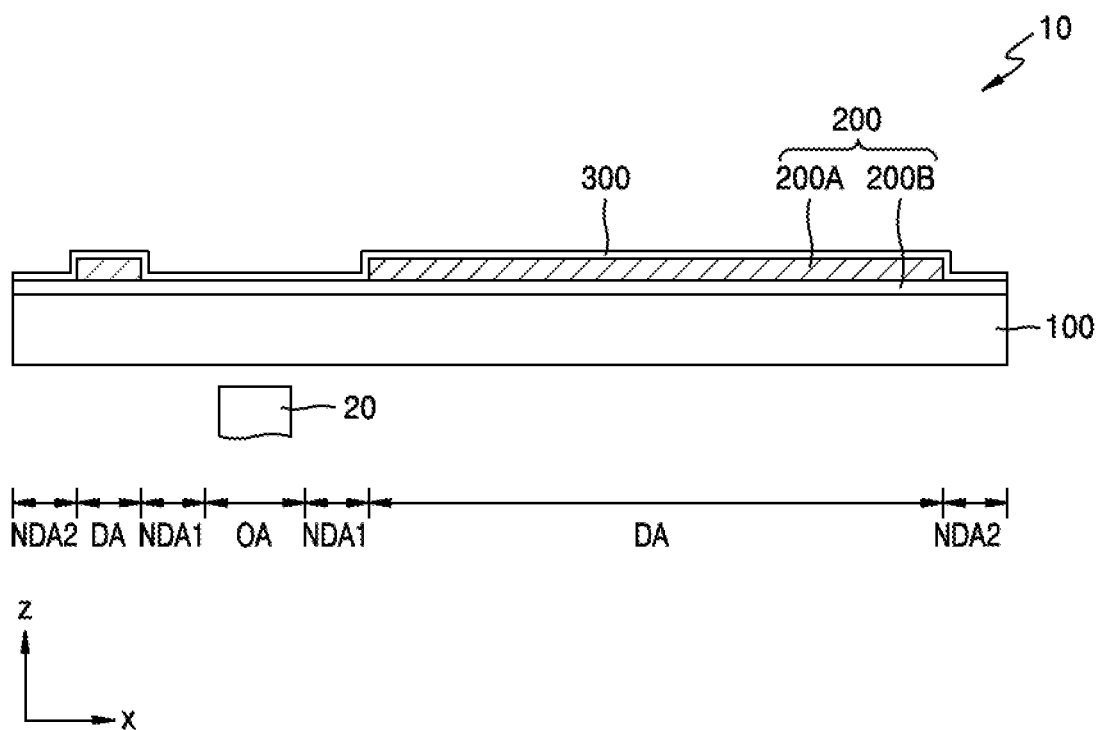
Figure 3D:
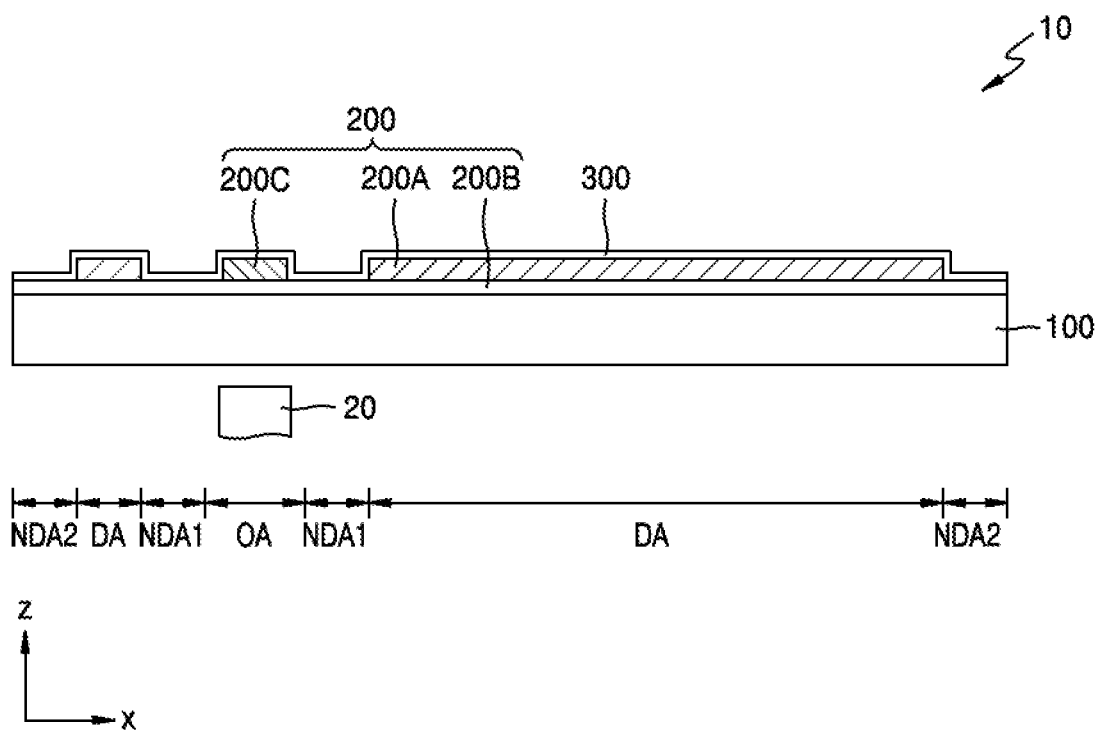

While the display element layer 200A is not arranged in the first area OA in FIGS. 3A through 3C, the present invention is not limited thereto. As another embodiment, as illustrated in FIG. 3D, an auxiliary display element layer 200C may be located in the first area OA. The auxiliary display element layer 200C may include a display element that has a different structure from the display element of the display element layer 200A or/and operates in a different manner from the display element of the display element layer 200A.

According to an embodiment, each pixel of the display element layer 200A may include an active-type organic light-emitting diode, and the auxiliary display element layer 200C may include pixels each including a passive-type organic light-emitting diode. When the auxiliary display element layer 200C includes a passive-type organic light-emitting diode as a display element, components that constitute a pixel circuit may be omitted under the passive-type organic light-emitting diode. For example, a portion of the pixel circuit layer 200B under the auxiliary display element layer 200C does not include a transistor and a capacitor.

According to another embodiment, the auxiliary display element layer 200C may include a display element of a same type as the display element layer 200A (for example, an active type organic light-emitting diode), but a pixel circuit under the auxiliary display element layer 200C may have a different structure. For example, the pixel circuit under the auxiliary display element layer 200C (for example, a pixel circuit including a light shielding layer between a substrate and a transistor) may have a different structure from the pixel circuit under the display element layer 200A. Alternatively, display elements of the auxiliary display element layer 200C may operate according to a control signal different from those for the display elements of the display element layer 200A. In the first area OA where the auxiliary display element layer 200C is arranged, a component that does not require a relatively high transmittance (for example, an infrared sensor) may be arranged. In this case, the first area OA may be both a component area and an auxiliary display area.

In the first area OA of FIGS. 3A through 3D, the component 20 may be arranged below the display panel 10.

FIGS. 4A through 4D are cross-sectional views of a display panel 10' according to an exemplary embodiment. Unlike the display panel 10 including the thin film encapsulation layer 300, described with reference to FIGS. 3A through 3D above, the display panel 10' of FIGS. 4A through 4D may include an encapsulation substrate 300A and a sealant 340.

Figure 4A:
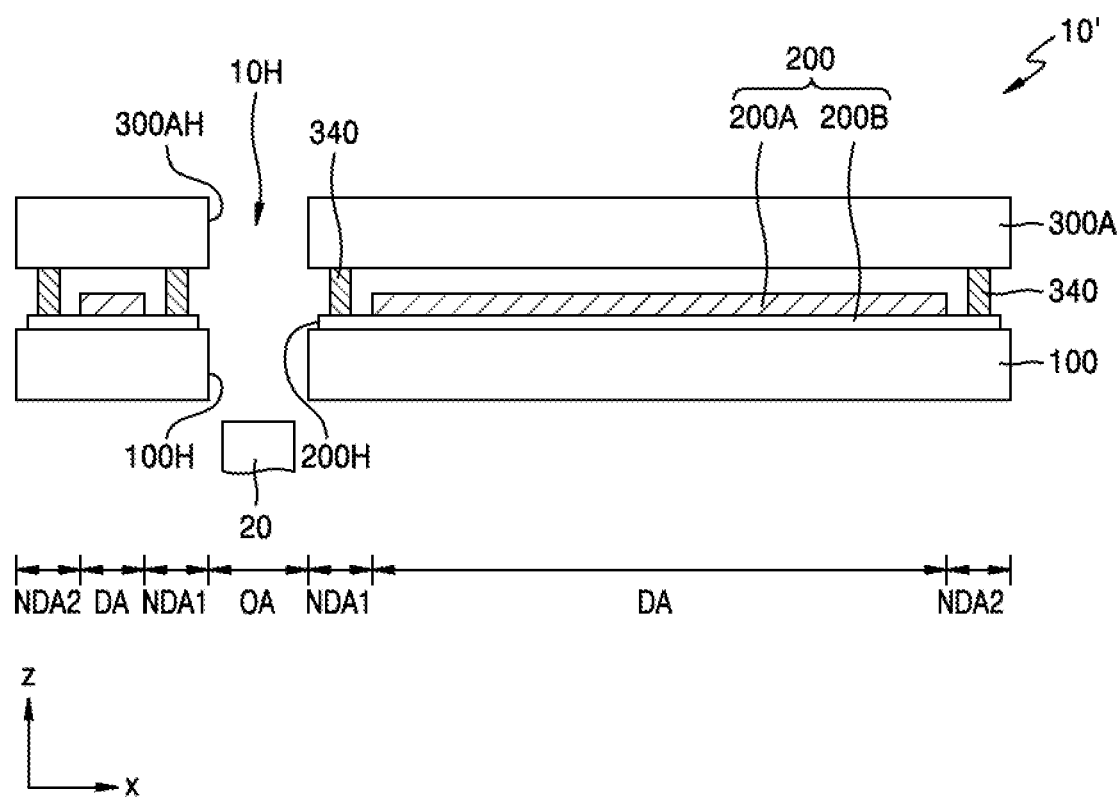
FIGS. 4A through 4D are cross-sectional views of a display panel according to an exemplary embodiment of the present invention.
Figure 4B:
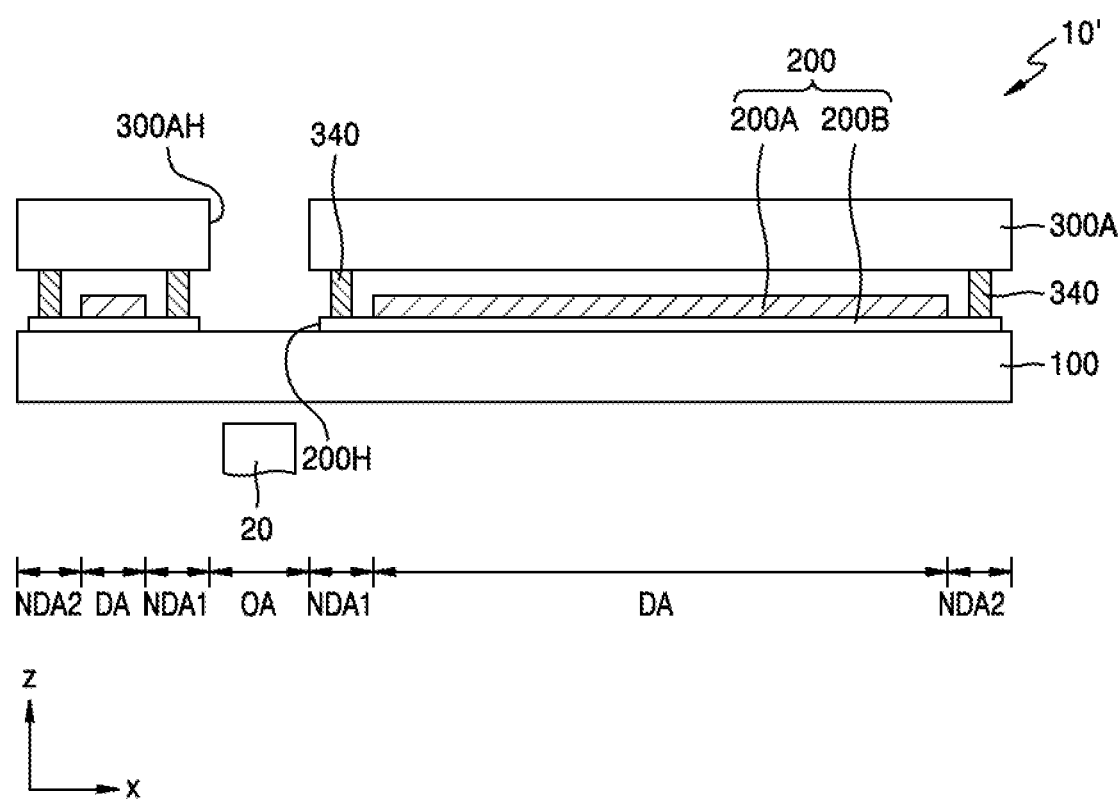
Figure 4C:
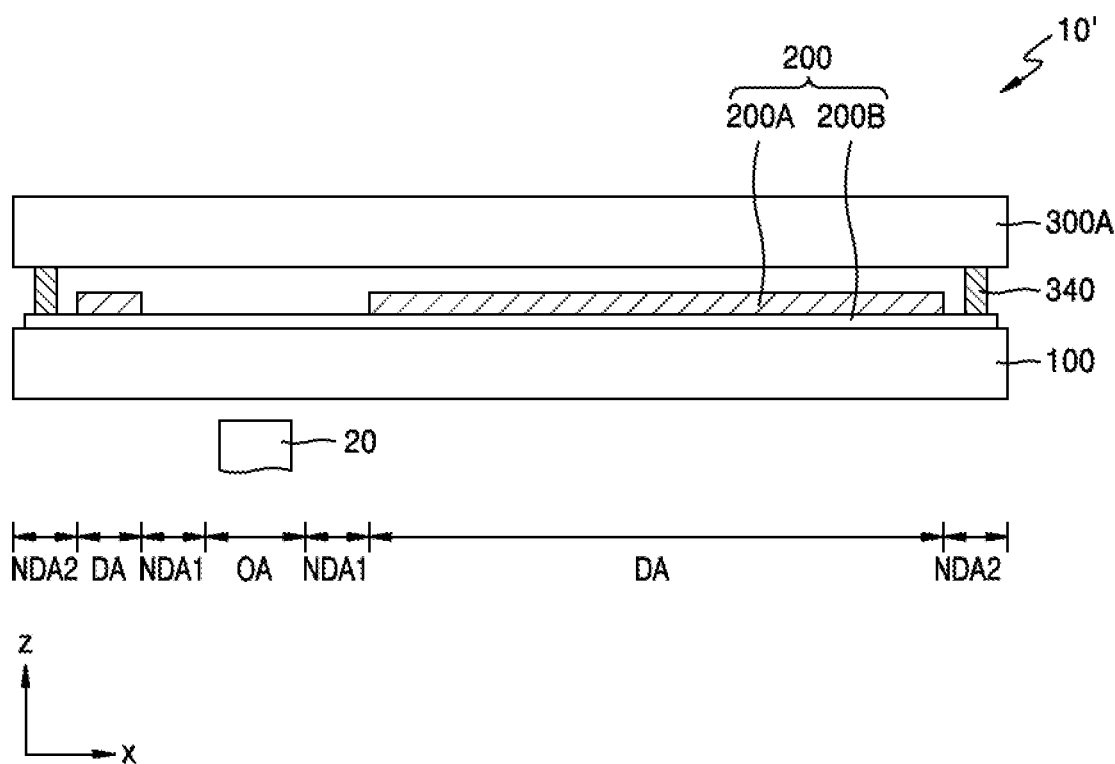
Figure 4D:
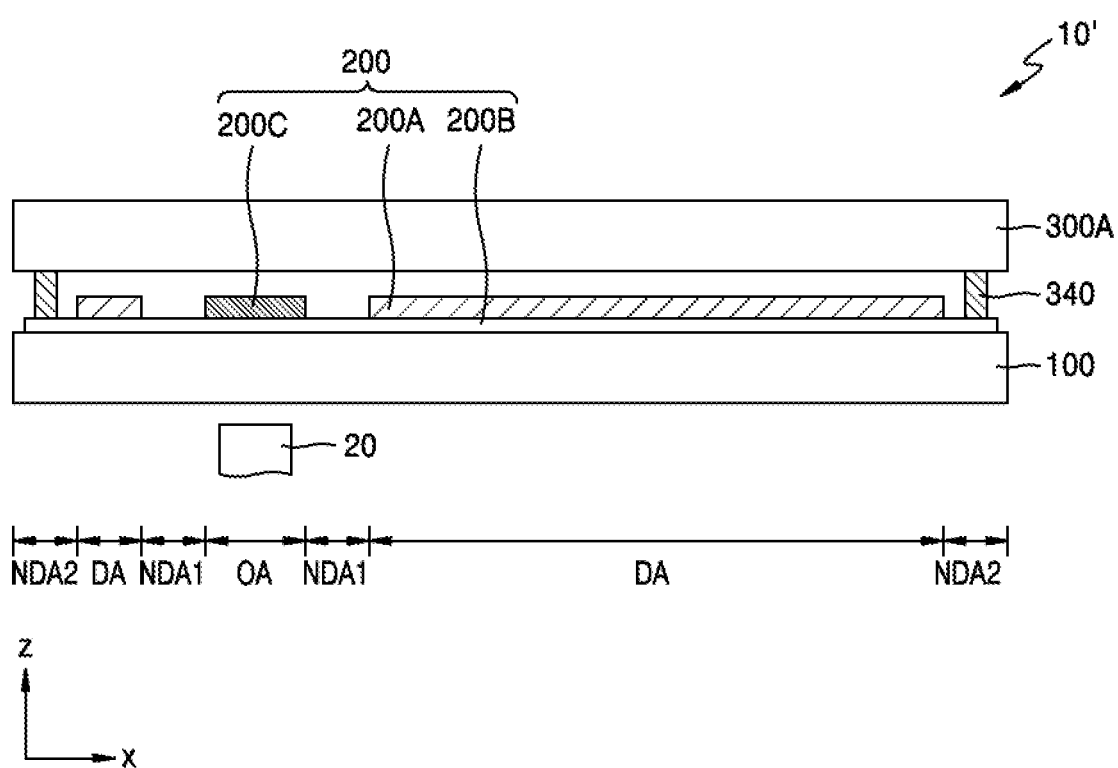

As illustrated in FIGS. 4A through 4C, one or more of the substrate 100, the display layer 200, and the encapsulation substrate 300A may include respectively through holes 100H, 200H, and 300AH corresponding to the first area OA. In the first area OA, the display element layer 200A may not be arranged or the auxiliary display element layer 200C may be arranged as illustrated in FIG. 4D. The auxiliary display element layer 200C is arranged as described above with reference to FIG. 3D.

The component 20 may be arranged below the display panel 10' in the first area OA of FIGS. 4A through 4D.

Figure 5A:
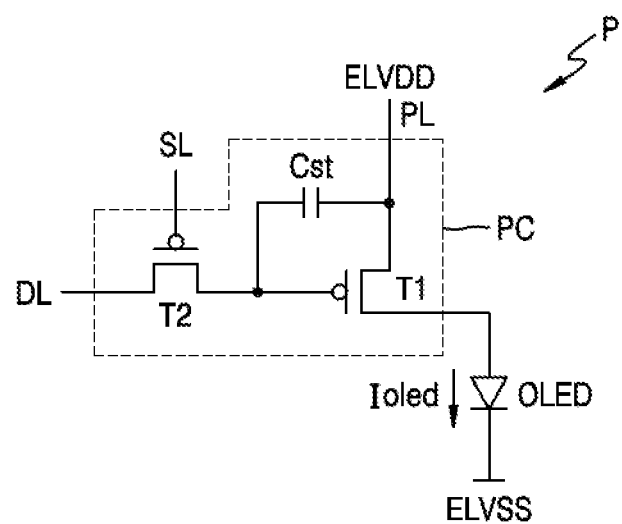
FIGS. 5A and 5B are equivalent circuit diagrams illustrating any pixel arranged in a display panel according to an exemplary embodiment of the present invention.
Figure 5B:
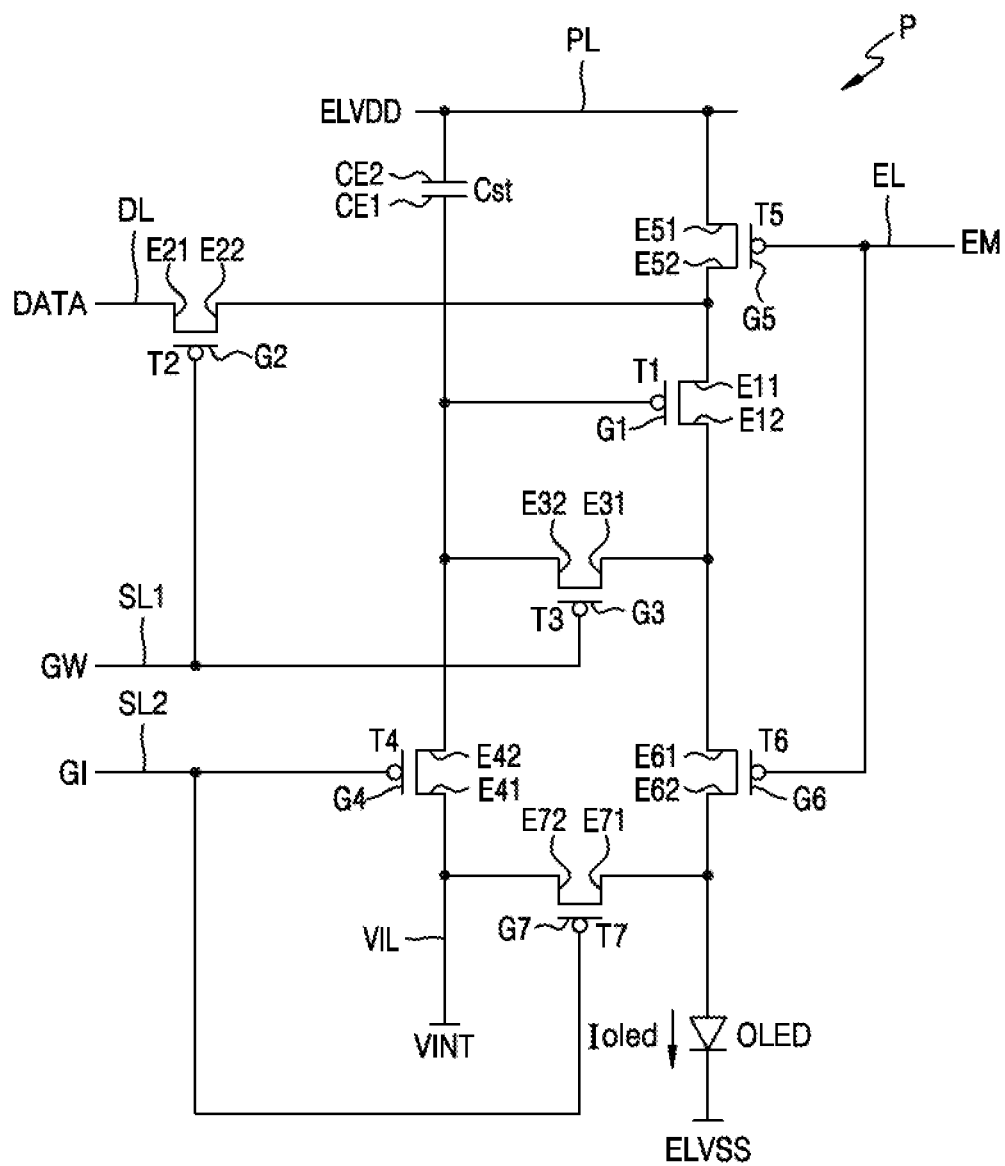

FIGS. 5A and 5B are equivalent circuit diagrams illustrating any pixel P arranged in a display panel according to an exemplary embodiment.

Referring to FIG. 5A, the pixel P includes a pixel circuit PC and an organic light-emitting diode OLED as a display element connected to the pixel circuit PC. The pixel circuit PC includes a first transistor T1, a second transistor T2, and a capacitor Cst. Each pixel P may emit red light, green light, blue light, or white light, from the organic light-emitting diode OLED. The first transistor T1 and the second transistor T2 may include thin film transistors.

The second transistor T2 is a switching thin film transistor and is connected to a scan line SL and a data line DL. The second transistor T2 may transfer a data signal input via the data line DL to the first thin film transistor T1 according to a switching voltage input via the scan line SL. The capacitor Cst is connected to the second transistor T2 and a power voltage line PL, and may store a voltage difference between a voltage received from the second transistor T2 and a first power voltage ELVDD supplied to the power voltage line PL.

The first transistor T1 is a driving transistor and is connected to the power voltage line PL and the capacitor Cst, and may control a driving current Ioled flowing through the organic light-emitting diode OLED from the power voltage line PL, in accordance with a voltage value stored in the capacitor Cst. The organic light-emitting diode OLED may emit light having a certain luminance according to the driving current Ioled. A common electrode (for example, a cathode) of the organic light-emitting diode OLED may receive a second power voltage ELVSS.

FIG. 5A illustrates that the pixel circuit PC includes two transistors and one capacitor, but the embodiments are not limited thereto. The number of transistors and the number of capacitors may also vary according to a design of the pixel circuit PC.

Referring to FIG. 5B, each pixel P includes signal lines SL1, SL2, EL, and DL, an initialization voltage line VIL, and a power voltage line PL, but the present disclosure is not limited thereto. According to another embodiment, at least one of the signal lines SL1, SL2, EL, and DL, and the initialization voltage line VIL or/and the power voltage line PL may be shared between neighboring pixels.

The signal lines SL1, SL2, EL, and DL may include a first scan line SL1 via which a first scan signal GW is transferred, a second scan line SL2 via which a second scan signal GI is transferred, a light emission control line EL via which a light emission control signal EM is transferred, and a data line DL which crosses the first scan line SL1 and via which a data signal DATA is transferred. The second scan line SL2 may be connected to a first scan line SL1 of a next row or a previous row, and the second scan signal GI may be a first scan signal GW of a next row or a previous row.

The power voltage line PL transfers a first power voltage ELVDD to the first transistor T1, and the initialization voltage line VIL transfers an initialization voltage VINT that initializes the first transistor T1 and a pixel electrode, to the pixel P.

A pixel circuit of the pixel P may include a plurality of first through seventh transistors T1 through T7 and a capacitor Cst. First electrodes E11 through E71 and second electrodes E12 through E72 of FIG. 5B may be either a source electrode (source area) or a drain electrode (drain area) according to a type of a transistor (p-type or n-type) and/or operational conditions. The first through seventh transistors T1 through T7 may include thin film transistors.

The first transistor T1 includes a gate electrode G1 connected to a first electrode CE1 of the capacitor Cst, a first electrode E11 that is connected to the power voltage line PL via the fifth transistor T5, and a second electrode E12 that is electrically connected to the pixel electrode of the organic light-emitting diode OLED via the sixth transistor T6. The first transistor T1 may function as a driving transistor and receive a data signal DATA according to a switching operation of the second transistor T2 to supply a current to the organic light-emitting diode OLED.

The second transistor T2 includes a gate electrode G2 connected to the first scan line SL1, a first electrode E21 connected to the data line DL, and a second electrode E22 connected to the first electrode E11 of the first transistor T1. The second transistor T2 is turned on according to the first scan signal GW received via the first scan line SL1 to perform a switching operation of transferring the data signal DATA transferred to the data line DL, to the first electrode E11 of the first transistor T1.

The third transistor T3 includes a gate electrode G3 connected to the first scan line SL1, a first electrode E31 connected to the second electrode E12 of the first transistor T1, and a second electrode E32 connected to the first electrode CE1 of the capacitor Cst, a second electrode E42 of the fourth transistor T4, and the gate electrode G1 of the first transistor T1. The second electrode E32 is connected to the pixel electrode of the organic light-emitting diode OLED via the sixth transistor T6. The third transistor T3 is turned on according to the first scan signal GW received via the first scan line SL1 to diode-connect the first transistor T1.

The fourth transistor T4 includes a gate electrode G4 connected to the second scan line SL2, a first electrode E41 connected to the initialization voltage line VIL, and the second electrode E42 connected to the first electrode CE1 of the capacitor Cst, the second electrode E32 of the third transistor T3, and the gate electrode G1 of the first transistor T1. The fourth transistor T4 is turned on according to the second scan signal GI received via the second scan line SL2 to transfer an initialization voltage VINT to the gate electrode G1 of the first transistor T1 to thereby initialize a gate voltage of the first transistor T1 to the initialization voltage VINT.

The fifth transistor T5 includes a gate electrode G5 connected to the light emission control line EL, a first electrode E51 connected to the power voltage line PL, and a second electrode E52 connected to the first electrode E11 of the first transistor T1 and the second electrode E22 of the second transistor T2.

The sixth transistor T6 includes a gate electrode G6 connected to the light emission control line EL, a first electrode E61 connected to the second electrode E12 of the first transistor T1 and the first electrode E31 of the third transistor T3, and a second electrode E62 connected to the pixel electrode of the organic light-emitting diode OLED.

As the fifth transistor T5 and the sixth transistor T6 are simultaneously turned on according to the light emission control signal EM received via the light emission control line EL, a current flows through the organic light-emitting diode OLED.

The seventh transistor T7 includes a gate electrode G7 connected to the second scan line SL2, a first electrode E71 connected to the second electrode E62 of the sixth transistor T6 and the pixel electrode of the organic light-emitting diode OLED, and a second electrode E72 connected to the initialization voltage line VIL. The seventh transistor T7 is turned on according to the second scan signal GI received via the second scan line SL2 to initialize a voltage of the pixel electrode of the organic light-emitting diode OLED to the initialization voltage VINT. The seventh transistor T7 may be omitted.

While the fourth transistor T4 and the seventh transistor T7 are connected to the second scan line SL2 in FIG. 5B, the present disclosure is not limited thereto. According to another embodiment, the fourth transistor T4 may be connected to the second scan line SL2, and the seventh transistor T7 may be connected to another wire to be driven according to a signal transferred to that wire.

The capacitor Cst includes the first electrode CE1 connected to the gate electrode G1 of the first transistor T1 and a second electrode CE2 connected to the power voltage line PL. The first electrode CE1 of the capacitor Cst is also connected to the second electrode E32 of the third transistor T3 and the second electrode E42 of the fourth transistor T4.

The organic light-emitting diode OLED may include the pixel electrode and the common electrode facing the pixel electrode, and the common electrode may receive a second power voltage ELVSS. The organic light-emitting diode OLED receives a driving current Ioled from the first transistor T1 to emit light, thereby displaying an image.

Figure 6A:
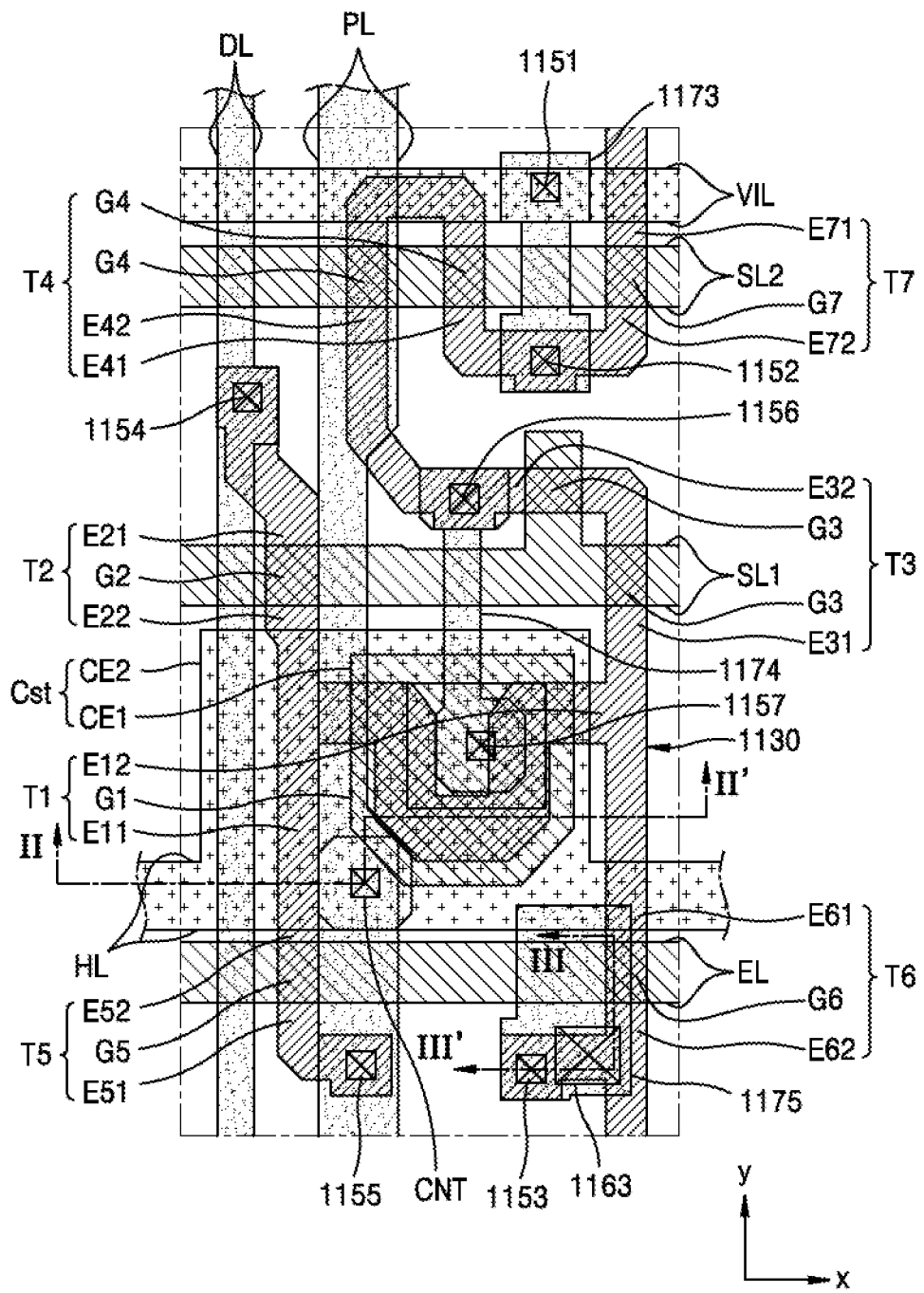
FIG. 6A is a layout diagram schematically illustrating positions of transistors and a capacitor or the like in the pixel of FIG. 5B, according to an exemplary embodiment of the present invention.
Figure 6B:
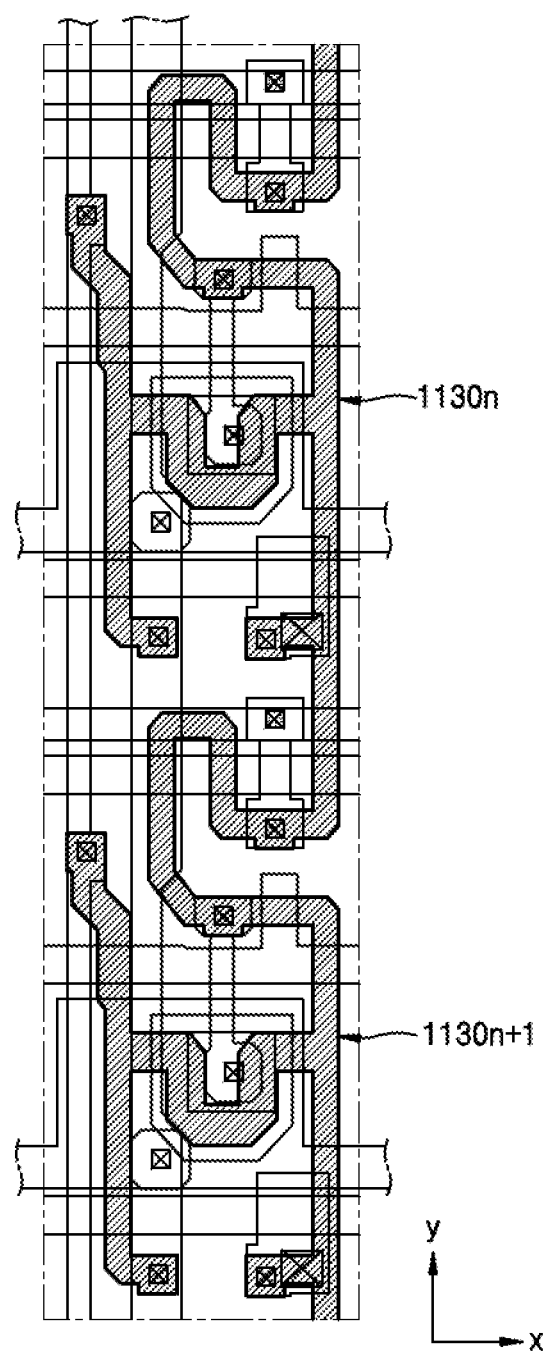
FIG. 6B is a plan view of pixel circuits of an nth row and an (n+1)th row that are arranged adjacent to each other in a display panel according to an exemplary embodiment of the present invention.

FIG. 6A is a layout diagram schematically illustrating positions of transistors and a capacitor or the like in the pixel of FIG. 5B, according to an embodiment. FIG. 6B is a plan view of pixel circuits of an nth row and an (n+1)th row that are arranged adjacent to each other in a display panel according to an embodiment. In FIGS. 6A and 6B, for convenience of description, the organic light-emitting diode OLED over a pixel circuit is omitted.

Referring to FIG. 6A, the pixel P includes the first through seventh transistors T1 through T7 and the capacitor Cst. The first through seventh transistors T1 through T7 may each include a semiconductor layer and a gate electrode that is arranged at a position corresponding to a channel area of the semiconductor layer and is insulated from the semiconductor layer. The first transistor T1, the second transistor T2, the third transistor T3, the fourth transistor T4, the fifth transistor T5, the sixth transistor T6, and the seventh transistor T7 are arranged along a semiconductor layer 1130. That is, the semiconductor layers of the first through seventh transistors T1 through T7 may be connected to each other and curved in various shapes.

The semiconductor layer 1130 includes a channel area and a source area and a drain area on both sides of the channel area, and the source area and the drain area may be respectively a source electrode and a drain electrode of a corresponding transistor. The source electrode (source area) and the drain electrode (drain area) illustrated in FIG. 6A may be respectively a first electrode and a second electrode of a transistor illustrated in FIG. 5B.

The first transistor T1 includes the gate electrode G1 overlapping a channel area and the first electrode E11 and the second electrode E12 on opposite sides of the channel area. The channel area overlapping the gate electrode G1 may have a bent shape to thereby provide a relatively long channel length in a narrow space.

The second transistor T2 includes the gate electrode G2 overlapping a channel area and the first electrode E21 and the second electrode E22 on opposite sides of the channel area. The second electrode E22 is connected to the first electrode E11 of the first transistor T1.

The third transistor T3 is a dual transistor with the gate electrodes G3 overlapping two channel areas and the first electrode E31 and the second electrode E32 arranged on opposite sides of the channel areas. The third transistor T3 may be connected to the gate electrode G1 of the first transistor T1 via a node connection line 1174 which will be described later.

The fourth transistor T4 is a dual transistor with the gate electrodes G4 overlapping two channel areas and the first electrode E41 and the second electrode E42 arranged on opposite sides of the channel areas.

The fifth transistor T5 includes the gate electrode G5 overlapping a channel area and the first electrode E51 and the second electrode E52 arranged on opposite sides of the channel area. The second electrode E52 is connected to the first electrode E11 of the first transistor T1.

The sixth transistor T6 includes the gate electrode G6 overlapping a channel area and the first electrode E61 and the second electrode E62 arranged on opposite sides of the channel area. The first electrode E61 is connected to the second electrode E12 of the first transistor T1.

The seventh transistor T7 includes the gate electrode G7 overlapping a channel area and the first electrode E71 and the second electrode E72 arranged on opposite sides of the channel area.

The first scan line SL1, the second scan line SL2, the light emission control line EL, and the gate electrode G1 of the first transistor T1 may be arranged on the semiconductor layer 1130 with insulating layer(s) therebetween.

The first scan line SL1, the second scan line SL2, and the light emission control line EL each extend in a first direction (x-direction). Portions of the first scan line SL1 may correspond to the gate electrode G2 of the second transistor T2 and the gate electrode G3 of the third transistor T3. Portions of the second scan line SL2 may correspond to the gate electrode G4 of the fourth transistor T4 and the gate electrode G7 of the seventh transistor T7. Portions of the light emission control line EL may correspond to the gate electrode G5 of the fifth transistor T5 and the gate electrode G6 of the sixth transistor T6.

The gate electrode G1 of the first transistor T1 is an island electrode and is connected to the third transistor T3 via the node connection line 1174.

An electrode voltage line HL is disposed between the first scan line SL1 and the light emission control line EL. The electrode voltage line HL overlaps the gate electrode G1 of the first transistor T1 with insulating layer(s) therebetween.

The electrode voltage line HL extends in the first direction to cross the data line DL and the power voltage line PL. A portion of the electrode voltage line HL is extended in a second direction (y-direction) different from the first direction to cover the gate electrode G1 of the first transistor T1. Such overlap between the portion of the electrode voltage line HL and the gate electrode G1 may form the capacitor Cst. For example, the gate electrode G1 of the first transistor T1 may be the first electrode CE1 of the capacitor Cst, and the portion of the electrode voltage line HL may be the second electrode CE2 of the capacitor Cst. In FIG. 6A, the gate electrode G1 entirely overlaps the portion of the electrode voltage line HL. The present invention is not limited thereto. In an example embodiment, the gate electrode G1 may partially overlap the portion of the electrode voltage line HL.

The second electrode CE2 of the capacitor Cst is electrically connected to the power voltage line PL. The electrode voltage line HL may be connected to the power voltage line PL arranged on the electrode voltage line HL, via a contact hole CNT. Thus, the electrode voltage line HL may have a same voltage level (for example, a constant voltage) as that of the power voltage line PL. In this case, the power voltage line PL may be referred to as a power voltage line extended in the second direction, and the electrode voltage line HL may be referred to as a power voltage line extended in the first direction.

The initialization voltage line VIL extends in the first direction (x-direction). The initialization voltage line VIL may be connected to the fourth transistor T4 and the seventh transistor T7 via an initialization connection line 1173.

The initialization voltage line VIL may be arranged on a same layer as the electrode voltage line HL and may include a same material as the electrode voltage line HL. While the initialization voltage line VIL and the electrode voltage line HL are described as being arranged on a same layer in the description with reference to FIG. 6A, in another embodiment, the initialization voltage line VIL may be arranged on a same layer as the electrode voltage line HL or a pixel electrode 210.

The data line DL, the power voltage line PL, the initialization connection line 1173, and the node connection line 1174 may be arranged on the electrode voltage line HL with insulating layer(s) therebetween.

The data line DL and the power voltage line PL extend in the second direction (y-direction). The data line DL may be connected to the first electrode E12 of the second transistor T2 via a contact hole 1154. A portion of the data line DL may be understood to be the first electrode E21 of the second transistor T2.

The power voltage line PL may be connected to the electrode voltage line HL via the contact hole CNT. In addition, the power voltage line PL may be connected to the fifth transistor T5 via a contact hole 1155. The power voltage line PL may be connected to the first electrode E51 of the fifth transistor T5 via the contact hole 1155. In FIG. 6A, the power voltage line PL may be included as a single layer on a same layer as the data line DL. However, in another embodiment, the power voltage line PL may have a two-layer structure including a lower power voltage line arranged on a same layer as the data line DL and an upper power voltage line arranged over the lower power voltage line. At least one insulating layer may be arranged between the lower power voltage line and the upper power voltage line. In this case, at least one insulating layer may be further arranged between the upper power voltage line and a pixel electrode.

One end of the initialization connection line 1173 may be connected to the fourth transistor T4 and the seventh transistor T7 via a contact hole 1152, and the other end of the initialization connection line 1173 may be connected to the initialization voltage line VIL via a contact hole 1151.

One end of the node connection line 1174 may be connected to the second electrode E32 of the third transistor T3 via a contact hole 1156, and the other end of the node connection line 1174 may be connected to the gate electrode G1 of the first transistor T1 via a contact hole 1157.

The pixel electrode 210 of the organic light-emitting diode OLED (FIG. 7) may be arranged over the data line DL, the power voltage line PL, the initialization connection line 1173, and the node connection line 1174 with an insulating layer (s) therebetween. The pixel electrode 210 may be connected to the sixth transistor T6 and many be connected to the first transistor T1 via the sixth transistor T6. The pixel electrode 210 is connected to a connection metal 1175 via a contact hole 1163, and the connection metal 1175 may be connected to the second electrode E62 of the sixth transistor T6 via a contact hole 1153.

FIG. 6A illustrates the seventh transistor T7 that is included in a pixel circuit of a previous row and electrically connected to a second scan line SL2 of a pixel of a current row. That is, the seventh transistor T7 of the pixel of the current row may be connected to a second scan line SL2 included in a pixel circuit of a pixel of a next row. According to another embodiment, the seventh transistor T7 of the pixel of the current row may be connected to the second scan line SL2 included in the pixel circuit of the pixel of the current row.

Referring to FIG. 6B, a semiconductor layer 1130n of a pixel of an nth row may be connected to a semiconductor layer 1130n+1 of a pixel of an (n+1)th row. That is, neighboring pixel circuits in the second direction (y-direction), for example, a pixel circuit of a pixel of an nth row and a pixel circuit of a pixel of an (n+1)th row may share one or more signal lines, and accordingly, pixel circuits may be efficiently arranged in a relatively small space area.

Figure 7:
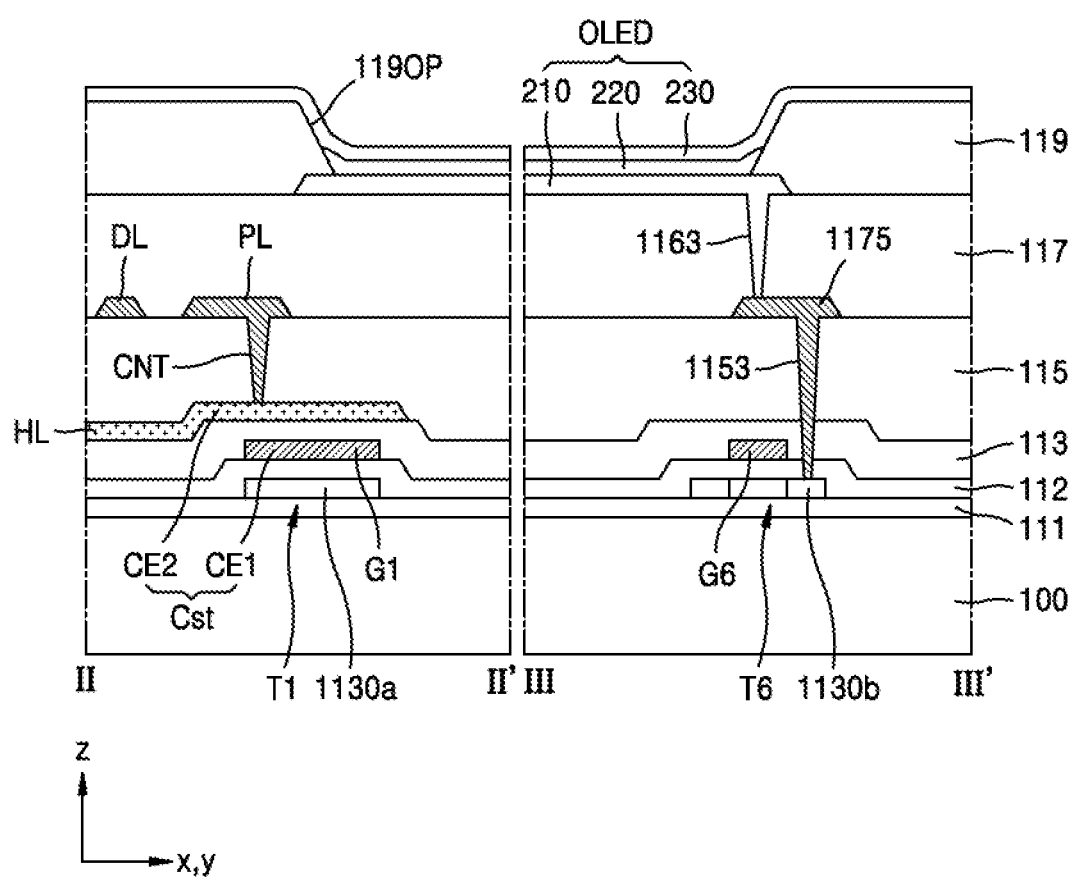
FIG. 7 is a cross-sectional view of the pixel, taken along line II-II' and line III-III' of FIG. 6A, according to an exemplary embodiment of the present invention.

FIG. 7 is a cross-sectional view of the pixel taken along line II-II' and line III-III' of FIG. 6A.

The substrate 100 may include a glass material or a polymer resin as described above. A buffer layer 111 may be located on the substrate 100 to reduce or prevent penetration of foreign substances, moisture, or external air from below the substrate 100 and may also provide a planar surface on the substrate 100. The buffer layer 111 may include an inorganic material such as an oxide or a nitride, an organic material, or an organic-inorganic complex material, and have a single-layer or multi-layer structure including an organic material and an organic material.

Semiconductor layers 1130a and 1130b may include polysilicon. Alternatively, the semiconductor layers 1130a and 1130b may include amorphous silicon, an oxide semiconductor, or an organic semiconductor. The semiconductor layers 1130a and 1130b illustrated in FIG. 7 denote portions of the semiconductor layer 1130 described above with reference to FIG. 6A. The pixel of FIG. 7 will now be described with reference to both FIGS. 7 and 6A.

The gate electrodes G1 and G6 are respectively arranged on the semiconductor layers 1130a and 1130b with a first insulating layer 112 therebetween. The gate electrodes G1 and G6 may include molybdenum (Mo), aluminum (Al), copper (Cu), titanium (Ti), or the like and may include a single-layer or multi-layer. For example, the gate electrodes G1 and G6 may be a single layer including molybdenum (Mo). The first scan line SL1 (see FIG. 6A), the second scan line SL2, and the light emission control line EL may be formed on a same layer as the gate electrodes G1 and G6. That is, the gate electrodes G1 and G6, the first scan line SL1, the second scan line SL2, and the light emission control line EL may be arranged on the first insulating layer 112.

The first insulating layer 112 may include, for example, a silicon oxide, a silicon nitride, a silicon oxynitride, an aluminum oxide, a titanium oxide, a tantalum oxide, a hafnium oxide, or a zinc oxide.

A second insulating layer 113 is provided to cover the gate electrodes G1 and G6. The second insulating layer 113 may include, for example, a silicon oxide, a silicon nitride, a silicon oxynitride, an aluminum oxide, a titanium oxide, a tantalum oxide, a hafnium oxide, or a zinc oxide.

The first electrode CE1 of the capacitor Cst may be formed as a single body with the gate electrode G1 of the first transistor T1. For example, the gate electrode G1 of the first transistor T1 may act as the first electrode CE1 of the capacitor Cst. The second electrode CE2 of the capacitor Cst overlaps the first electrode CE1 with the second insulating layer 113 therebetween. In this case, the second insulating layer 113 may act as a dielectric layer of the capacitor Cst. The second electrode CE2 of the capacitor Cst may include a conductive material including molybdenum (Mo), aluminum (Al), copper (Cu), titanium (Ti), or the like, and may include a multi-layer or a single layer including the above-described material. For example, the second electrode CE2 of the capacitor Cst may be a single layer including Mo or a multi-layer including Mo/Al/Mo.

In the drawing, the capacitor Cst is illustrated as overlapping the first transistor T1, but the present invention is not limited thereto. The capacitor Cst may be modified in various manners; for example, the capacitor Cst may be arranged not to overlap the first transistor T1.

The second electrode CE2 of the capacitor Cst may act as the electrode voltage line HL. For example, a portion of the electrode voltage line HL may be the second electrode CE2 of the capacitor Cst.

A third insulating layer 115 is provided to cover the second electrode CE2 of the capacitor Cst. The third insulating layer 115 may include, for example, a silicon oxide, a silicon nitride, a silicon oxynitride, an aluminum oxide, a titanium oxide, a tantalum oxide, a hafnium oxide, or a zinc oxide.

The data line DL, the power voltage line PL, and the connection metal 1175 are arranged on the third insulating layer 115. The data line DL, the power voltage line PL, and the connection metal 1175 may include a conductive material including molybdenum (Mo), aluminum (Al), copper (Cu), titanium (Ti), or the like, and may include a multi-layer or a single layer including the above-described material. For example, the data line DL, the power voltage line PL, and the connection metal 1175 may have a multi-layer structure including Ti/Al/Ti.

The data line DL and the power voltage line PL are arranged overall in the display area DA to transfer a signal or a voltage to a plurality of pixels, and the specific resistance of the data line DL and the power voltage line PL may be less than the specific resistance of the second electrode CE2 of the capacitor Cst or the electrode voltage line HL. In some embodiments, the specific resistance of the data line DL and the power voltage line PL may be about $\frac{1}{10}$ of the specific resistance of the second electrode CE2 of the capacitor Cst or the electrode voltage line HL.

The second electrode CE2 of the capacitor Cst is connected to the power voltage line PL via the contact hole CNT defined in the third insulating layer 115. The electrode voltage line HL is connected to the power voltage line PL via the contact hole CNT. Thus, the electrode voltage line HL may have a same voltage level (a constant voltage) as that of the power voltage line PL.

The connection metal 1175 is connected to the semiconductor layer 1130b of the sixth transistor T6 via the contact hole 1153 passing through the third insulating layer 115, the second insulating layer 113, and the first insulating layer 112. The sixth transistor T6 may be electrically connected to the pixel electrode 210 of the organic light-emitting diode OLED via the connection metal 1175.

A fourth insulating layer 117 is located on the data line DL, the power voltage line PL, and the connection metal 1175, and the organic light-emitting diode OLED may be located on the fourth insulating layer 117.

The fourth insulating layer 117 may have a planar upper surface so that the pixel electrode 210 is planar. The fourth insulating layer 117 may include a single-layer or multi-layer including a layer formed of an organic material. Alternatively, the fourth insulating layer 117 may include an inorganic material such as a silicon nitride or a silicon oxide. Alternatively, the fourth insulating layer 117 may include both an organic material and an inorganic material.

A contact hole 1163 exposing the connection metal 1175 is in the fourth insulating layer 117, and the pixel electrode 210 is connected to the connection metal 1175 via the contact hole 1163.

The pixel electrode 210 may be a transparent or semi-transparent electrode or a reflective electrode. In some embodiments, the pixel electrode 210 may include a reflective layer formed of Ag, Mg, Al, Pt, Pd, Au, Ni, Nd, Ir, Cr, or a compound thereof and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stacked structure including ITO/Ag/ITO.

A fifth insulating layer 119 is arranged on the fourth insulating layer 117, and the fifth insulating layer 119 may include a pixel defining layer defining an emission area of a pixel by having an opening portion 1190P exposing a center portion of the pixel electrode 210. In addition, the fifth insulating layer 119 may increase a distance between an edge of the pixel electrode 210 and an opposite electrode 230 over the pixel electrode 210 to prevent an arc or the like at the edge of the pixel electrode 210. The fifth insulating layer 119 may include an organic insulating material such as polyimide, polyamide, acrylic resin, benzocyclobutene, hexamethyldisiloxane (HMDSO), and phenolic resin and may be formed by using a method such as spin coating.

An intermediate layer 220 of the organic light-emitting diode OLED may include an organic emission layer. An organic emission layer may include an organic material that includes a fluorescent or phosphorescent material that emits red, green, blue or white light. The organic emission layer may be a low molecular weight organic material or a polymer organic material, and functional layers such as a hole transport layer (HTL), a hole injection layer (HIL), an electron transport layer (ETL), an electron injection layer (EIL), or the like may be selectively further arranged under and over the organic emission layer. The intermediate layer 220 may be separately arranged on each of a plurality of pixel electrodes 210. However, the present disclosure is not limited thereto. An intermediate layer 220 may include a layer that is formed as a single body over the plurality of pixel electrodes 210 or other modifications may also be made.

The opposite electrode 230 may be a transparent or semi-transparent electrode or a reflective electrode. In some embodiments, the opposite electrode 230 may be a transparent or semi-transparent electrode layer, and may include a metal thin film having a small work function and including Li, Ca, LiF/Ca, LiF/Al, Al, Ag, Mg or a compound thereof. In addition, a transparent conductive oxide (TCO) layer such as ITO, IZO, ZnO or $In_2O_3$ may be further arranged on the metal thin film. The opposite electrode 230 may be arranged over the display area DA and the non-display area NDA and on the intermediate layer 220 and the fifth insulating layer 119. The opposite electrode 230 may be formed as a single body with respect to a plurality of organic light-emitting diodes OLED and correspond to a plurality of pixel electrodes 210.

When the pixel electrode 210 includes a reflective electrode and the opposite electrode 230 includes a transparent electrode, light from the intermediate layer 220 is emitted toward the opposite electrode 230 and a display device here may be a top emission type. When the pixel electrode 210 includes a transparent or semi-transparent electrode layer and the opposite electrode 230 includes a reflective electrode, light from the intermediate layer 220 is emitted toward the substrate 100 and a display device here may be a bottom emission type. However, the present invention is not limited thereto. In an exemplary embodiment, the display device may be a dual emission type in which light is emitted toward two directions, that is, to the top and bottom sides.

Figure 8:
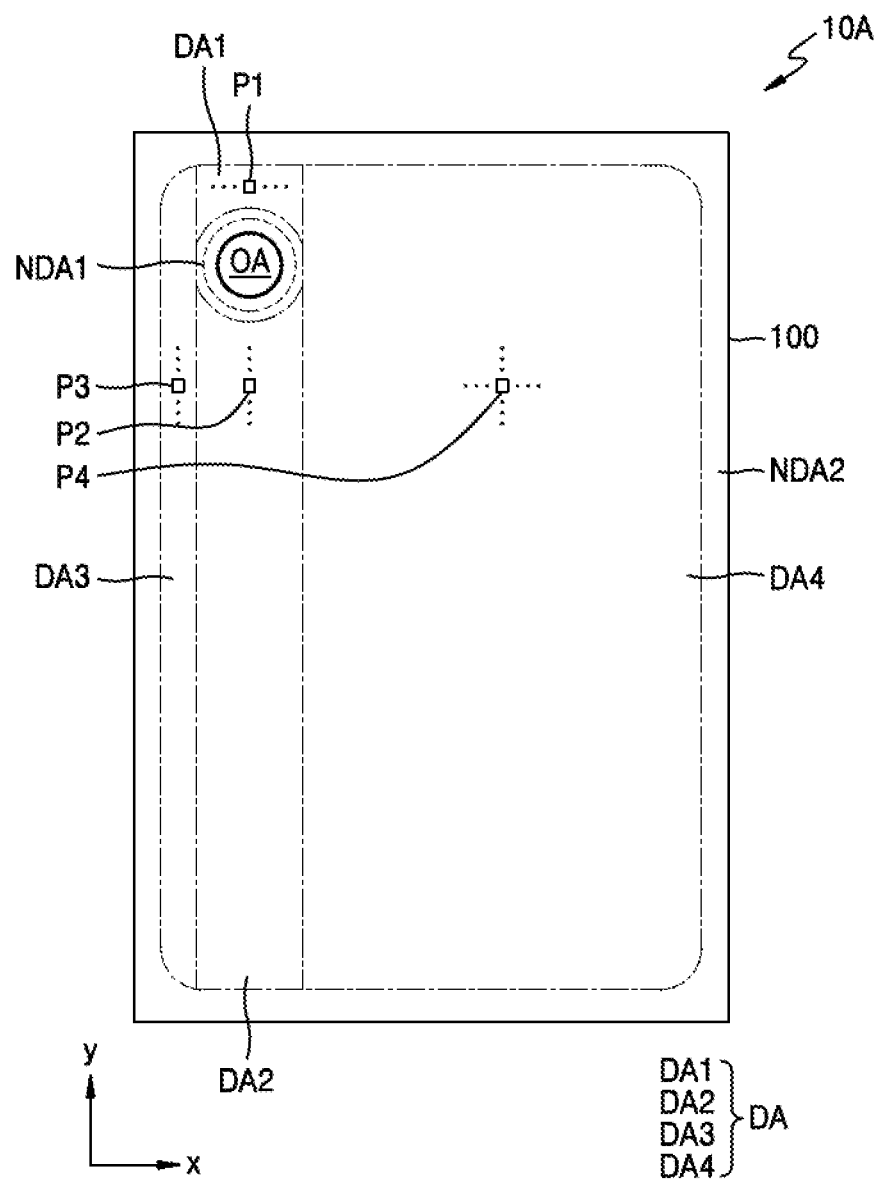
FIG. 8 is a schematic plan view of a display panel according to an exemplary embodiment of the present invention.
Figure 9:
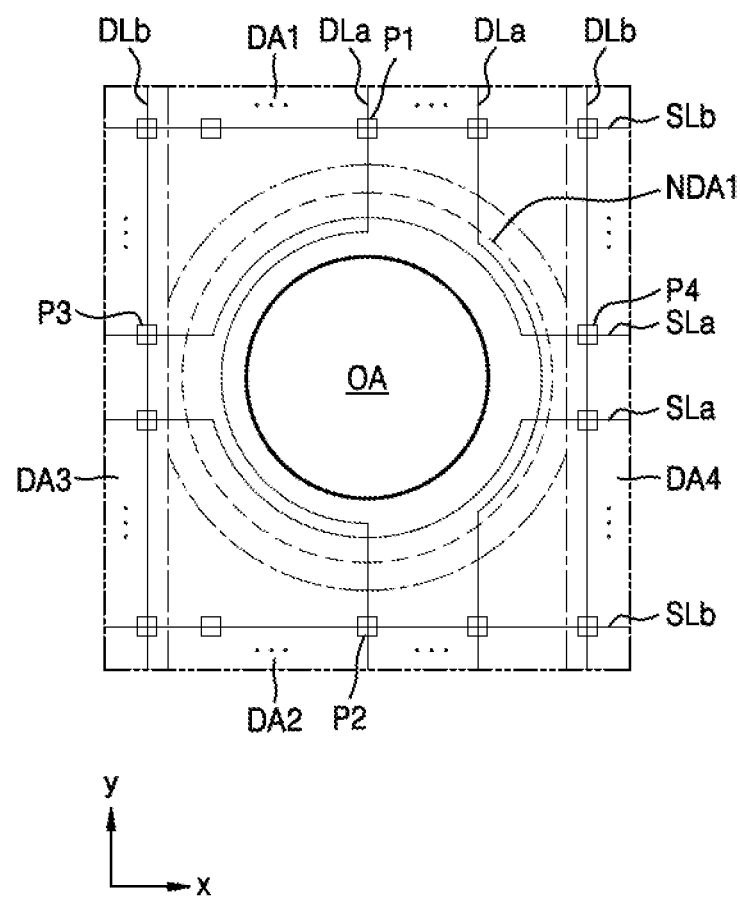
FIG. 9 is a plan view illustrating a portion of the display panel of FIG. 8 with wirings, for example, signal lines, arranged around a first area, according to an exemplary embodiment of the present invention.
Figure 10:
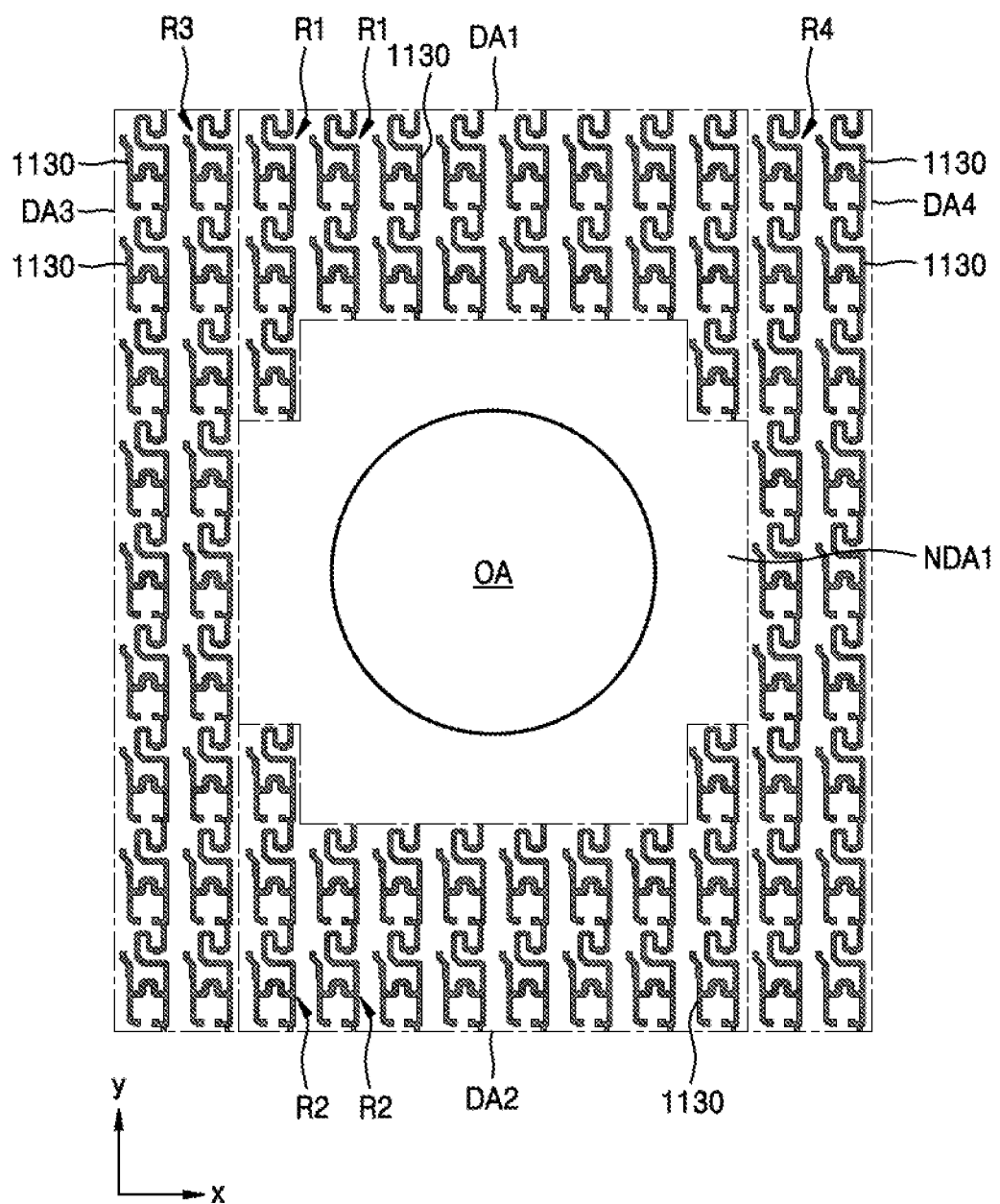
FIG. 10 is a plan view illustrating a portion of the display panel of FIG. 8 with semiconductor layers included in each of pixels arranged around the first area according to an exemplary embodiment of the present invention.

FIG. 8 is a plan view of a display panel 10A according to an embodiment. FIG. 9 is a plan view illustrating a portion of the display panel 10A of FIG. 8 in which wirings, for example, signal lines, may be arranged around a first area. FIG. 10 is a plan view illustrating a portion of the display panel 10A of FIG. 8 in which semiconductor layers included in each of pixels are arranged around the first area.

Referring to FIG. 8, the display panel 10A includes a first area OA, a display area DA surrounding the first area OA, a first non-display area NDA1 surrounding the first area OA, and a second non-display area NDA2 surrounding the display area DA. FIG. 8 may be a substrate 100 included in the display panel 10A. For example, the substrate 100 of the display panel 10A may include the first area OA, the display area DA, the first non-display area NDA1, and the second non-display area NDA2.

The display area DA is where a plurality of pixels are arranged, and is divided into a first display area DA1 and a second display area DA2 that are spaced apart from each other in a y-direction, with the first area OA therebetween and a third display area DA3 and a fourth display area DA4 that are spaced apart from each other in an x-direction via the first display area DA1 and the second display area DA2. The first display area DA1 and the second display area DA2 may be display areas arranged in parallel to an extension direction of data lines.

The plurality of pixels may include first pixels P1 arranged in the first display area DA1, second pixels P2 arranged in the second display area DA2, third pixels P3 arranged in the third display area DA3, and fourth pixels P4 arranged in the fourth display area DA4. The first pixels P1, the second pixels P2, the third pixels P3, and the fourth pixels P4 may each include a pixel circuit described above with reference to FIGS. 5A and 5B.

Referring to FIG. 9, pixels are arranged in the display area DA around the first area OA, and the first non-display area NDA1 is disposed between the first area OA and the display area DA.

The pixels P may be spaced apart from each other with respect to the first area OA. The pixels P may be respectively arranged apart from each other above and below the first area OA or on the left and right of the first area OA. In the display area DA, data lines passing through the display area DA may extend in a second direction (y-direction), and scan lines extend in a first direction (x-direction). Signals lines via which a signal is supplied to the pixels P and which are adjacent to the first area OA may detour around the first area OA located in the display area DA.

Data lines DLa passing through the first display area DA1 and the second display area DA2 extend in the y-direction to provide a data signal to the first pixels P1 arranged in the first display area DA1 and the second pixels P2 arranged in the second display area DA2, with the first area OA therebetween, and detour along edges of the first area OA in the first non-display area NDA1. Data lines that do not pass through the first non-display area NDA1, that is, data lines DLb extending in the y-direction in the third display area DA3 and the fourth display area DA4, may substantially extend straight.

Some scan lines SLa passing through the third display area DA3 and the fourth display area DA4 extend in the x-direction to provide a scan signal to the third pixels P3 arranged in the third display area DA3 and the fourth pixels P4 arranged in the fourth display area DA4, with the first area OA therebetween, and may detour along edges of the first area OA in the first non-display area NDA1. Scan lines SLb that do not pass through the first non-display area NDA1, that is, scan lines SLb extending in the x-direction from the third display area DA3 via the first display area DA1 or the second display area DA2 to the fourth display area DA4, may substantially extend straight.

Referring to FIG. 10, each of the first pixels P1 of the first display area DA1 may include a semiconductor layer 1130, and the semiconductor layers 1130 of the first pixels P1 may be connected to each other in the second direction (y-direction) to form a plurality of first rows R1. That is, each of the first rows R1 includes the plurality of semiconductor layers 1130 connected in the y-direction.

Similarly, each of the second pixels P2 of the second display area DA2 may include a semiconductor layer 1130, and the semiconductor layers 1130 of the second pixels P2 may be connected to each other in the second direction (y-direction) to form a plurality of second rows R2. That is, each of the second rows R2 includes the plurality of semiconductor layers 1130 connected in the y-direction.

The third pixels P3 and the fourth pixels P4 respectively arranged in the third display area DA3 and the fourth display area DA4 also each include a semiconductor layer 1130. The semiconductor layers 1130 of the third pixels P3 may be connected to each other in the second direction (y-direction) to form a plurality of third rows R3, and the semiconductor layers 1130 of the fourth pixels P4 may also be connected to each other in the second direction (y-direction) to form a plurality of fourth rows R4. That is, each of the third rows R3 and each of the fourth rows R4 include the plurality of semiconductor layers 1130 connected in the y-direction.

The first rows R1 of the semiconductor layers 1130 located in the first display area DA1 and the second rows R2 of the semiconductor layers 1130 located in the second display area DA2 may be spaced apart from each other with the first area OA therebetween. Accordingly, a length of each of the first rows R1 and each of the second rows R2 may be less than that of each of the third rows R3 or each of the fourth rows R4.

According to the difference in the above-described structure, there is deviation in load among portions of the display area DA, and the load deviation may cause partially non-uniform luminance of the display area DA. Varying luminance may be conspicuous in a portion where data lines detouring in the first non-display area NDA1 are arranged and/or a portion where rows of relatively short-length semiconductor layers are arranged (for example, the first display area DA1 and the second display area DA2 of FIG. 8). For example, luminance of the first display area DA1 and the second display area DA2 may be higher or lower than that of the third display area DA3 and the fourth display area DA4 if the pixels in the first display area DA1 and the second display area DA2 are driven without adjustment of a driving transistor, for example, according to the load deviation.

The brightness (luminance) of the pixel P may be proportional to a driving current Ioled flowing through the organic light-emitting diode OLED as expressed in Formula 1 below, and the driving current Ioled is dependent on a ratio of a channel width W of the first transistor T1 to a channel length L thereof (hereinafter, 'channel ratio').

$$Ioled = \frac{1}{2} \cdot \mu \cdot C_{ox} \cdot \frac{W}{L}(Vgs\text{-}Vth)^2 = \frac{1}{2} \cdot \mu \cdot C_{ox} \cdot \frac{W}{L}(Vdd\text{-}Vdata\text{-}Vth)^2 \quad (1)$$

In Formula 1, 'μ' denotes mobility of the first transistor T1, 'Cox' refers to parasitic capacitance of the first transistor T1, 'W' denotes a channel width of the first transistor T1, 'L' denotes a channel length of the first transistor T1, 'Vgs' denotes a difference between a voltage of a gate and a voltage of a source of the first transistor T1, 'Vth' denotes a threshold voltage of the first transistor T1, 'Vdd' denotes a first power voltage ELVDD, and 'Vdata' denotes a data voltage.

As expressed in Formula 1, the luminance of the pixel P may be controlled by adjusting a ratio of the channel width W to the channel length L of the first transistor T1.

Figure 11:
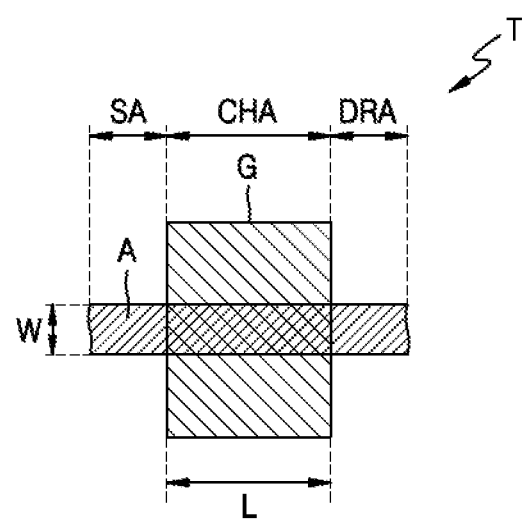
FIG. 11 is a view for describing a channel width W and a channel length L of a transistor according to an exemplary embodiment of the present invention.

FIG. 11 is a view for describing a channel width W and a channel length L of a transistor.

Referring to FIG. 11, a transistor T includes a semiconductor layer A and a gate electrode G. The semiconductor layer A includes a source area SA, a drain area DRA, and a channel area CHA between the source area SA and the drain area DRA. An insulating layer may be arranged between the semiconductor layer A and the gate electrode G. The channel length L and the channel width W is defined by the channel area CHA which is an area where the semiconductor layer A and the gate electrode G overlap each other. A size of the transistor T1 may be determined by the channel width W and the channel length L. The greater the channel width W or the channel length L, the greater may be the size of the transistor T1.

In the display panel 10A according to the embodiment, a channel ratio of a driving transistor of pixels arranged in the first display area DA1 and the second display area DA2, which are display areas around the first area OA, may be different from a channel ratio of a driving transistor of pixels arranged in display areas other than the first display area DA1 and the second display area DA2. That is, a channel ratio of the first transistor T1, which is a driving transistor of the first pixels P1 arranged in the first display area DA1 and the second pixels P2 arranged in the second display area DA2, may be different from a channel ratio of the first transistor T1 of the third pixels P3 arranged in the third display area DA3 and the first transistor T1 of the fourth pixels P4 arranged in the fourth display area DA4. Accordingly, varying luminance due to a load deviation occurring due to the structure of the first display area DA1 and the second display area DA2 may be prevented or minimized.

Figure 12A:
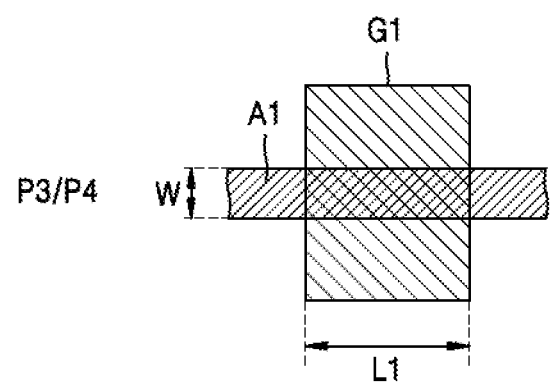
FIGS. 12A through 12C illustrate an example of size adjustment of a driving transistor for correction of luminance of each position in a display panel according to an exemplary embodiment of the present invention.
Figure 12A:
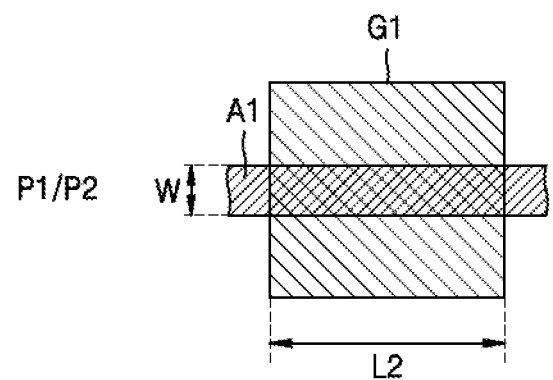
Figure 12A:
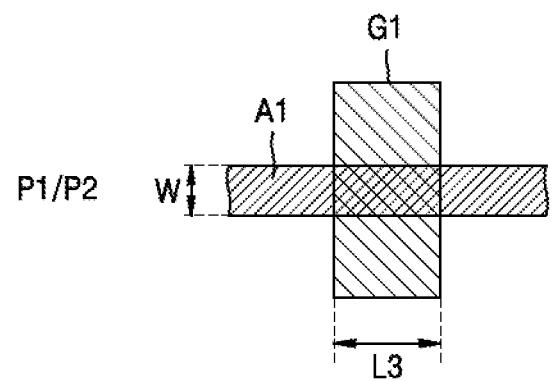
Figure 12B:
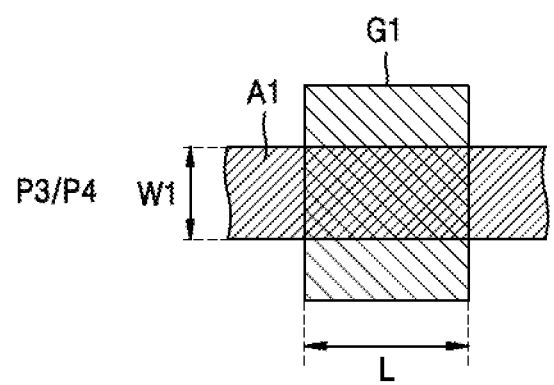
Figure 12B:
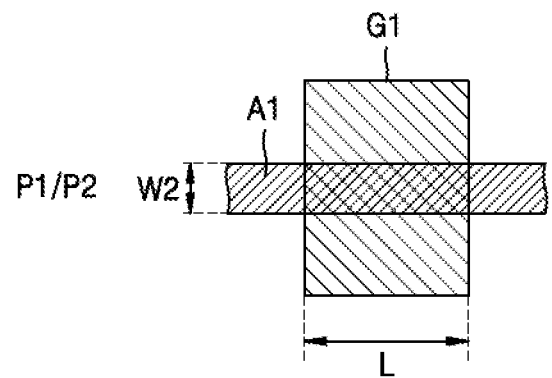
Figure 12B:
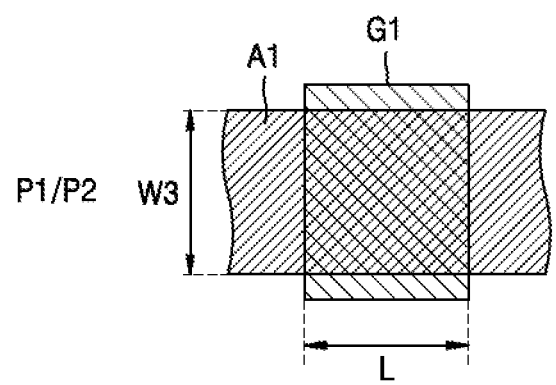
Figure 12C:
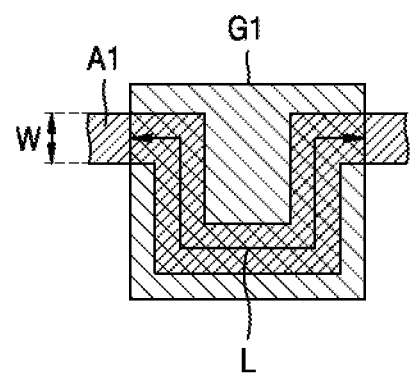

FIGS. 12A through 12C illustrate an example of size adjustment of a driving transistor for luminance correction of each position in a display panel according to an embodiment.

According to an embodiment, the luminance of the first display area DA1 and the second display area DA2, which is increased or decreased compared to that of the third display area DA3 and the fourth display area DA4, is reduced or increased by adjusting a channel ratio of a transistor to thereby approximate the luminance of the first display area DA1 and the second display area DA2 to that of the third display area DA3 and the fourth display area DA4 and prevent or minimize varying luminance.

In the embodiment illustrated in FIG. 12A, a channel length L is adjusted to adjust a channel ratio of the first transistor T1. The channel length L may be adjusted by increasing or reducing an overlapping area between the semiconductor layer Al and the gate electrode G1 by adjusting a length of the gate electrode G1. The channel length L may be elongated as a channel area of the semiconductor layer Al has a bend as illustrated in FIG. 12C. The semiconductor layer Al may have various shapes including a curved or bent shape, for example, '⊏', '⊒', 'S', 'M', or 'W'.

When the first transistor T1 of the third pixels P3 of the third display area DA3 and the fourth pixels P4 of the fourth display area DA4 has a channel ratio W/L1, the first transistor T1 of the first pixels P1 of the first display area DA1 and the second pixels P2 of the second display area DA2 may be designed to have a channel ratio W/L2 (W/L2<W/L1) or a channel ratio W/L3 (W/L3>W/L1). That is, when the luminance of the first display area DA1 and the second display area DA2 is higher or lower than that of the third display area DA3 and the fourth display area DA4, a channel length of the first transistor T1 of the first pixels P1 of the first display area DA1 and the second pixels P2 of the second display area DA2 may be increased or reduced to reduce or increase the channel ratio of the first transistor T1. Accordingly, by reducing or increasing the luminance of the first display area DA1 and the second display area DA2, a luminance difference with respect to that of the third display area DA3 and the fourth display area DA4 may be minimized.

In the embodiment illustrated in FIG. 12B, a channel width W is adjusted to adjust a channel ratio of the first transistor T1. When the first transistor T1 of the third pixels P3 of the third display area DA3 and the fourth pixels P4 of the fourth display area DA4 has a channel ratio W1/L, the first transistor T1 of the first pixels P1 of the first display area DA1 and the second pixels P2 of the second display area DA2 may be designed to have a channel ratio W2/L (W2/L<W1/L) or a channel ratio W3/L (W3/L>W1/L). That is, when the luminance of the first display area DA1 and the second display area DA2 is higher or lower than that of the third display area DA3 and the fourth display area DA4, a channel width of the first transistor T1 of the first pixels P1 of the first display area DA1 and the second pixels P2 of the second display area DA2 may be reduced or increased to reduce or increase the channel ratio of the first transistor T1. Accordingly, by reducing or increasing the luminance of the first display area DA1 and the second display area DA2, a luminance difference with respect to that of the third display area DA3 and the fourth display area DA4 may be minimized.

In addition, there may be deviation in luminance also between the first display area DA1 and the second display area DA2 due to a difference in a length of signal lines and/or length of rows of semiconductor layers. For example, when the luminance of the first display area DA1 is lower or higher than the luminance of the second display area DA2, a channel ratio of the first transistor T1 of the second display area DA2 may be reduced or increased from a channel ratio of the first transistor T1 of the first display area DA1. Accordingly, the luminance of the second display area DA2 may be approximated to the luminance of the first display area DA1. According to another embodiment, the luminance of the first display area DA1 may be approximated to that of the second display area DA2 by adjusting a channel ratio of the first transistor T1 of each of the first pixels P1 of the first display area DA1.

In the above embodiments, a channel length or a channel width of a transistor is adjusted to adjust a channel ratio and thus to adjust luminance. The present invention is not limited thereto. For example, a channel ratio may also be adjusted by adjusting both a channel length and a channel width.

In addition, a channel ratio of the first transistor T1 of the first display area DA1 may be adjusted such that the channel ratio gradually increases or decreases away from the first area OA by considering a distance from a signal source within the first display area DA1. Also, a channel ratio of the first transistor T1 of the second display area DA2 may be adjusted such that the channel ratio gradually increases or decreases away from the first area OA. Such gradual adjustment of the channel ration may be made by considering a distance from a signal source within the second display area DA2.

Figure 13:
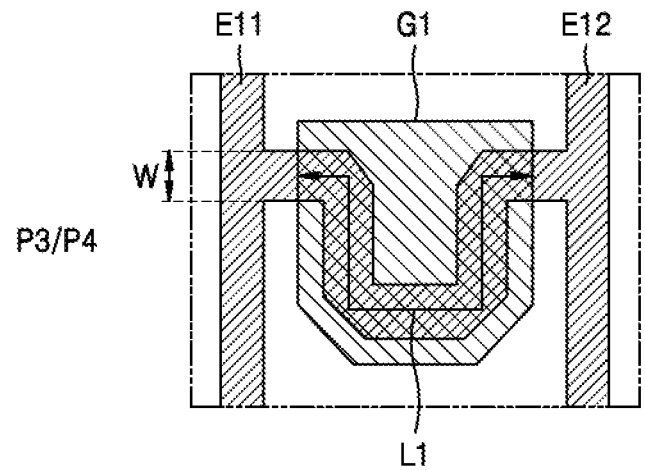
FIG. 13 illustrates an example of adjustment of a channel ratio of a first transistor of the pixel illustrated in FIG. 6A according to an exemplary embodiment of the present invention.
Figure 13:
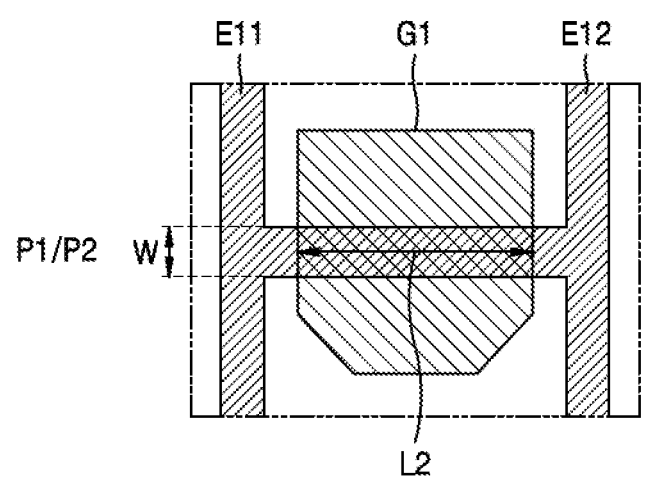
Figure 13:
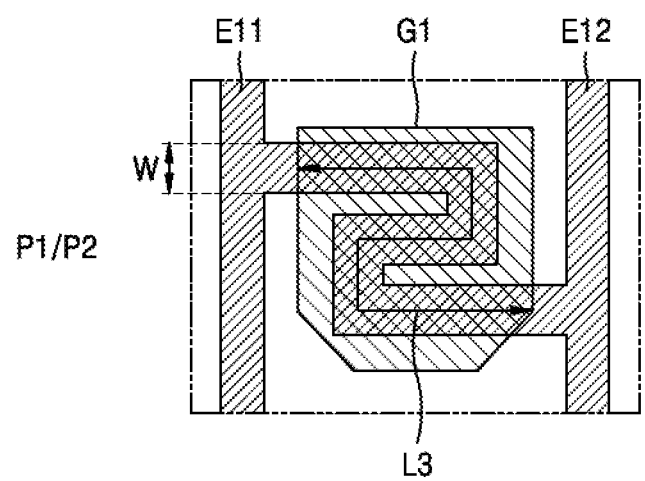

FIG. 13 illustrates an example of adjustment of a channel ratio of a first transistor of the pixel illustrated in FIG. 6A. In the embodiment of FIG. 13, a channel length is increased by bending a semiconductor layer without changing a size of the gate electrode G1 or a channel width.

Referring to FIG. 13, the first transistor T1 of each of the third pixels P3 of the third display area DA3 and the fourth pixels P4 of the fourth display area DA4 may have a channel ratio W/L1, and the first transistor T1 of each of the first pixels P1 of the first display area DA1 and the second pixels P2 of the second display area DA2 may have a channel ratio W/L2 (W/L2>W/L1) or a channel ratio W/L3 (W/L3<W/L1).

Figure 14A:
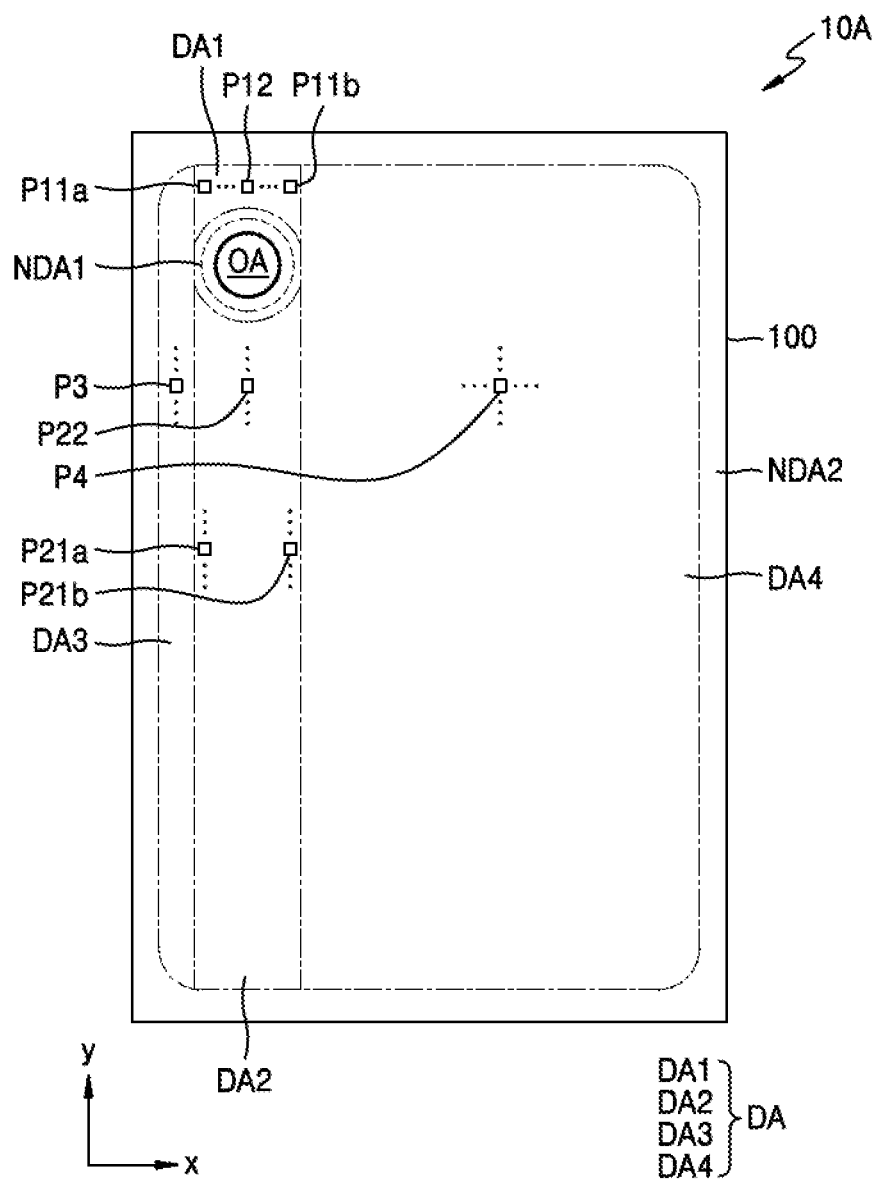
FIG. 14A is a schematic plan view of a display panel according to an exemplary embodiment of the present invention.
Figure 14B:
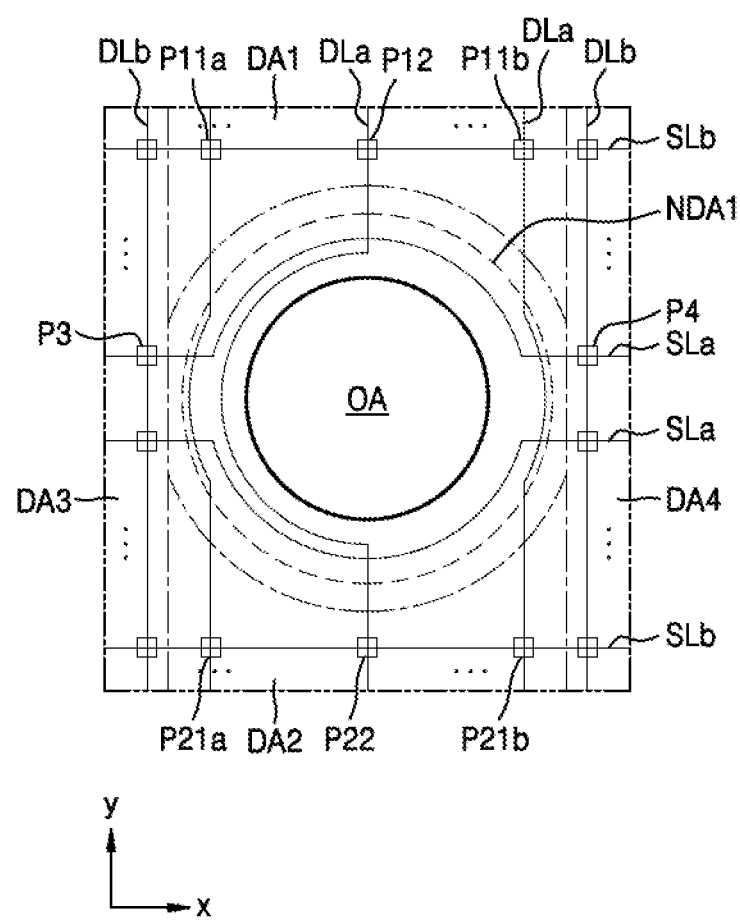
FIG. 14B is a plan view illustrating a portion of the display panel of FIG. 14A with wirings, for example, signal lines, arranged around a first area, according to an exemplary embodiment of the present invention.

FIG. 14A is a schematic plan view of a display panel 10A according to an embodiment. FIG. 14B is a plan view illustrating a portion of the display panel 10A of FIG. 14A, showing wirings, for example, signal lines, arranged around a first area.

The embodiment of FIGS. 14A and 14B differs from the embodiment of FIG. 8, in which luminance is adjusted by adjusting a channel ratio of the first transistors T1 of all of the first pixels P1 of the first display area DA1 and the second pixels P2 of the second display area DA2, in that here luminance is adjusted by adjusting a channel ratio of the first transistors T1 of some of the first pixels P1 of the first display area DA1 and some of the second pixels P2 of the second display area DA2.

Referring to FIGS. 14A and 14B, the first pixels P1 arranged in the first display area DA1 include 1-1 pixels P11a and P11b located along left and right boundary lines of the first display area DA1 and 1-2 pixels P12. Likewise, the second pixels P2 arranged in the second display area DA2 may include 2-1 pixels P21a and P21b located along left and right boundary lines of the second display area DA2 and 2-2 pixels P22.

A channel ratio of the first transistor T1 of each of the 1-1 pixels P11a and P11b of the first display area DA1 and the 2-1 pixels P21a and P21b of the second display area DA2 may be changed such that the display area DA may have substantially uniform luminance irrespective of pixel locations. A channel ratio of the first transistor T1 of each of the 1-1 pixels P11a and P11b of the first display area DA1 and the 2-1 pixels P21a and P21b of the second display area DA2 may be changed, and a channel ratio of the first transistor T1 of each of the 1-2 pixels P12 and the 2-2 pixels P22 may be designed to be equal to a channel ratio of the first transistor T1 of each of the third pixels P3 of the third display area DA3 and the fourth pixels P4 of the fourth display are DA4. That is, by adjusting only a channel ratio of the first transistor T1 of each of the 1-1 pixels P11a and P11b of the first display area DA1 and each of the 2-1 pixels P21a and P21b of the second display area DA2, the luminance of the first display area DA1 and the second display area DA2 may be adjusted. The channel ratio of the first transistors T1 of the 1-1 pixels P11a and P11b may be equal to or different from that of the first transistors T1 of the 2-1 pixels P21a and P21b.

Figure 15:
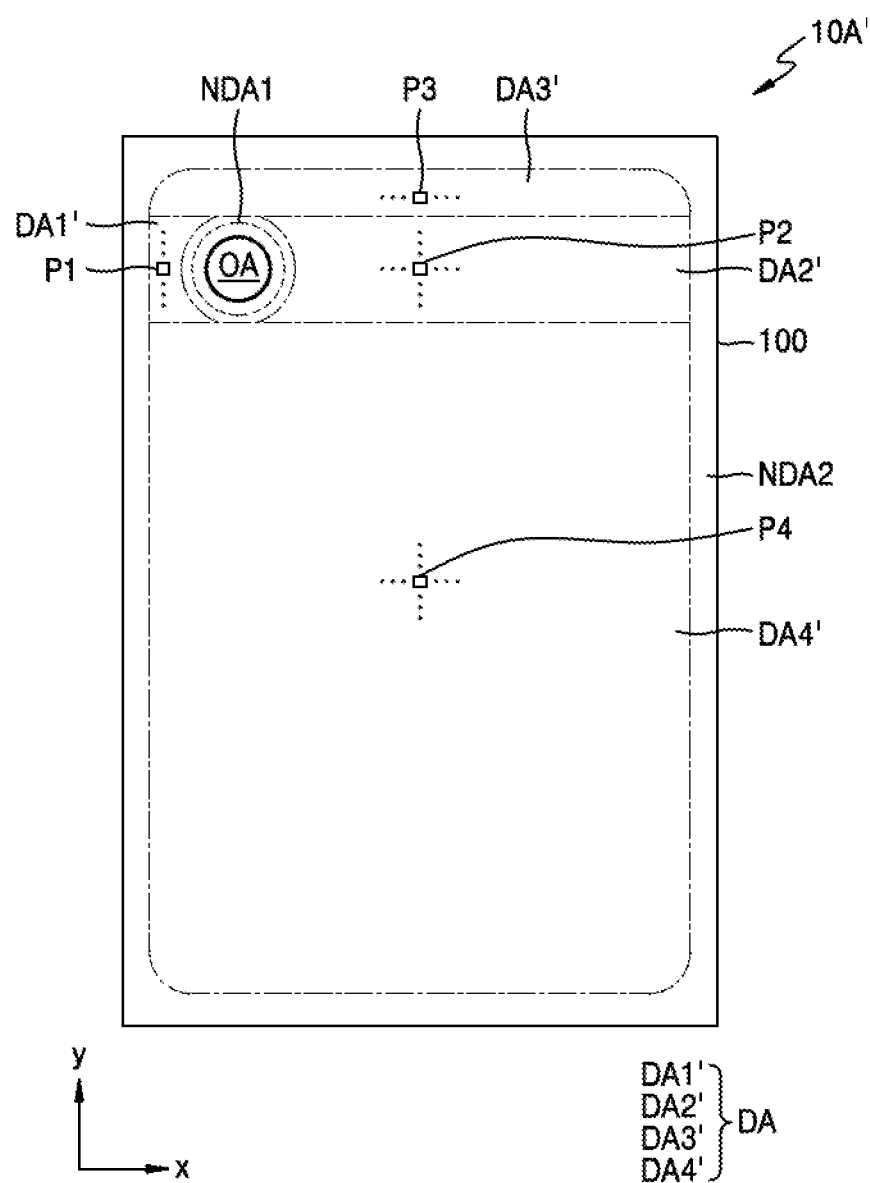
FIG. 15 is a schematic plan view of a display panel according to according to an exemplary embodiment of the present invention.
Figure 16:
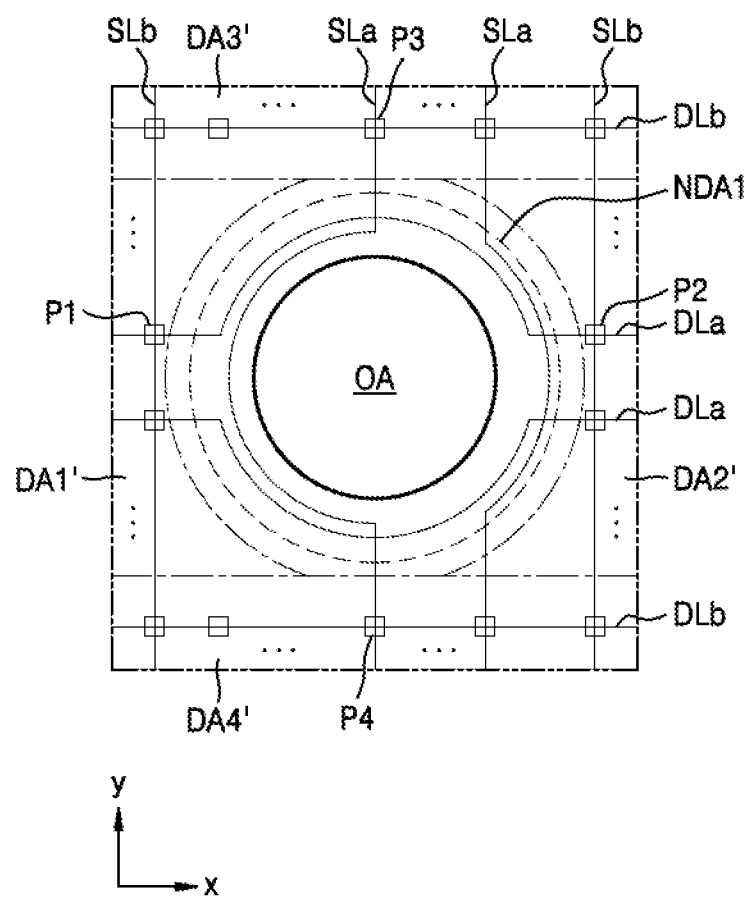
FIG. 16 is a plan view illustrating a portion of the display panel of FIG. 15 with wirings, for example, signal lines, arranged around a first area, according to an exemplary embodiment of the present invention.
Figure 17:
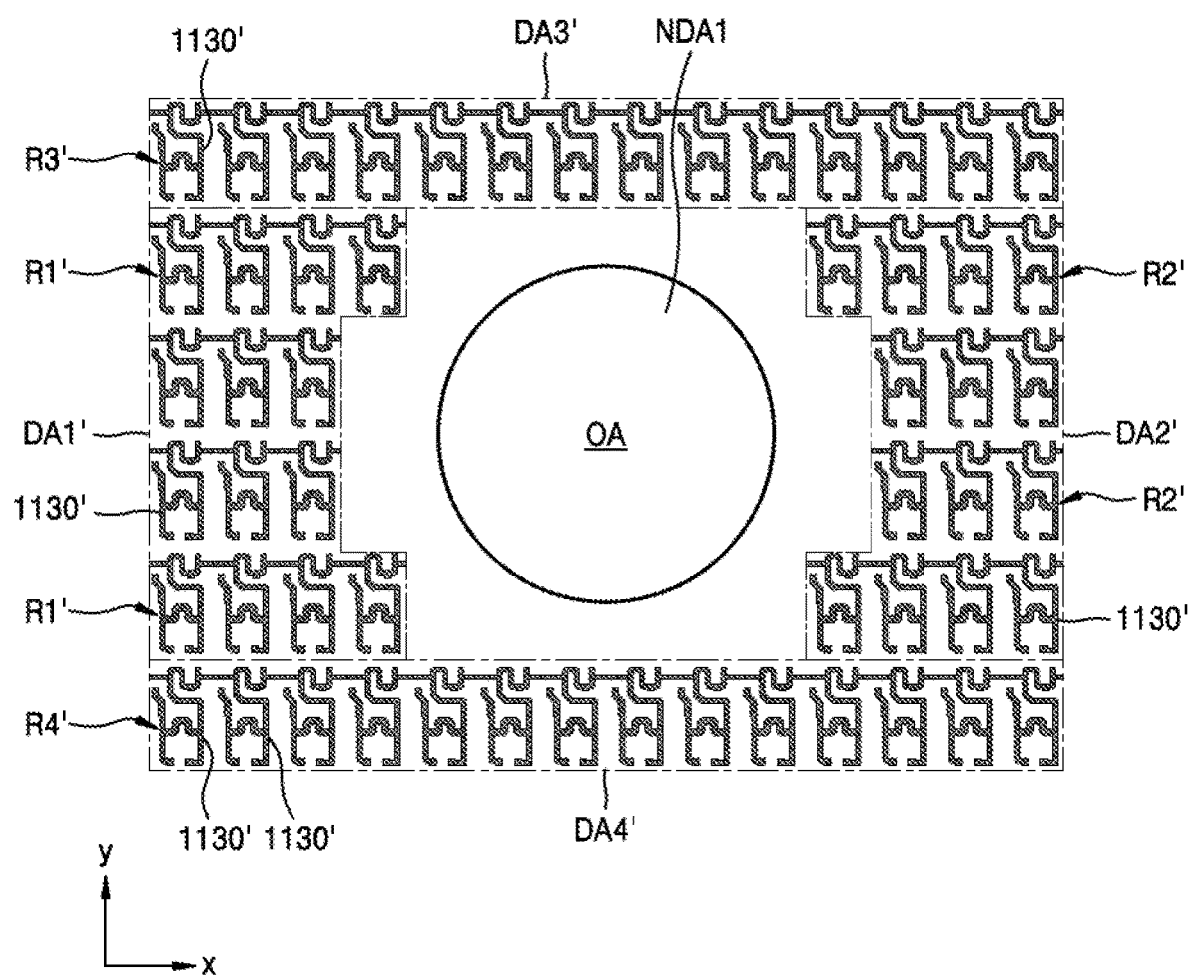
FIG. 17 is a plan view illustrating a portion of the display panel of FIG. 15 with semiconductor layers included in each of pixels arranged around the first area according to an exemplary embodiment of the present invention.

FIG. 15 is a schematic plan view of a display panel 10A' according to an embodiment. FIG. 16 is a plan view illustrating a portion of the display panel 10A' of FIG. 15 showing wirings, for example, signal lines, arranged around a first area. FIG. 17 is a plan view illustrating a portion of the display panel 10A' of FIG. 15, showing semiconductor layers included in each of pixels arranged around the first area.

According to the embodiments described with reference to FIGS. 8 through 14, data lines are illustrated as extending in a y-direction, but the embodiments are not limited thereto. As illustrated in FIGS. 15 and 16, data lines may extend in an x-direction, and scan lines may extend in a y-direction.

Referring to FIG. 15, the display panel 10A' includes a first area OA, a display area DA surrounding the first area OA, a first non-display area NDA1 surrounding the first area OA, and a second non-display area NDA2 surrounding the display area DA. The display panel 10A' include a substrate 100. For example, the substrate 100 of the display panel 10A' includes the first area OA, the display area DA, the first non-display area NDA1, and the second non-display area NDA2.

The display area DA includes a plurality of pixels, and is divided into a first display area DA1' and a second display area DA2' that are spaced apart from each other in the x-direction, with the first area OA therebetween and a third display area DA3' and a fourth display area DA4' that are spaced apart from each other in the y-direction via the first display area DA1' and the second display area DA2'. The first display area DA1' and the second display area DA2' may be display areas arranged in parallel to an extension direction of data lines.

The pixels are arranged in the display area DA. The pixels include first pixels P1 arranged in the first display area DA1', second pixels P2 arranged in the second display area DA2', third pixels P3 arranged in the third display area DA3', and fourth pixels P4 arranged in the fourth display area DA4'. The first pixels P1, the second pixels P2, the third pixels P3, and the fourth pixels P4 may each include a pixel circuit described above with reference to FIG. 5A or 5B.

Referring to FIG. 16, data lines DLa passing through the first display area DA1' and the second display area DA2' extend in the x-direction to provide a data signal to the first pixels P1 arranged in the first display area DA1' and the second pixels P2 arranged in the second display area DA2', with the first area OA therebetween, and detour along edges of the first area OA in the first non-display area NDA1. Data lines that do not pass through the first non-display area NDA1, that is, data lines DLb extending in the x-direction in the third display area DA3' and the fourth display area DA4' extend substantially straight.

Some scan lines SLa passing through the third display area DA3' and the fourth display area DA4' extend in the y-direction to provide a scan signal to the third pixels P3 arranged in the third display area DA3' and the fourth pixels P4 arranged in the fourth display area DA4', with the first area OA therebetween, and detour along edges of the first area OA in the first non-display area NDA1. Scan lines that do not pass through the first non-display area NDA1, that is, scan lines SLb extending in the y-direction from the third display area DA3' via the first display area DA1' or via the second display area DA2' to the fourth display area DA4' extend substantially straight.

Referring to FIG. 17, each of the first pixels P1 corresponding to the first display area DA1' may include a semiconductor layer 1130', and the semiconductor layers 1130' of the first pixels P1 may be connected to each other in the x-direction to form a plurality of first rows Rt. That is, each of the first rows R1' includes the plurality of semiconductor layers 1130' connected in the x-direction. Likewise, the second pixels P2, the third pixels P3, and the fourth pixels P4 may each include a semiconductor layer 1130', and the semiconductor layers 1130' may also be connected to each other in the x-direction and form second rows R2', third rows R3', and fourth rows R4'.

While the third rows R3' and the fourth rows R4' extend continuously in the x-direction to cross the display area DA, the first rows R1' and the second rows R2' are spaced apart from each other with the first area OA therebetween, and thus, a length of each of the first rows R1' and each of the second rows R2' may be less than that of each of the third rows R3' and each of the fourth rows R4'.

The luminance of a portion where a data line detouring in the first non-display area NDA1 is arranged and/or a portion where rows of short semiconductor layers are arranged (for example, luminance of the first display area DA1' and the second display area DA2') may be higher or lower than that of the third display area DA3' and the fourth display area DA4'.

In the display panel 10A' according to the embodiment, a channel ratio of a driving transistor of pixels arranged in the first display area DA1' and the second display area DA2', which are display areas around the first area OA, may be different from a channel ratio of a driving transistor of pixels arranged in display areas other than the first display area DA1' and the second display area DA2'. That is, a channel ratio of the first transistor T1 of each of the first pixels P1 of the first display area DA1' and each of the second pixels P2 of the second display area DA2' may be different from a channel ratio of the first transistor T1 of each of the third pixels P3 of the third display area DA3' and the first transistor T1 of each of the fourth pixels P4 of the fourth display area DA4'. Accordingly, varying luminance due to a load deviation occurring due to the structure of the first display area DA1' and the second display area DA2' may be prevented or minimized. A channel ratio of the first transistor T1 of each of the first pixels P1 of the first display area DA1' may be equal to or different from a channel ratio of the first transistor T1 of each of the second pixels P2 of the second display area DA2'.

A channel ratio of the first transistor T1 of each of the first pixels P1 of the first display area DA1' and/or each of the second pixels P2 of the second display area DA2' may gradually increase or decrease away from the first area OA.

A channel ratio of the first transistor T1 of each of the first pixels P1 of the first display area DA1' and each of the second pixels P2 of the second display area DA2' may be adjusted by adjusting a channel length and/or a channel width of a first transistor as described above with reference to FIGS. 12A through 12C and 13.

Figure 18A:
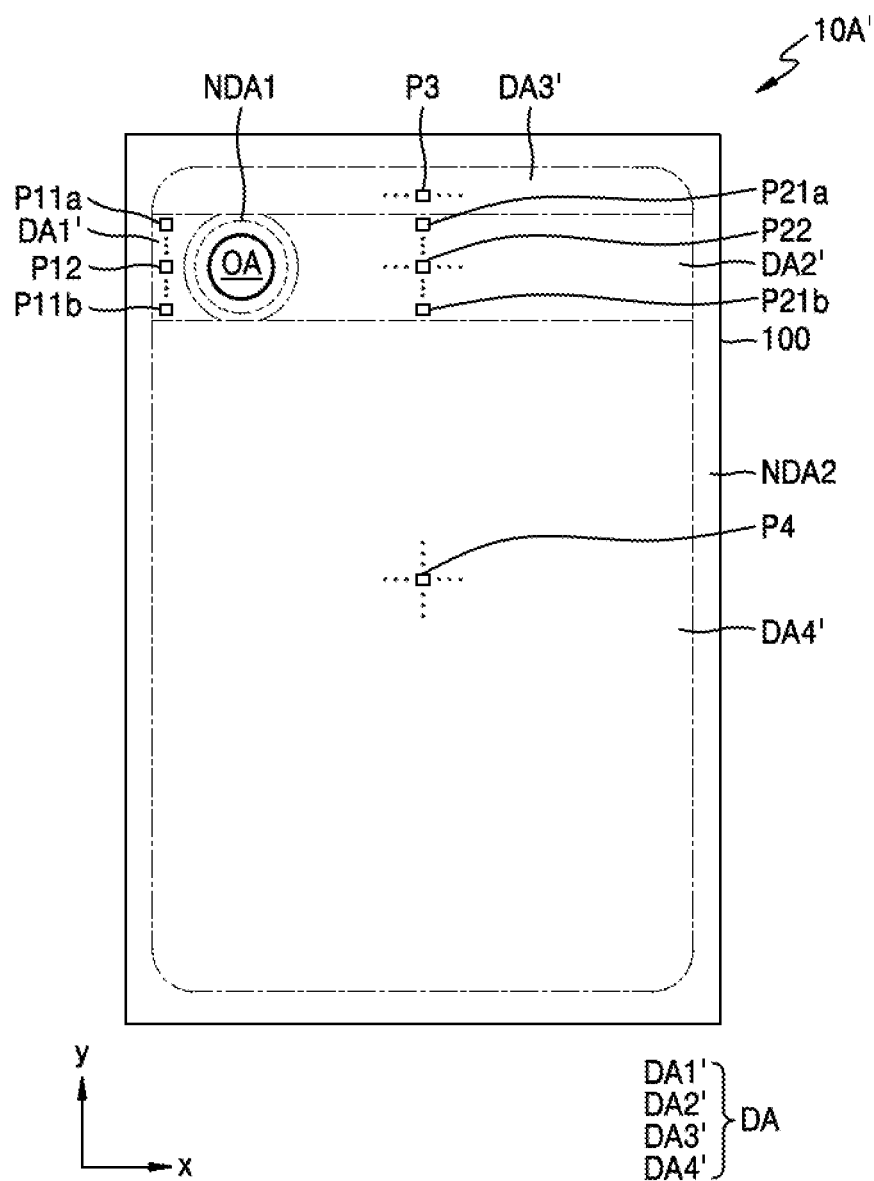
FIG. 18A is a schematic plan view of a display panel according to according to an exemplary embodiment of the present invention.
Figure 18B:
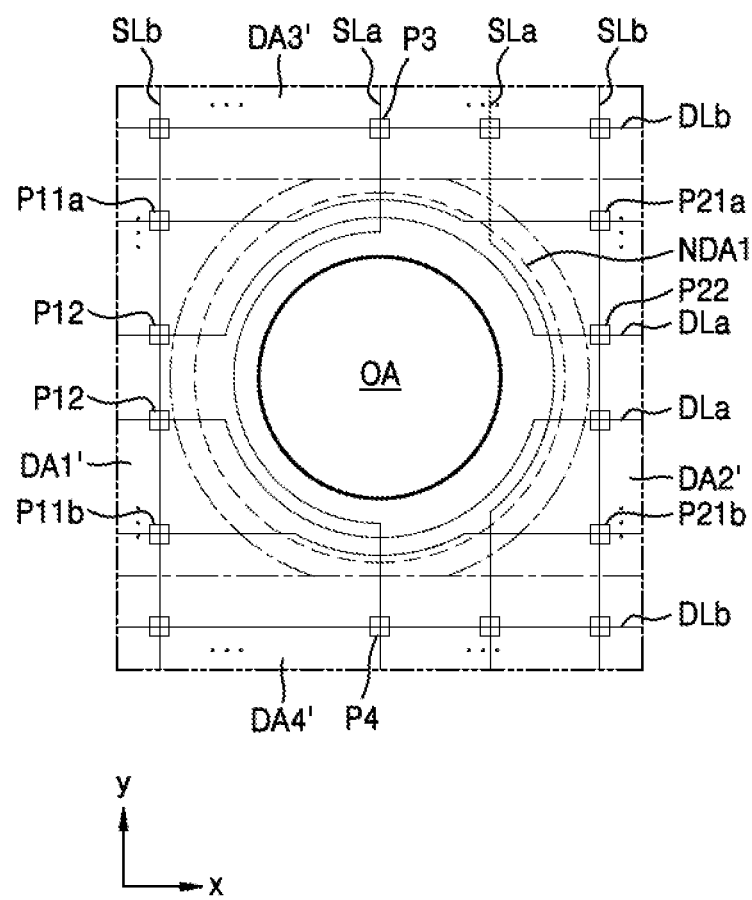
FIG. 18B is a plan view illustrating a portion of the display panel of FIG. 18A with wirings, for example, signal lines, arranged around a first area, according to an exemplary embodiment of the present invention.

FIG. 18A is a schematic plan view of a display panel 10A' according to an embodiment. FIG. 18B is a plan view illustrating a portion of the display panel 10A' of FIG. 18A, showing wirings, for example, signal lines, arranged around a first area.

The embodiment of FIGS. 18A and 18B differs from the embodiment of FIG. 15, in which luminance is adjusted by adjusting a channel ratio of the first transistors T1 of all of the first pixels P1 of the first display area DA1' and the second pixels P2 of the second display area DA2', in that here luminance is adjusted by adjusting a channel ratio of the first transistors T1 of some of the first pixels P1 of the first display area DA1' and some of the second pixels P2 of the second display area DA2'.

Referring to FIGS. 18A and 18B, the first pixels P1 arranged in the first display area DA1' include 1-1 pixels P11a and P11b located along upper and lower boundary lines of the first display area DA1' and 1-2 pixels P12.

Likewise, the second pixels P2 arranged in the second display area DA2' may include 2-1 pixels P21a and P21b located along upper and lower boundary lines of the second display area DA2' and 2-2 pixels P22.

A channel ratio of the first transistor T1 of each of the 1-1 pixels P11a and P11b of the first display area DA1' and each of the 2-1 pixels P21a and P21b of the second display area DA2' may be changed such that the display area DA may have substantially uniform luminance irrespective of pixel locations. A channel ratio of the first transistor T1 of each of the 1-1 pixels P11a and P11b of the first display area DA1' and each of the 2-1 pixels P21a and P21b of the second display area DA2' may be changed, and a channel ratio of the first transistor T1 of each of the 1-2 pixels P12 and the 2-2 pixels P22 may be designed to be equal to a channel ratio of the first transistor T1 of each of the third pixels P3 of the third display area DA3' and each of the fourth pixels P4 of the fourth display area DA4'. That is, by adjusting only a channel ratio of the first transistor T1 of each of the 1-1 pixels P11a and P11b of the first display area DA1' and each of the 2-1 pixels P21a and P21b of the second display area DA2', the luminance of the first display area DA1' and the second display area DA2' may be adjusted. The channel ratio of the first transistors T1 of the 1-1 pixels P11a and P11b may be equal to or different from that of the first transistors T1 of the 2-1 pixels P21a and P21b.

While the first area OA that is approximately circular is illustrated in the above-described embodiments, the present invention is not limited thereto. Two or more first areas may be included, and the shape thereof may be various, for example, a circle, an oval, a polygon, a star shape, a diamond shape, or the like.

Figure 19:
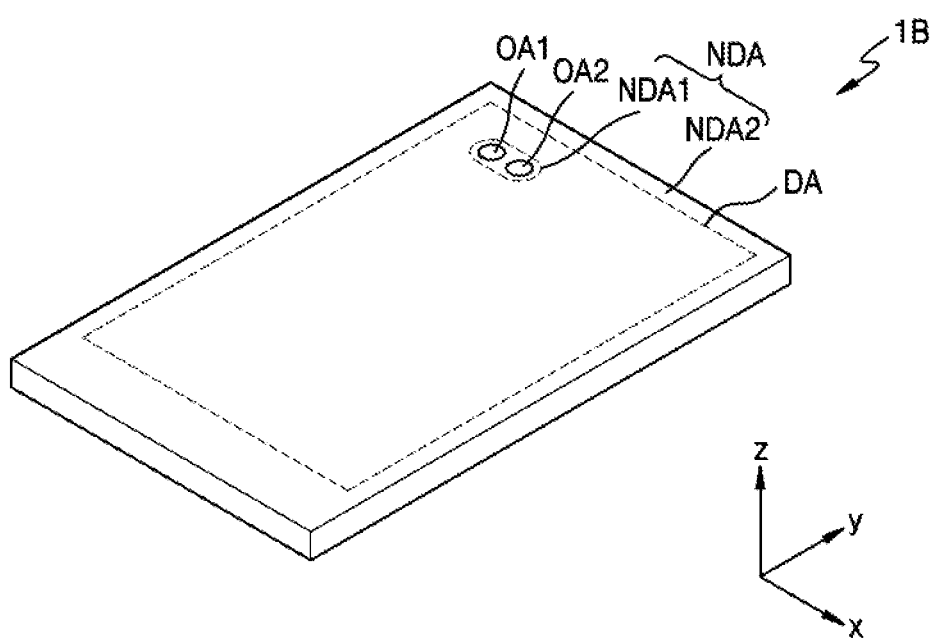
FIG. 19 is a perspective view schematically illustrating a display device according to according to an exemplary embodiment of the present invention.

FIG. 19 is a perspective view schematically illustrating a display device 1B according to an embodiment.

The display device 1B of FIG. 19 includes two first areas, that is, an 1-1 area OA1 and an 1-2 area OA2 and a second area. The second area includes a display area DA surrounding the 1-1 area OA1 and the 1-2 area OA2 and a non-display area NDA. The 1-1 area OA1 and the 1-2 area OA2 are located within the display area DA and completely surrounded by the display area DA. The 1-1 area OA1 and the 1-2 area OA2 may be an area where a component is arranged as illustrated in FIGS. 2A through 4D. The 1-1 area OA1 and the 1-2 area OA2 may an opening area as illustrated in FIG. 2A or a transmission area as illustrated in FIG. 2B. While two opening areas or two transmission areas are illustrated in FIG. 19, the present invention is not limited thereto, and three or more opening areas or transmission areas may also be included. From among the two opening areas or transmission areas, at least one of a size or shape thereof may vary from the other.

The non-display area NDA includes a first non-display area NDA1 surrounding the 1-1 area OA1 and the 1-2 area OA2 and a second non-display area NDA2 surrounding the display area DA. The first non-display area NDA1 and the second non-display area NDA2 may be an area where no image is provided. The first non-display area NDA1 may simultaneously surround the 1-1 area OA1 and the 1-2 area OA2. In the first non-display area NDA1, signal lines providing a signal to pixels provided around the 1-1 area OA1 and the 1-2 area OA2 may be arranged. Dummy pixels that emit no light may be arranged in the first non-display area NDA1. In the second non-display area NDA2, a scan driver providing a scan signal to the pixels and the dummy pixels and a data driver providing a data signal to the pixels and the dummy pixels, or the like, may be included. The first non-display area NDA1 is completely surrounded by the display area DA, and the display area DA is completely surrounded by the second non-display area NDA2.

Figure 20:
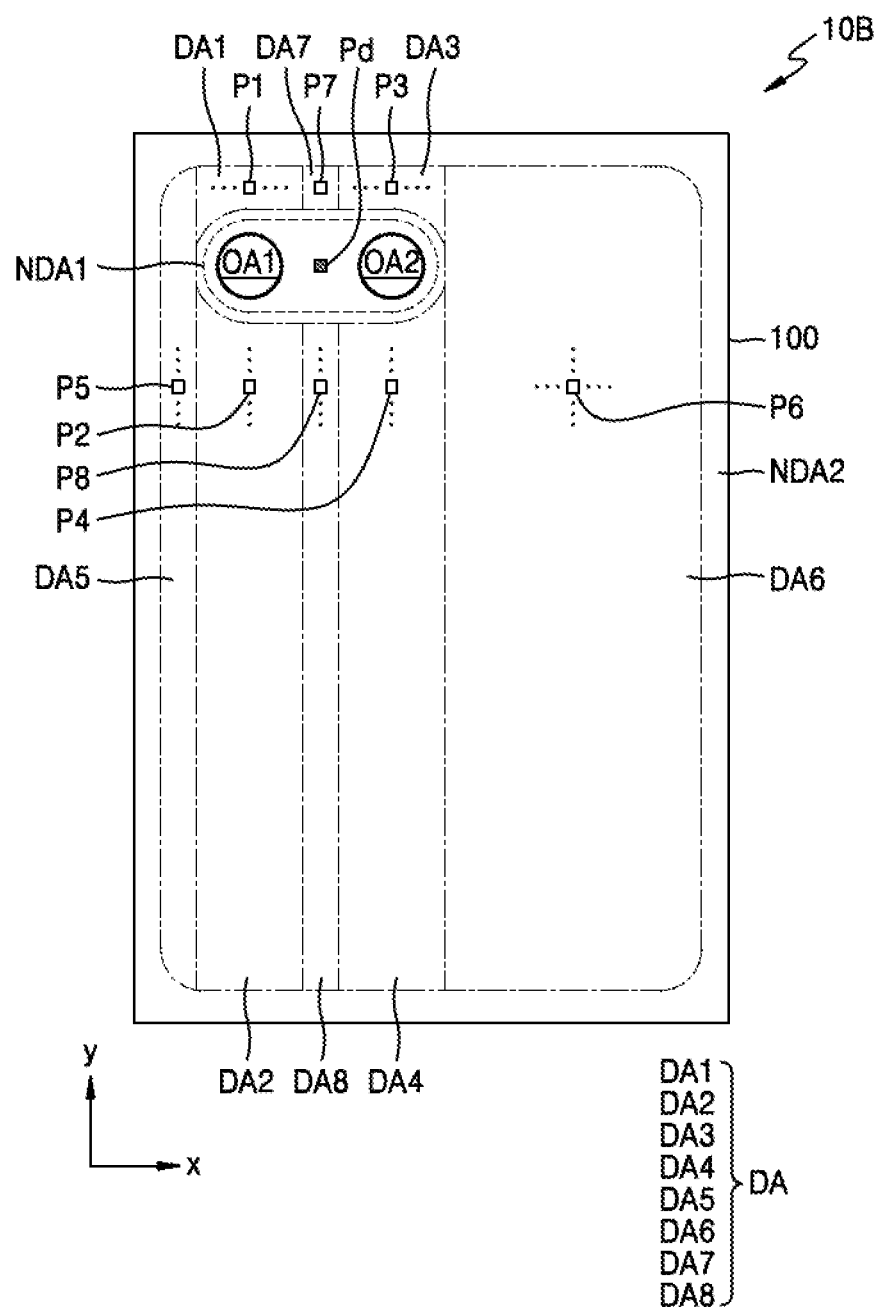
FIG. 20 is a schematic plan view of a display panel according to according to an exemplary embodiment of the present invention.
Figure 21:
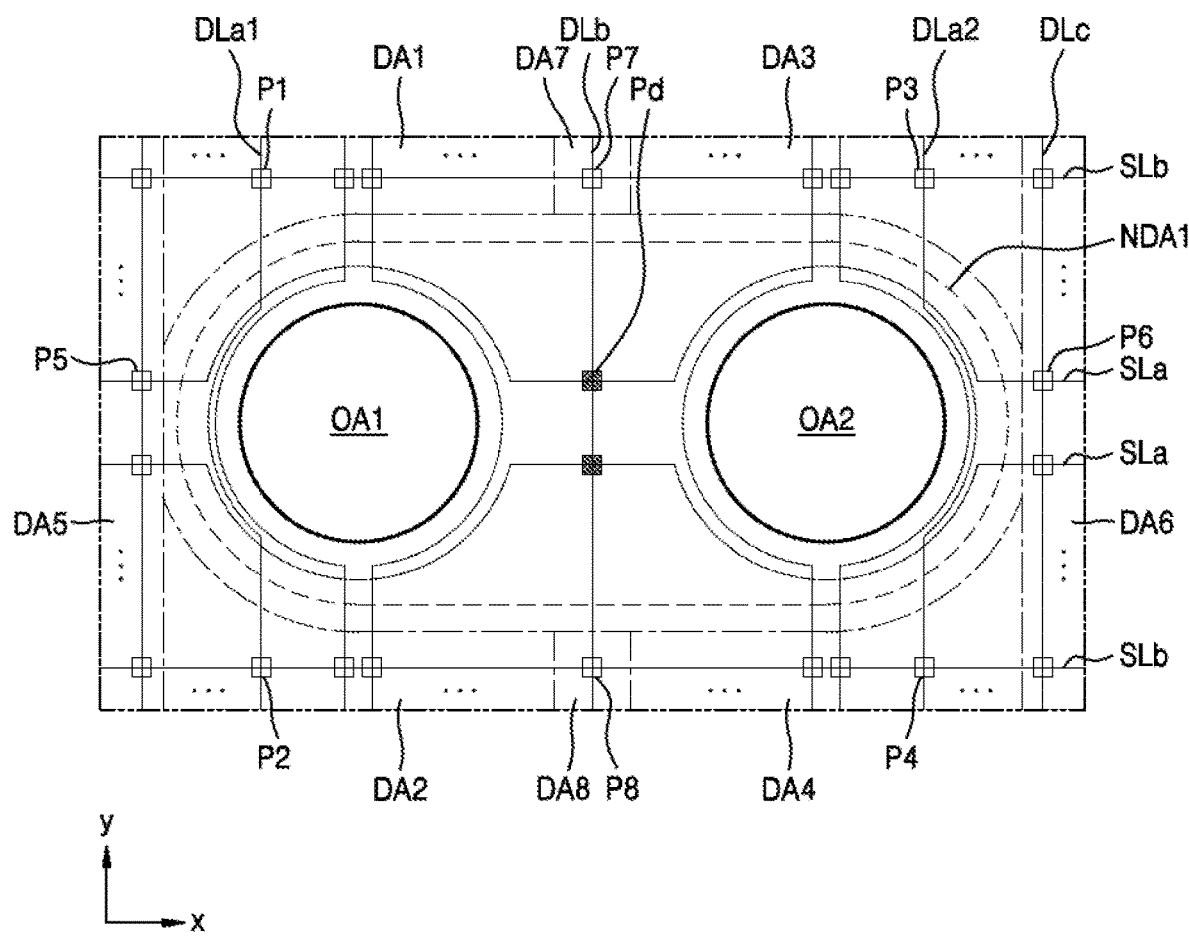
FIGS. 21 and 22 are plan views illustrating a portion of the display panel of FIG. 20 with wirings, for example, signal lines, arranged around a 1-1 area and a 1-2 area, according to an exemplary embodiment of the present invention.
Figure 22:
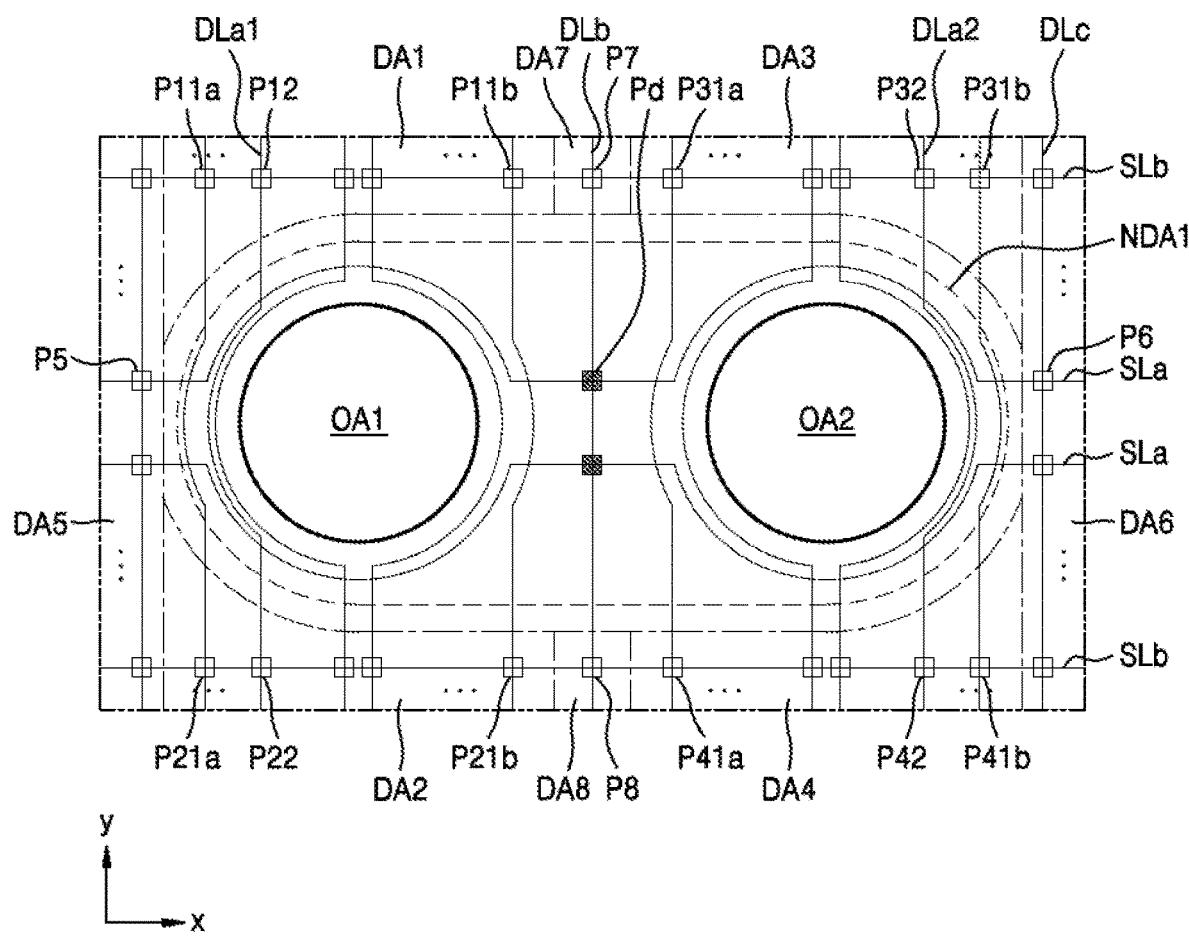

FIG. 20 is a schematic plan view of a display panel 10B according to an embodiment. FIGS. 21 and 22 are plan views illustrating a portion of the display panel 10B of FIG. 20, showing wirings, for example, signal lines, arranged around an 1-1 area and an 1-2 area.

Referring to FIG. 20, the display panel 10B includes an 1-1 area OA1 and an 1-2 area OA2, a first non-display area NDA1 surrounding the 1-1 area OA1 and the 1-2 area OA2, a display area DA surrounding the first non-display area NDA1, and a second non-display area NDA2 surrounding the display area DA. The display panel 10B includes a substrate 100. For example, the substrate 100 of the display panel 10B includes the 1-1 area OA1 and the 1-2 area OA2, the display area DA, the first non-display area NDA1, and the second non-display area NDA2.

The display area DA is an area where a plurality of pixels are arranged, and is divided into a first display area DA1 and a second display area DA2 that are spaced apart from each other in a y-direction, with the 1-1 area OA1 therebetween, a third display area DA3 and a fourth display area DA4 that are spaced apart from each other in the y-direction, with the 1-2 area OA2 therebetween, a fifth display area DA5 and a sixth display area DA6 that are spaced apart from each other in an x-direction, with the 1-1 area OA1 and the 1-2 area OA2 therebetween, a seventh display area DA7 between the first display area DA1 and the third display area DA3, and an eighth display area DA8 between the second display area DA2 and the fourth display area DA4. The first display area DA1 and the second display area DA2 and the third display area DA3 and the fourth display area DA4 may be respectively display areas arranged apart from each other in a direction parallel to an extension direction of data lines.

A plurality of pixels are arranged in the display area DA, and dummy pixels Pd are arranged in the first non-display area NDA1. The plurality of pixels include first pixels P1 arranged in the first display area DA1, second pixels P2 arranged in the second display area DA2, third pixels P3 arranged in the third display area DA3, fourth pixels P4 arranged in the fourth display area DA4, fifth pixels P5 arranged in the fifth display area DA5, sixth pixels arranged in the sixth display area DA6, seventh pixels P7 arranged in the seventh display area DA7, and eighth pixels P8 arranged in the eighth display area DA8. The first pixels P1, the second pixels P2, the third pixels P3, the fourth pixels P4, the fifth pixels P5, the sixth pixels P6, the seventh pixels P7, and the eighth pixels P8 may include a pixel circuit described above with reference to FIG. 5A or 5B.

Referring to FIG. 21, data lines DLa1 passing through the first display area DA1 and the second display area DA2 extend in the y-direction to provide a data signal to the first pixels P1 arranged in the first display area DA1 and the second pixels P2 arranged in the second display area DA2, with the 1-1 area OA1 therebetween, and detour along edges of the 1-1 area OA1 in the first non-display area NDA1. Data lines DLa2 passing through the third display area DA3 and the fourth display area DA4 extend in the y-direction to provide a data signal to the third pixels P3 arranged in the third display area DA3 and the fourth pixels P4 arranged in the fourth display area DA4, with the 1-2 area OA2 therebetween, and detour along edges of the 1-2 area OA2 in the first non-display area NDA1. Data lines DLb passing through the seventh display area DA7 and the eighth display area DA8 may extend in the y-direction to provide a data signal to the seventh pixels P7 arranged in the seventh display area DA7 and the eighth pixels P8 arranged in the eighth display area DA8 and are substantially straight lines. Data lines that do not pass through the first non-display area NDA1, that is, data lines DLc extending in the y-direction in the fifth display area DA5 and the sixth display area DA6 extend substantially straight.

Some scan lines SLa from among scan lines passing through the fifth display area DA5 and the sixth display area DA6 may extend in the x-direction to provide a scan signal to the fifth pixels P5 arranged in the fifth display area DA5 and the sixth pixels P6 arranged in the sixth display area DA6, with the 1-1 area OA1 and the 1-2 area OA2 therebetween, and detour along edges of the 1-1 area OA1 and the 1-2 area OA2 in the first non-display area NDA1. Scan lines SLb that do not pass through the first non-display area NDA1, that is, scan lines SLb extending in the x-direction from the fifth display area DA5 via the first display area DA1, the seventh display area DA7, and the third display area DA3, to the sixth display area DA6 and the scan lines SLb extending in the y-direction from the fifth display area DA5 via the second display area DA2, the eighth display area DAB, and the fourth display area DA4, to the sixth display area DA6 extend substantially straight.

FIG. 21 illustrates the scan lines SLa extending in the first direction (x-direction) connecting the pixels of the display area DA and the dummy pixels Pd of the first non-display area NDA1 and the data lines DLb extending in the second direction (y-direction) and connecting the pixels and the dummy pixels Pd. The dummy pixels Pd may not emit light even when they receive an electrical signal via the signal lines. The dummy pixels Pd may include a dummy pixel circuit having a substantially identical structure to that of the pixel circuit PC included in the pixels P, and by applying an electrical signal to the dummy pixel circuit, pattern density and uniform electrical load may be ensured at the same time.

Referring to FIGS. 20 and 21, according to the embodiment of, a channel ratio of a driving transistor of pixels arranged in the first display area DA1 and the second display area DA2 which are display areas around the 1-1 area OA1 and a channel ratio of a driving transistor of pixels arranged in the third display area DA3 and the fourth display area DA4, which are display areas around the 1-2 area OA2, may be different from a channel ratio of a driving transistor of pixels arranged in display areas other than the first through fourth display areas DA1, DA2, DA3, and DA4. That is, a channel ratio of the first transistor T1 of each of the first pixels P1 of the first display area DA1, the second pixels P2 of the second display area DA2, the third pixels P3 of the third display area DA3, and the fourth pixels P4 of the fourth display area DA4 may be different from a channel ratio of the first transistor T1 of each of the fifth pixels P5 arranged in the fifth display area DA5, the sixth pixels P6 arranged in the sixth display area DA6, the seventh pixels P7 arranged in the seventh display area DA7, and the eighth pixels P8 arranged in the eighth display area DAB. Accordingly, load deviation according to display areas may be minimized, and varying luminance may be prevented or minimized. A channel ratio of the first transistor T1 of each of the dummy pixels Pd may be equal to a channel ratio of the first transistor T1 of each of the seventh pixels P7 and each of the eighth pixels P8. A channel ratio of the first transistor T1 of each of the first pixels P1 of the first display area DA1 may be equal to or different from a channel ratio of the first transistor T1 of each of the second pixels P2 of the second display area DA2. A channel ratio of the first transistor T1 of each of the third pixels P3 of the third display area DA3 may be equal to or different from a channel ratio of the first transistor T1 of each of fourth pixels P4 of the fourth display area DA4.

A channel ratio of the first transistor T1 of each of the first pixels P1 of the first display area DA1 and/or each of the second pixels P2 of the second display area DA2 may gradually increase or decrease away from the 1-1 area OA1. A channel ratio of the first transistor T1 of each of the third pixels P3 of the third display area DA3 and/or each of the fourth pixels P4 of the fourth display area DA4 may gradually increase or decrease away from the 1-2 area OA2.

A channel ratio of the first transistor T1 of each of the first pixels P1 of the first display area DA1, each of the second pixels P2 of the second display area DA2, each of the third pixels P3 of the third display area DA3, and each of the fourth pixels P4 of the fourth display area DA4 may be adjusted by adjusting a channel length and/or a channel width of a first transistor as described above with reference to FIGS. 12A through 12C and 13.

The embodiment of FIG. 22 is different from the embodiment of FIG. 21 in that here luminance is adjusted by adjusting a channel ratio of the first transistors T1 of some of the first pixels P1 of the first display area DA1 and some of the second pixels P2 of the second display area DA2 and some of the third pixels P3 of the third display area DA3 and some of the fourth pixels P4 of the fourth display area DA4.

The first pixels P1 arranged in the first display area DA1 include 1-1 pixels P11a and P11b located along left and right boundary lines of the first display area DA1 and 1-2 pixels P12. The second pixels P2 arranged in the second display area DA2 include 2-1 pixels P21a and P21b located along left and right boundary lines of the second display area DA2 and 2-2 pixels P22. The third pixels P3 arranged in the third display area DA3 include 3-1 pixels P31a and P31b located along left and right boundary lines of the third display area DA3 and 3-2 pixels P32. The fourth pixels P4 arranged in the fourth display area DA4 include 4-1 pixels P41a and P41b located along left and right boundary lines of the fourth display area DA4 and 4-2 pixels P42.

A channel ratio of the first transistor T1 of each of the 1-1 pixels P11a and P11b of the first display area DA1, each of the 2-1 pixels P21a and P21b of the second display area DA2, each of the 3-1 pixels P31a and P31b of the third display area DA3, and each of the 4-1 pixels P41a and P41b of the fourth display area DA4 may be changed. A channel ratio of the first transistor T1 of each of the 1-2 pixels P12, the 2-2 pixels P22, the 3-2 pixels P32, and the 4-2 pixels P42 may be equal to a channel ratio of the first transistor T1 of each of the fifth pixels P5 of the fifth display area DA5, each of the sixth pixels P6 of the sixth display area DA6, each of the seventh pixels P7 of the seventh display area DA7, and each of the eighth pixels P8 of the eighth display area DAB. A channel ratio of the first transistor T1 of each of the 1-1 pixels P11a and P11b may be equal to or different from that of the first transistor T1 of each of the 2-1 pixels P21a and P21b. A channel ratio of the first transistor T1 of the 3-1 pixels P31a and P31b may be equal to or different from that of the first transistor T1 of each of the 4-1 pixels P41a and P41b.

Figure 23:
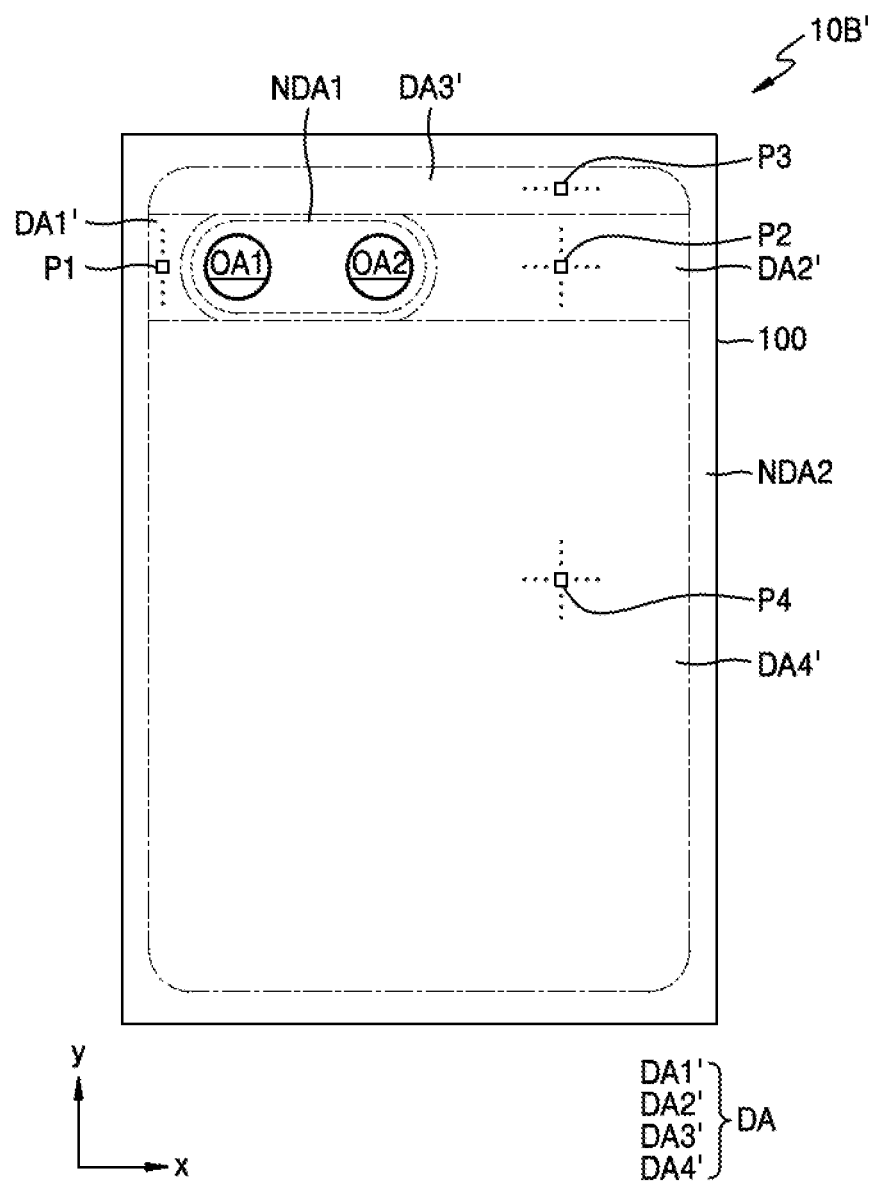
FIG. 23 is a schematic plan view of a display panel according to according to an exemplary embodiment of the present invention.
Figure 24:
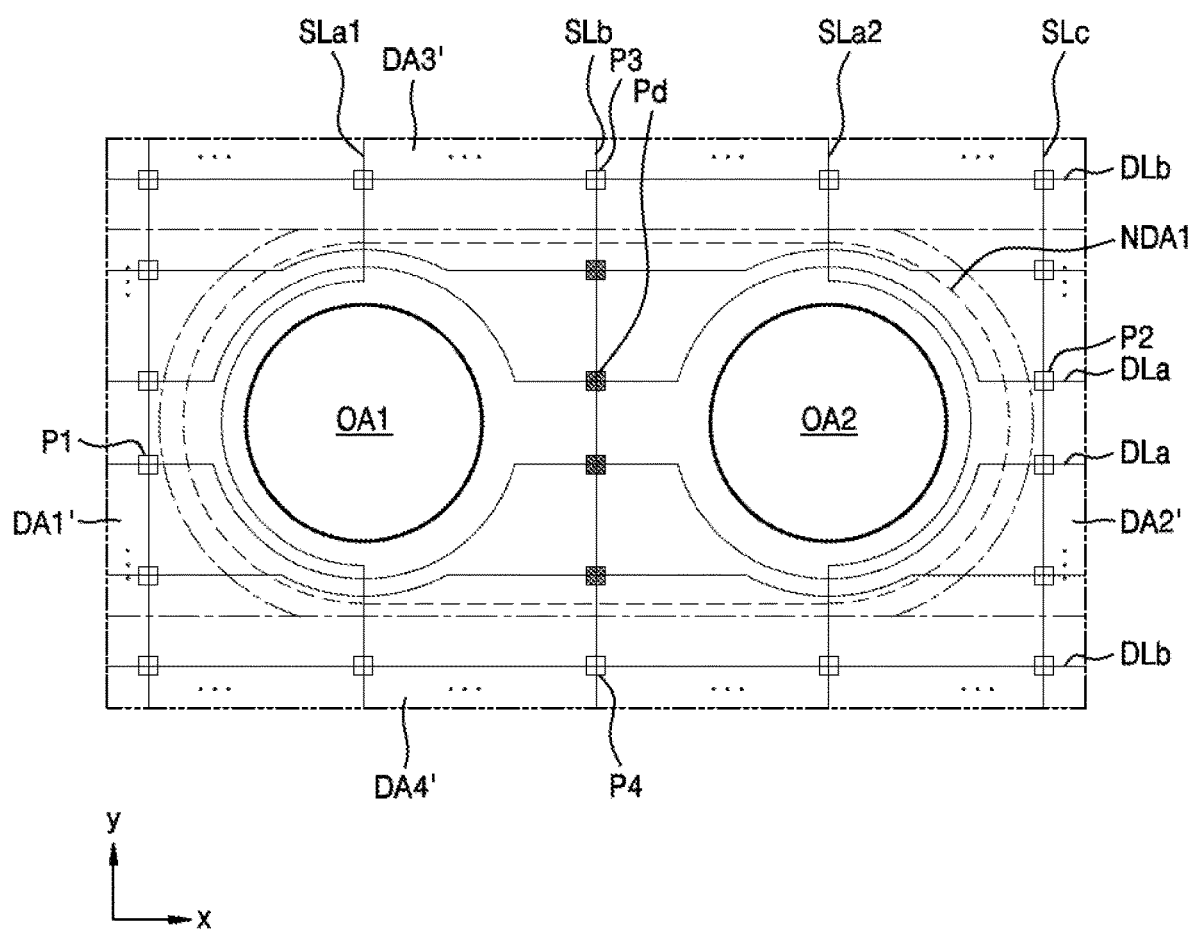
FIGS. 24 and 25 are plan views illustrating a portion of the display panel of FIG. 23 with wirings, for example, signal lines, arranged around a first area, according to an exemplary embodiment of the present invention.
Figure 25:
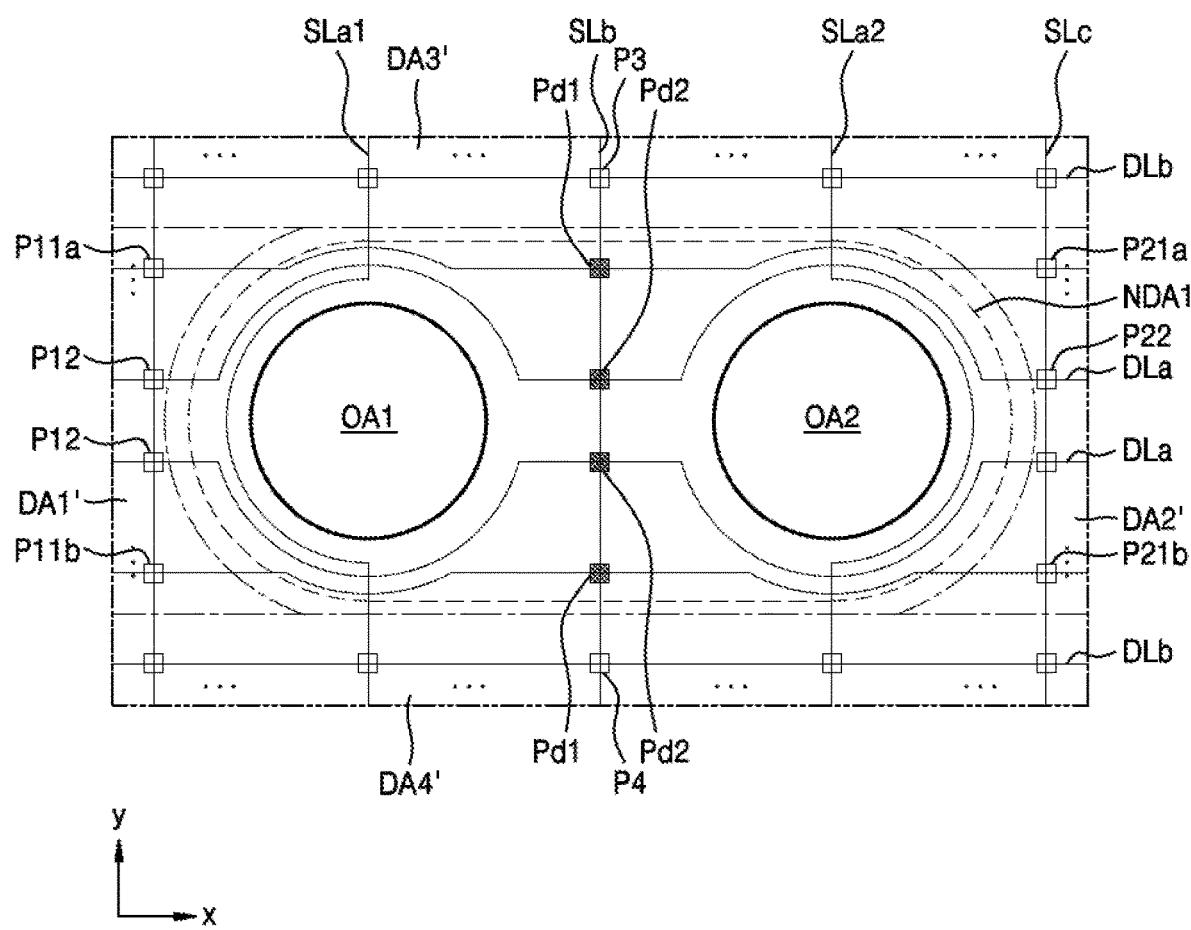

FIG. 23 is a schematic plan view of a display panel 10B' according to an embodiment. FIGS. 24 and 25 are plan views illustrating a portion of the display panel 10B' of FIG. 23, showing wirings, for example, signal lines, arranged around a first area.

As illustrated in FIG. 23, data lines may extend in an x-direction, and scan lines may extend in a y-direction.

Referring to FIG. 23, the display panel 10B' includes an 1-1 area OA1 and an 1-2 area OA2, a display area DA, a first non-display area NDA1 surrounding the 1-1 area OA1 and the 1-2 area OA2, and a second non-display area NDA2 surrounding the display area DA. The display panel 10B' includes a substrate 100. For example, the substrate 100 of the display panel 10B' includes the 1-1 area OA1, the 1-2 area OA2, the display area DA, the first non-display area NDA1, and the second non-display area NDA2.

The display area DA in which a plurality of pixels are arranged is divided into a first display area DA1' and a second display area DA2' that are spaced apart from each other in an x-direction, with the 1-1 area OA1 therebetween and a third display area DA3' and a fourth display area DA4' that are spaced apart from each other in a y-direction, with the 1-2 area OA2 therebetween. The first display area DA1' and the second display area DA2' may be display areas arranged apart from each other in a direction parallel to an extension direction of data lines.

A plurality of pixels are arranged in the display area DA. The plurality of pixels may include first pixels P1 arranged in the first display area DA1', second pixels P2 arranged in the second display area DA2', third pixels P3 arranged in the third display area DA3', and fourth pixels P4 arranged in the fourth display area DA4'. The first pixels P1, the second pixels P2, the third pixels P3, and the fourth pixels P4 may each include a pixel circuit described above with reference to FIG. 5A or 5B.

Referring to FIG. 24, data lines DLa passing through the first display area DA1' and the second display area DA2' extend in the x-direction to provide a data signal to the first pixels P1 arranged in the first display area DA1' and the second pixels P2 arranged in the second display area DA2', with the 1-1 area OA1 and the 1-2 area OA2 therebetween, and detour along edges of the 1-1 area OA1 and the 1-2 area OA2 in the first non-display area NDA1. Data lines that do not pass through the first non-display area NDA1, that is, data lines DLb extending in the x-direction in the third display area DA3' and the fourth display area DA4' extend substantially straight.

Some scan lines SLa1 from among scan lines passing through the third display area DA3' and the fourth display area DA4' extend in the y-direction to provide a scan signal to the third pixels P3 arranged in the third display area DA3' and the fourth pixels P4 arranged in the fourth display area DA4', with the 1-1 area OA1 therebetween, and detour along edges of the 1-1 area OA1 in the first non-display area NDA1. Some scan lines SLa2 from among the scan lines passing through the third display area DA3' and the fourth display area DA4' extend in the y-direction to provide a scan signal to the third pixels P3 arranged in the third display area DA3' and the fourth pixels P4 arranged in the fourth display area DA4', with the 1-2 area OA2 therebetween, and detour along edges of the 1-2 area OA2 in the first non-display area NDA1. Scan lines SLb extending in the y-direction from the third display area DA3' to the fourth display area DA4' by passing between the 1-1 area OA1 and the 1-2 area OA2 extend substantially straight. Scan lines that do not pass through the first non-display area NDA1, that is, scan lines SLc extending in the y-direction from the third display area DA3' via the first display area DA1' or via the second display area DA2' and to the fourth display area DA4' extend substantially straight.

FIG. 24 illustrates the scan lines SLb extending in the second direction (y-direction) connecting the pixels of the display area DA and the dummy pixels Pd of the first non-display area NDA1 and the data lines DLa extending in the first direction (x-direction) and connecting the pixels and the dummy pixels Pd.

Referring to FIGS. 23 and 24, according to the embodiment, a channel ratio of a driving transistor of pixels arranged in the first display area DA1' and the second display area DA2' which are display areas respectively around the 1-1 area OA1 and the 1-2 area OA2 may be different from a channel ratio of a driving transistor of pixels arranged in displays areas other than the first display area DA1' and the second display area DA2'. That is, a channel ratio of the first transistor T1 of each of the first pixels P1 of the first display area DA1' and each of the second pixels P2 of the second display area DA2' may be different from a channel ratio of the first transistor T1 of each of the third pixels P3 of the third display area DA3' and each of the fourth pixels P4 of the fourth display area DA4'. Accordingly, load deviation according to display areas may be minimized, and varying luminance may be prevented or minimized. A channel ratio of the first transistor T1 of each of the dummy pixels Pd may be equal to a channel ratio of the first transistor T1 of each of the first pixels P1 and each of the second pixels P2. A channel ratio of the first transistor T1 of each of the first pixels P1 of the first display area DA1' may be equal to or different from a channel ratio of the first transistor T1 of each of the second pixels P2 of the second display area DA2'.

A channel ratio of the first transistor T1 of each of the first pixels P1 of the first display area DA1' and/or each of the second pixels P2 of the second display area DA2' may gradually increase or decrease away from the 1-1 area OA1 and the 1-2 area OA2.

A channel ratio of the first transistor T1 of each of the first pixels P1 of the first display area DA1' and each of the second pixels P2 of the second display area DA2' may be adjusted by adjusting a channel length and/or a channel width of a first transistor as described above with reference to FIGS. 12A through 12C and 13.

The embodiment of FIG. 25 is different from the embodiment of FIG. 24 in that here luminance is adjusted by adjusting a channel ratio of the first transistors T1 of some of the first pixels P1 of the first display area DA1' and some of the second pixels P2 of the second display area DA2'.

The first pixels arranged in the first display area DA1' include 1-1 pixels P11a and P11b located along upper and lower boundary lines of the first display area DA1' and 1-2 pixels P12. The second pixels arranged in the second display area DA2' include 2-1 pixels P21a and P21b located along upper and lower boundary lines of the second display area DA2' and 2-2 pixels P22. The dummy pixels arranged in the first non-display area NDA1 include dummy pixels Pd1 located along upper and lower boundaries of the first non-display area NDA1 and other dummy pixels Pd2.

A channel ratio of the first transistor T1 of each of the 1-1 pixels P11a and P11b of the first display area DA1' and each of the 2-1 pixels P21a and P21b of the second display area DA2' may be changed. A channel ratio of the first transistor T1 of each of the 1-2 pixels P12 and each of the 2-2 pixels P22 may be equal to a channel ratio of the first transistor T1 of each of the third pixels P3 of the third display area DA3' and the fourth pixels P4 of each of the fourth display area DA4'. A channel ratio of the first transistors T1 of each of the 1-1 pixels P11a and P11b may be equal to or different from that of the first transistors T1 of each of the 2-1 pixels P21a and P21b. A channel ratio of the dummy pixels Pd1 may be equal to a channel ratio of the first transistor T1 of each of the 1-1 pixels P11a and P11b and the 2-1 pixels P21a and P21b. A channel ratio of the dummy pixels Pd2 may be equal to a channel ratio of the first transistor T1 of each of the 1-2 pixels P12 and each of the 2-2 pixels P22.

Figure 26:
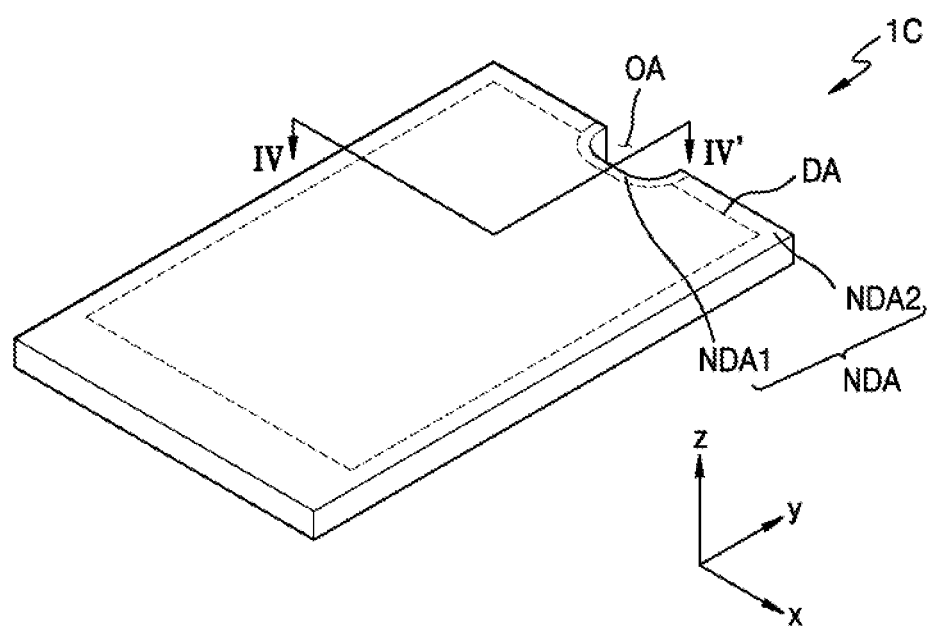
FIG. 26 is a perspective view schematically illustrating a display device according to an exemplary embodiment of the present invention.

FIG. 26 is a perspective view schematically illustrating a display device according to an embodiment.

Figure 27:
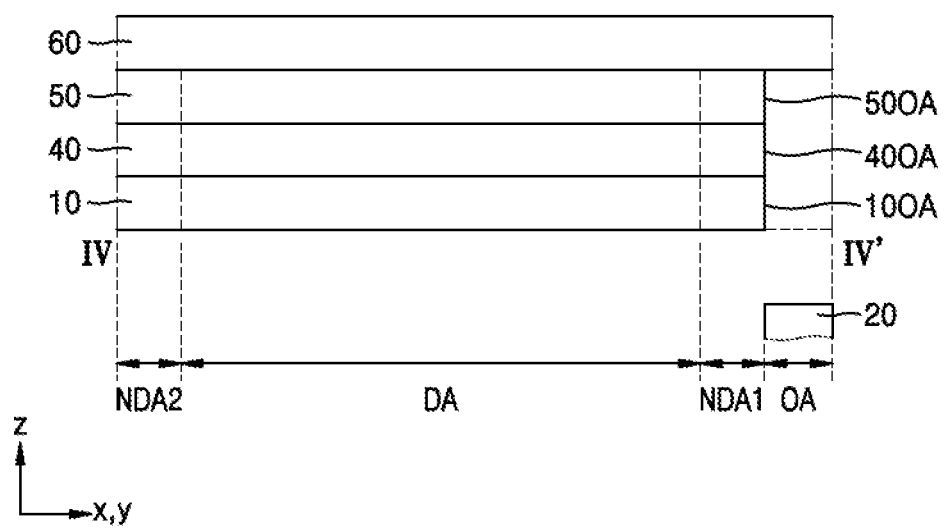
FIG. 27 is a cross-sectional view, taken along line IV-IV' of FIG. 26, illustrating a display device according to an exemplary embodiment of the present invention.

The display device 1C of FIG. 26 includes a first area OA and a second area outside the first area OA. The first area OA may be a trench portion that is inwardly led-in (i.e., recessed) from a side of the display device 1C or an opening area passing through the side of the display device 1C. The first area OA may have various shapes such as a U-shape or a polygonal shape, from which a portion thereof is removed. The first area OA may be an area where a component to be described with reference to FIG. 27 is arranged. The second area includes a display area DA at least partially surrounding the first area OA and a non-display area NDA. The non-display area NDA may include a first non-display area NDA1 partially surrounding the first area OA and a second non-display area NDA2 partially surrounding the display area DA.

FIG. 27 is a cross-sectional view illustrating a display device according to an embodiment, taken along line IV-IV' of FIG. 26.

Referring to FIG. 27, the display device 1C includes a display panel 10, an input sensing layer 40 arranged on the display panel 10, and an optical functional layer 50, and these elements which may be covered by a window 60. The display device 1C may be various types of electronic devices such as a mobile phone, a laptop computer, or a smart watch. An adhesive layer may be between the display panel 10 and the input sensing layer 40 and/or between the input sensing layer 40 and the optical functional layer 50.

The display panel 10, the input sensing layer 40, and the optical functional layer 50 may each include an opening corresponding to the first area OA. An opening 10OA of the display panel 10, an opening 40OA of the input sensing layer 40, and an opening 50OA of the optical functional layer 50 are each located in the first area OA and overlap each other. The first area OA may be a type of component area where a component 20 used to add various functions to the display device 1C is located. The component 20 is arranged below the display panel 10 as illustrated in FIG. 27. Alternatively, the component 20 may be located in the first through third openings 10OA, 40OA, and 50OA.

The display panel 10, the input sensing layer 40, the optical functional layer 50, and the component 20 have been described with reference to FIG. 1 and thus detailed description thereof will be omitted.

Figure 28:
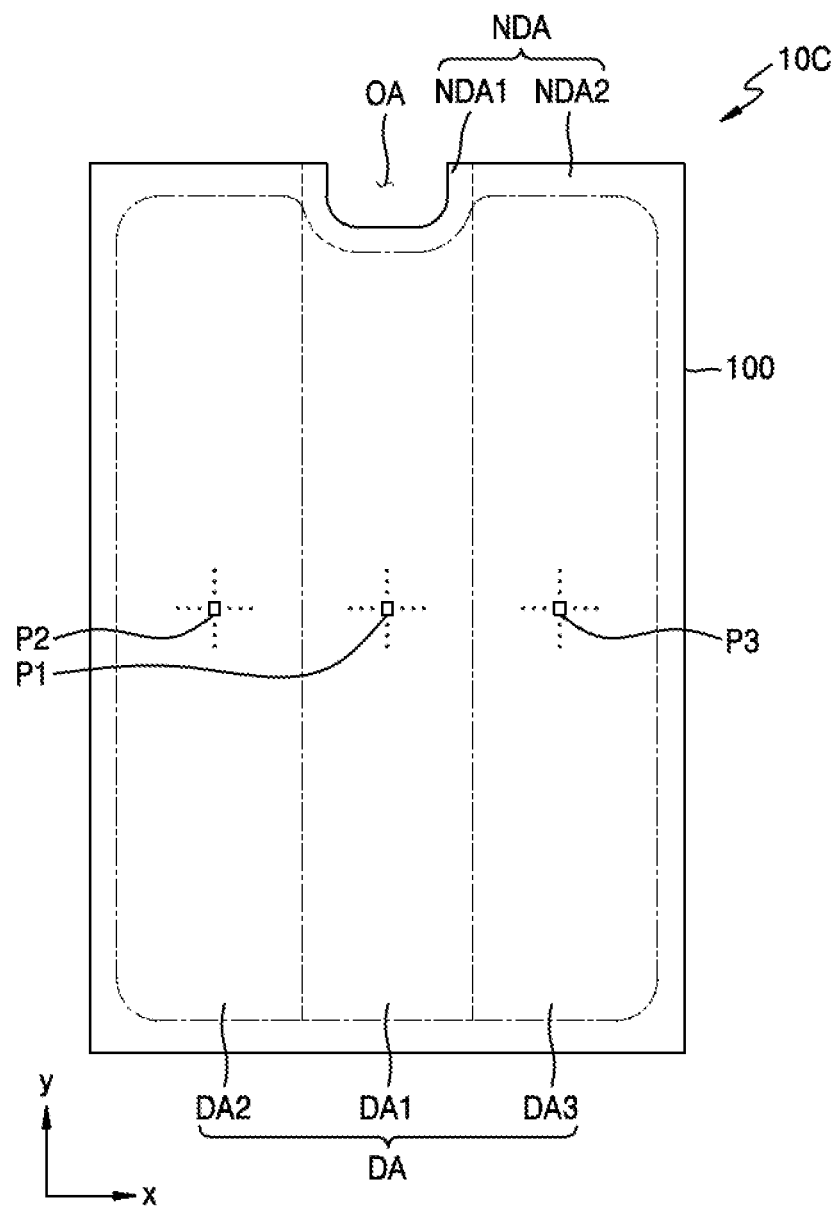
FIG. 28 is a schematic plan view of a display panel according to an exemplary embodiment of the present invention.
Figure 29:
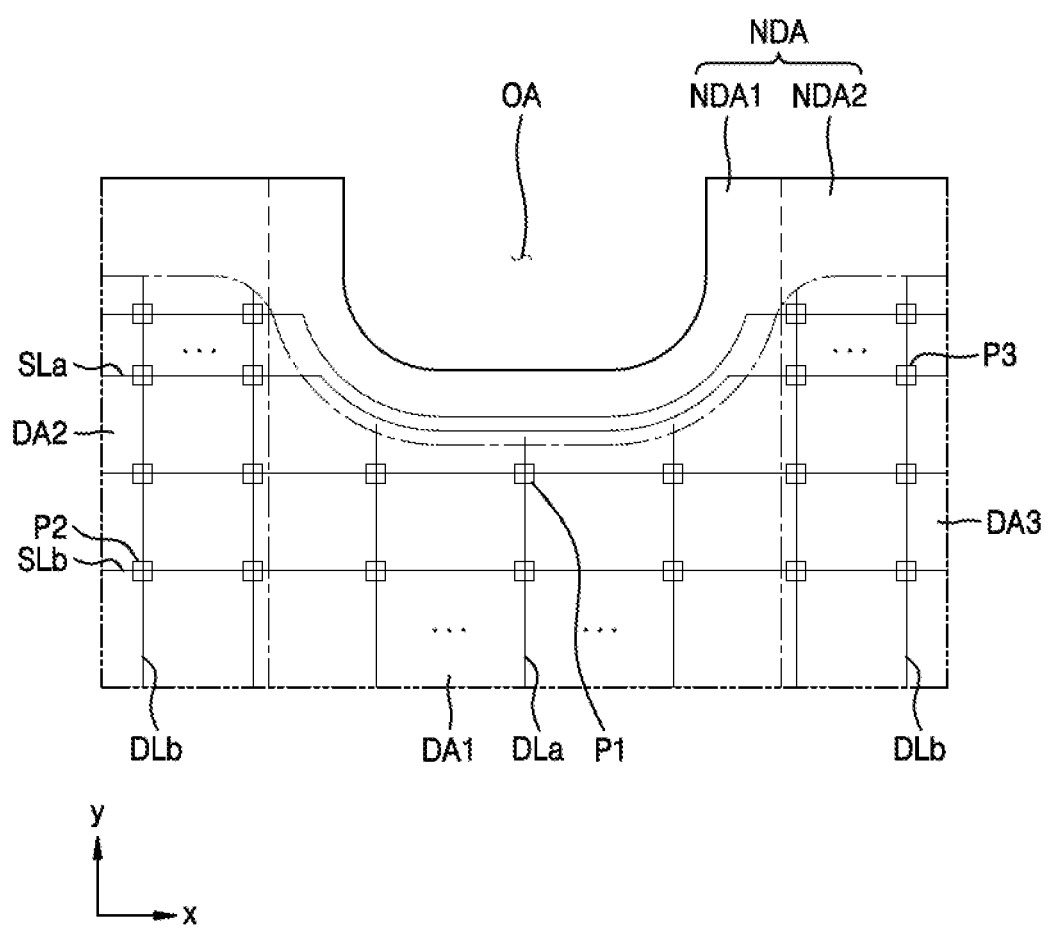
FIGS. 29 and 30 are plan views illustrating a portion of the display panel of FIG. 28 with wirings, for example, signal lines, arranged around a first area, according to an exemplary embodiment of the present invention.
Figure 30:
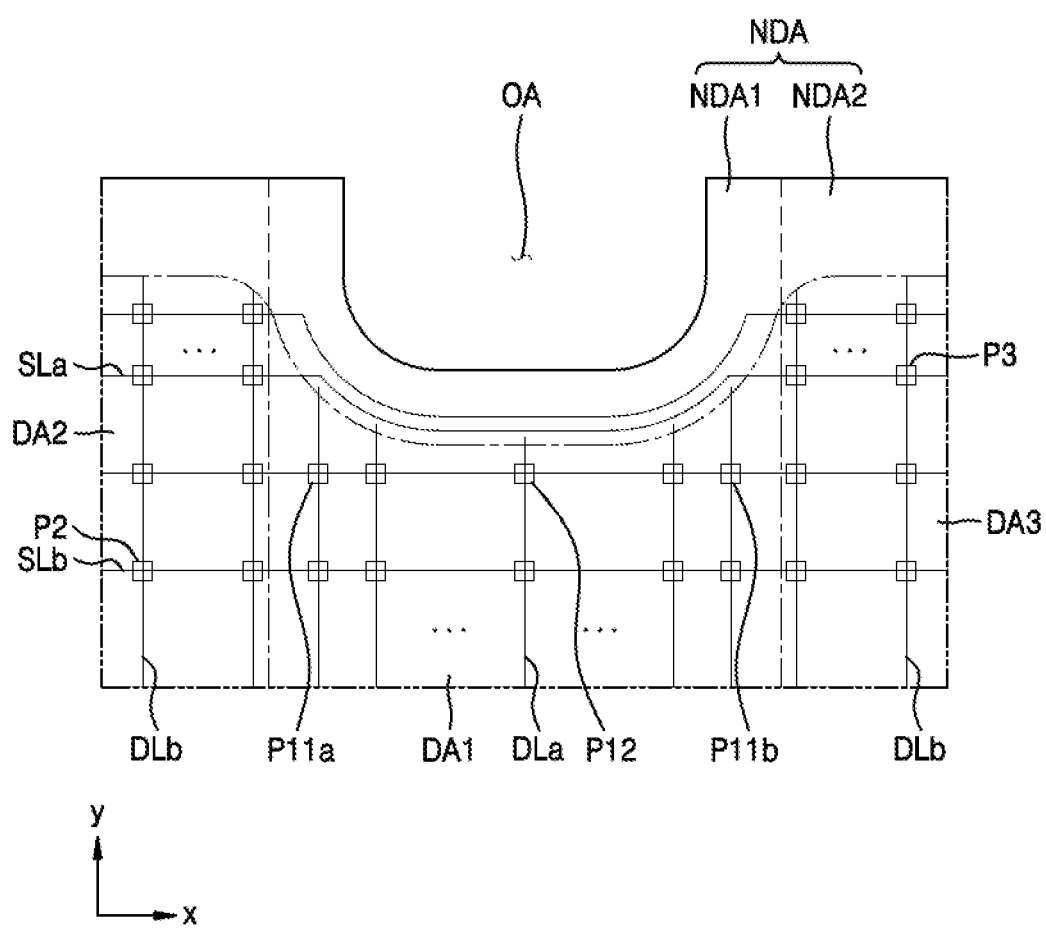

FIG. 28 is a schematic plan view of a display panel 10C according to an embodiment. FIGS. 29 and 30 are plan views illustrating a portion of the display panel 10C of FIG. 28, showing wirings, for example, signal lines, arranged around a first area.

Referring to FIG. 28, the display panel 10C includes a first area OA, a display area DA surrounding the first area OA, a first non-display area NDA1 surrounding the first area OA, and a second non-display area NDA2 surrounding the display area DA. The display panel 10C includes a substrate 100. For example, the substrate 100 of the display panel 10C includes the first area OA, the display area DA, the first non-display area NDA1, and the second non-display area NDA2.

The display area DA in which a plurality of pixels are arranged is divided into a first display area DA1, a second display area DA2, and a third display area DA3. The first display area DA1 adjacent to the first area OA is arranged in a direction parallel to an extension direction of data lines, that is, a y-direction. The second display area DA2 and the third display area DA3 protrude in the second direction (y-direction) compared to the first display area DA1, and the second display area DA2 and the third display area DA3 are spaced apart from each other in an x-direction, with the first display area DA1 therebetween in the first direction (x-direction).

The plurality of pixels may include first pixels P1 arranged in the first display area DA1, second pixels P2 arranged in the second display area DA2, and third pixels P3 arranged in the third display area DA3. The first pixels P1, the second pixels P2, and the third pixels P3 may each include a pixel circuit described above with reference to FIGS. 5A and 5B.

Referring to FIG. 29, data lines passing through the display area DA may extend in a second direction (y-direction), and scan lines may extend in a first direction (x-direction). Signals lines that are used to supply a signal to the pixels and are adjacent to the first area OA may pass by the first non-display area NDA1 by detouring around the first area OA.

Data lines DLa passing through the first display area DA1, data lines DLb passing through the second display area DA2 and the third display area DA3 extend substantially straight in the y-direction. A length of the data lines DLa passing through the first display area DA1 may be less than a length of the data lines DLb passing through the second display area DA2 and the third display area DA3, due to the first area OA. In addition, although not illustrated, as described above with reference to FIG. 10, a length of a first semiconductor layer, to which the semiconductor layers of the plurality of first pixels P1 arranged in the first display area DA1 in the second direction are connected, may be less than a length of a second semiconductor layer, to which the semiconductor layers of the plurality of second pixels P2 arranged in the second display area DA2 in the second direction are connected or a length of a third semiconductor layer to which the semiconductor layers of the plurality of third pixels P3 arranged in the third display area DA3 in the second direction are connected.

Scan lines SLa passing through the second display area DA2 and the third display area DA3 extend in an x-direction to provide a scan signal to the second pixels P2 arranged in the second display area DA2 and the third pixels P3 arranged in the third display area DA3, with the first area OA therebetween, and pass through the first non-display area NDA1 by detouring edges of the first area OA in the first non-display area NDA1. Scan lines SLb passing through the first display area DA1 and the third display area DA3 from the second display area DA2 extend in the x-direction to provide a scan signal to the second pixels P2 arranged in the second display area DA2, the first pixels P1 arranged in the first display area DA1, and the third pixels P3 arranged in the third display area DA3, and are substantially straight lines.

The above-described structural difference, that is, a length of data lines and/or a length of a semiconductor layer, causes a deviation in the load of each portion of the display area DA, and particularly, a luminance of a portion where a data line and/or semiconductor layer is short, for example, the first display area DA1, may be higher or lower than a luminance of the second display area DA2 and the third display area DA3.

In the display panel 10C according to an embodiment of the present disclosure, a channel ratio of a driving transistor of pixels arranged in the first display area DA1 which is a display area around the first area OA may be different from a channel ratio of a driving transistor of pixels arranged in display areas other than the first display area DA1. That is, by differing a channel ratio of the first transistors T1 which are driving transistors of the first pixels P1 arranged in the first display area DA1 from a channel ratio of the first transistors T1 of the second pixels P2 arranged in the second display area DA2 and the first transistors T1 of the third pixels P3 arranged in the third display area DA3, varying luminance may be prevented or minimized.

A channel ratio of the first transistor T1 of each of the first pixels P1 of the first display area DA1 may gradually increase or decrease away from the first area OA. A channel ratio of the first transistor T1 of each of the first pixels P1 of the first display area DA1 may be adjusted by adjusting a channel length and/or channel width of a first transistor as described above with reference to FIGS. 12A through 12C and 13.

The embodiment of FIG. 30 is different from the embodiment of FIG. 29 in that luminance is adjusted by adjusting a channel ratio of the first transistors T1 of some of the first pixels P1 of the first display area DA1.

The first pixels P1 arranged in the first display area DA1 include 1-1 pixels P11a and P11b located along left and right boundary lines of the first display area DA1 and 1-2 pixels P12. A channel ratio of the first transistor T1 of each of the 1-1 pixels P11a and P11b of the first display area DA1 may be changed. A channel ratio of the first transistor T1 of each of the 1-2 pixels P12 may be equal to a channel ratio of the first transistor T1 of each of the second pixels P2 of the second display area DA2 and each of the third pixels P3 of the third display area DA3.

Figure 31:
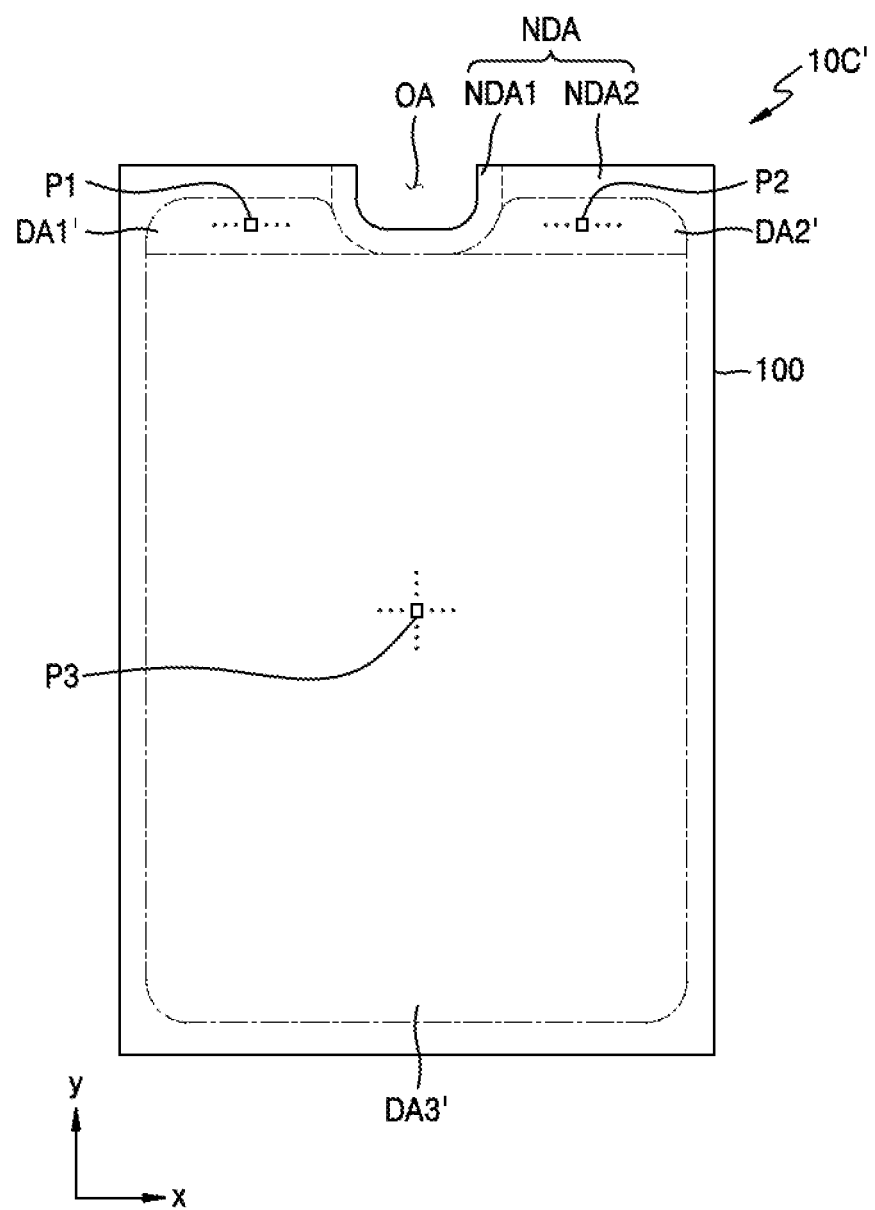
FIG. 31 is a schematic plan view of a display panel according to an exemplary embodiment of the present invention.
Figure 32:
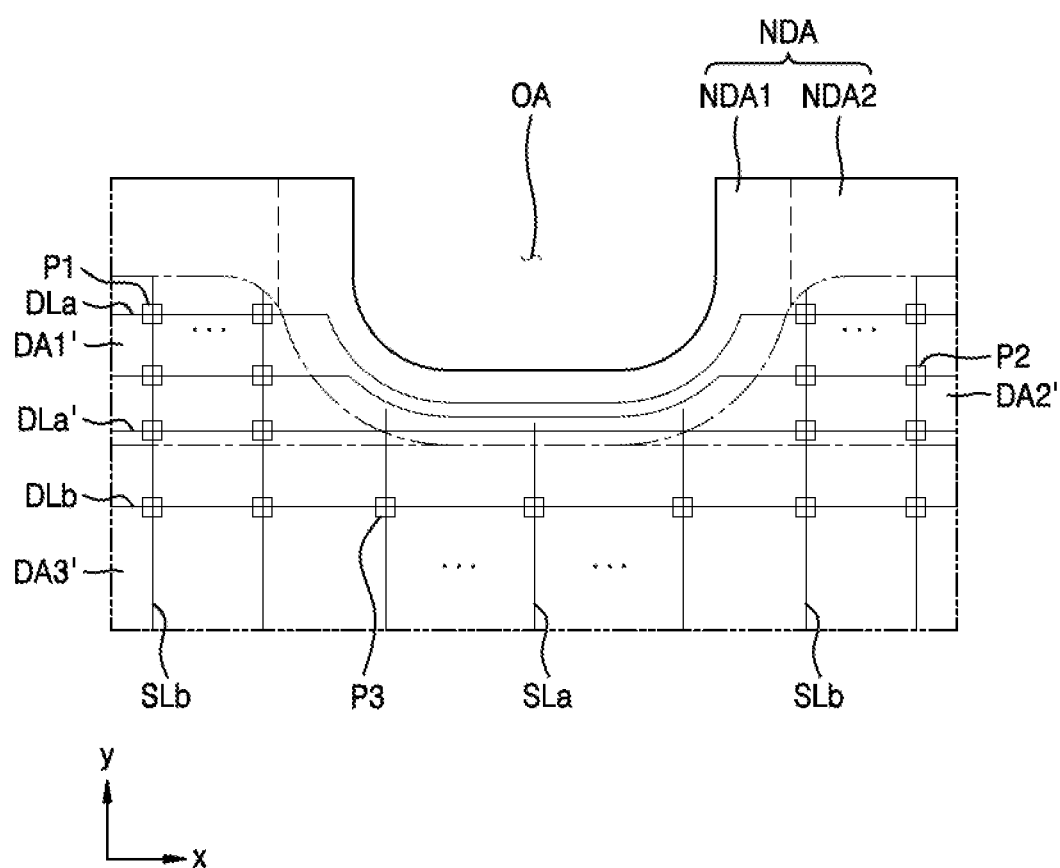
FIGS. 32 and 33 are plan views illustrating a portion of the display panel of FIG. 31 with wirings, for example, signal lines, arranged around a first area, according to an exemplary embodiment of the present invention.
Figure 33:
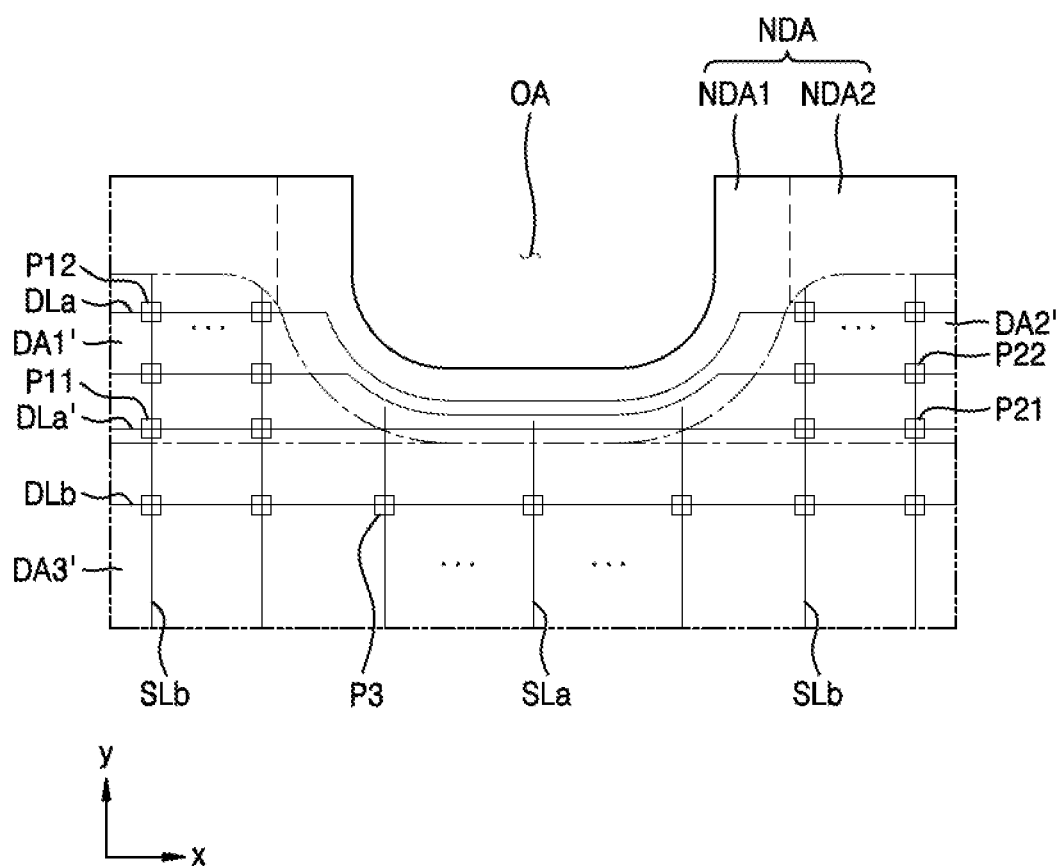

FIG. 31 is a schematic plan view of a display panel 10C' according to an embodiment. FIGS. 32 and 33 are plan views illustrating a portion of the display panel 10C' of FIG. 31, showing wirings, for example, signal lines, arranged around a first area.

As illustrated in FIG. 32, data lines may extend in an x-direction, and scan lines may extend in a y-direction.

Referring to FIG. 31, the display panel 10C' includes a first area OA, a first non-display area NDA1 surrounding the first area OA, a display area DA, and a second non-display area NDA2 surrounding the display area DA. The display panel 10C' includes a substrate 100. For example, the substrate 100 of the display panel 10C' includes the first area OA, the display area DA, the first non-display area NDA1, and the second non-display area NDA2.

The display area DA in which a plurality of pixels are arranged is divided into a first display area DA1' and a second display area DA2' that are apart from each other in an x-direction, with the first area OA therebetween and a third display area DA3'. The first display area DA1' and the second display area DA2' may be display areas arranged in a direction parallel to an extension direction of a data line.

A plurality of pixels are arranged in the display area DA. The plurality of pixels may include first pixels P1 arranged in the first display area DA1', second pixels P2 arranged in the second display area DA2', and third pixels P3 arranged in the third display area DA3'. The first pixels P1, the second pixels P2, and the third pixels P3 may each include a pixel circuit described above with reference to FIG. 5A or 5B.

Referring to FIG. 32, data lines DLa passing through the first display area DA1' and the second display area DA2' extend in an x-direction to provide a data signal to the first pixels P1 arranged in the first display area DA1' and the second pixels P2 arranged in the second display area DA2', with the first area OA therebetween, and detour along edges of the first area OA in the first non-display area NDA1. A data line DLa' located along a boundary line between the first display area DA1' and the third display area DA3' passes through the first non-display area NDA1 but extends substantially straight. Data lines that do not pass through the first non-display area NDA1, that is, data lines DLb extending in the x-direction in the third display area DA3' extend substantially straight.

Scan lines SLa from among scan lines passing through the third display area DA3', scan lines SLb passing through the first display area DA1' and the third display area DA3', and the scan lines SLb passing through the second display area DA2' and the third display area DA3' extend in a y-direction and are substantially straight lines. A length of the scan lines SLa may be less than a length of the scan lines SLb.

Referring to FIGS. 31 and 32, in the embodiment of the present disclosure, a channel ratio of a driving transistor of pixels arranged in the first display area DA1' and the second display area DA2' which are display areas around the first area OA may be different from a channel ratio of a driving transistor of pixels arranged in displays areas other than the first display area DA1' and the second display area DA2'. That is, a channel ratio of the first transistor T1 of each of the first pixels P1 of the first display area DA1' and each of the second pixels P2 of the second display area DA2' may be different from a channel ratio of the first transistor T1 of each of the third pixels P3 arranged in the third display area DA3'. Accordingly, luminance difference due to the structural difference in display areas may be minimized, thereby minimizing varying luminance. A channel ratio of the first transistor T1 of each of the first pixels P1 of the first display area DA1' may be equal to or different from a channel ratio of the first transistor T1 of each of the second pixels P2 of the second display area DA2'.

A channel ratio of the first transistor T1 of each of the first pixels P1 of the first display area DA1' and/or each of the second pixels P2 of the second display area DA2' may gradually increase or decrease away from the first area OA.

A channel ratio of the first transistor T1 of each of the first pixels P1 of the first display area DA1' and each of the second pixels P2 of the second display area DA2' may be adjusted by adjusting a channel length and/or a channel width of a first transistor as described above with reference to FIGS. 12A through 12C and 13.

The embodiment of FIG. 33 is different from the embodiment of FIG. 32 in that luminance is adjusted by adjusting a channel ratio of the first transistors T1 of some of the first pixels P1 of the first display area DA1' and some of the second pixels P2 of the second display area DA2'.

The first pixels arranged in the first display area DA1' include 1-1 pixels P11 located along a boundary line between the first display area DA1' and the third display area DA3' and 1-2 pixels P12. The second pixels arranged in the second display area DA2' include 2-1 pixels P21 located along a boundary line between the second display area DA2' and the third display area DA3' and 2-2 pixels P22. Data lines DLa' arranged along the boundary line between the first display area DA1' and the third display area DA3' and the boundary line between the second display area DA2' and the third display area DA3' extend substantially straight but pass through the first non-display area NDA1, and as no pixel is connected to the data lines DLa' in the first non-display area NDA1, load deviation may exist between the first display area DA1' and the third display area DA3' or between the first display area DA2' and the third display area DA3'.

In the embodiment of the present invention, a channel ratio of the first transistor T1 of each of the 1-1 pixels P11 of the first display area DA1' and each of the 2-1 pixels P21 of the second display area DA2' may be changed. A channel ratio of the first transistor T1 of each of the 1-2 pixels P12 and each of the 2-2 pixels P22 may be equal to a channel ratio of the first transistor T1 of each of the third pixels P3 of the third display area DA3'. A channel ratio of the first transistor T1 of each of the 1-1 pixels P11 may be equal to or different from a channel ratio of the first transistor T1 of each of the 2-1 pixels P21.

According to the display devices of the embodiments of the present disclosure, luminance deviation of each display area occurring due to placement and/or arrangement of wiring and/or circuit elements included in a display panel may be minimized by changing a size of driving transistors.

According to the display devices of the embodiments of the present disclosure, a channel ratio of a driving transistor of pixels arranged in a display area around the opening area OA may be different from a channel ratio of a driving transistor of pixels arranged in other display areas than the display area around the opening area OA. The display area around the opening area OA may be divided into a first sub-display area and a second sub-display area with the opening area OA therebetween. For example, the first display area DA1 and the second display area DA2 illustrated in FIG. 8 may respectively be defined as a first sub-display area and a second sub-display area.

While an organic light-emitting display device is described as an example of the display devices 1A, 1B, and 1C according to the embodiments of the present disclosure, the display device according to the present disclosure is not limited thereto. According to another embodiment, the display device may be, for example, an inorganic light-emitting display (or inorganic electroluminescent display) or a quantum dot light-emitting display. For example, an emissive layer of a display element included in the display device may include an organic material, an inorganic material, quantum dots, or both an organic material and quantum dots or both an inorganic material and quantum dots.

According to the embodiments of the present disclosure, in a display panel including an opening area where various types of components may be arranged, luminance difference in portions of a display area may be prevented or minimized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate comprising a first area and a display area at least partially surrounding the first area; and
a plurality of pixels arranged in the display area;
a data line extended in a first direction and detours around the first area; and
a scan line extended in a second direction and detours around the first area;
wherein the display area comprises a first display area around the first area and a second display area other than the first display area,
wherein the first display area comprises a first sub-display area and a second sub-display area spaced apart from each other in the first direction, with the first area therebetween,
wherein a plurality of first pixels of the first sub-display area and a plurality of first pixels of the second sub-display area are connected to the data line in the first direction,
wherein the display panel further comprising:
a first semiconductor row in which semiconductor layers of a plurality of first pixels of the first sub-display area are connected in the first direction;
a second semiconductor row in which semiconductor layers of a plurality of first pixels of the second sub-display area are connected in the first direction; and
a third semiconductor row in which semiconductor layers of a plurality of second pixels of the second display area are connected in the first direction,
wherein the first semiconductor row and the second semiconductor row spaced apart from each other with the first area therebetween,
wherein a length of the third semiconductor row is longer than a length of the first semiconductor row or a length of the second semiconductor row, and
wherein a first channel ratio of a channel width of the first driving transistor to a channel length of the first driving transistor is different from a second channel ratio of a channel width of the second driving transistor to a channel length of the second driving transistor, to adjust luminance difference between the first display area and the second display area due to a length difference between the first to third semiconductor rows.

2. The display panel of claim 1,
wherein the first channel ratio of the first driving transistor is greater or less than the second channel ratio of the second driving transistor.

3. The display panel of claim 2,
wherein the first channel ratio gradually increases or decreases away from the first area.

4. The display panel of claim 1,
wherein the first area is a hole that passes through the substrate.

5. The display panel of claim 1,
wherein the first area is a transmission area through which light or sound travels.

6. The display panel of claim 1,
wherein the first area is a trench that is inwardly recessed from a side of the substrate.

7. The display panel of claim 1,
wherein the substrate comprises a first non-display area between the first area and the display area and a second non-display area surrounding the display area.

8. The display panel of claim 7, further comprising:
a second area adjacent to the first area,
wherein the first non-display area surrounds the first area and the second area, and
wherein at least one dummy pixel is arranged in the first non-display area and between the first area and the second area.

9. The display panel of claim 8,
wherein the first area and the second area are disposed between the first sub-display area and the second sub-display area.

10. The display panel of claim 9,
wherein the data line connected to the first pixel of the first sub-display area and the first pixel of the second sub-display area is connected to the at least one dummy pixel.

11. The display panel of claim 8,
wherein at least one of a size and a shape of first area is different from that of the second area.

12. The display panel of claim 1, wherein
the first channel ratio of the first driving transistor of the first pixel which is adjacent to a boundary between the first sub-display area and the second display area is greater or less than the second channel ratio of the second driving transistor of the second pixel, and
the first channel ratio of the first driving transistor of other first pixels, in the first sub-display area, is equal to the second channel ratio of the second driving transistor of the second pixel.

\* \* \* \* \*